United States Patent
Wang et al.

(10) Patent No.: US 12,167,634 B2
(45) Date of Patent: Dec. 10, 2024

(54) OPTOELECTRONIC DEVICE INCLUDING A LIGHT TRANSMISSIVE REGION

(71) Applicant: OTI Lumionics Inc., Toronto (CA)

(72) Inventors: Zhibin Wang, Toronto (CA); Yi-Lu Chang, Scarborough (CA); Qi Wang, North York (CA); Michael Helander, Toronto (CA)

(73) Assignee: OTI Lumionics Inc., Mississauga (CA)

( * ) Notice: Subject to any disclaimer, the term of this patent is extended or adjusted under 35 U.S.C. 154(b) by 624 days.

(21) Appl. No.: 17/296,188

(22) PCT Filed: Nov. 23, 2019

(86) PCT No.: PCT/IB2019/060092
§ 371 (c)(1),
(2) Date: May 21, 2021

(87) PCT Pub. No.: WO2020/105015
PCT Pub. Date: May 28, 2020

(65) Prior Publication Data
US 2022/0013594 A1    Jan. 13, 2022

Related U.S. Application Data

(60) Provisional application No. 62/771,015, filed on Nov. 23, 2018, provisional application No. 62/838,892, (Continued)

(51) Int. Cl.
*H10K 59/80* (2023.01)
*H10K 50/824* (2023.01)
(Continued)

(52) U.S. Cl.
CPC ......... *H10K 59/121* (2023.02); *H10K 50/824* (2023.02); *H10K 59/1201* (2023.02);
(Continued)

(58) Field of Classification Search
CPC ............ H10K 50/824; H10K 59/1201; H10K 59/122; H10K 59/80522
See application file for complete search history.

(56) References Cited

U.S. PATENT DOCUMENTS 3,928,480 A   12/1975  Tabushi et al.
4,022,928 A    5/1977  Piwcyzk
(Continued)

FOREIGN PATENT DOCUMENTS

CA      2890253 A1    5/2014
CN    101299419 A   11/2008
(Continued)

OTHER PUBLICATIONS

Foreign Search Report on PCT PCT/IB2019/060092 DTD Mar. 19, 2020.
(Continued)

*Primary Examiner* — Daniel P Shook
(74) *Attorney, Agent, or Firm* — Foley & Lardner LLP

(57) ABSTRACT

An electroluminescent device includes: (1) a first region, a second region, and an intermediate region arranged between the first region and the second region; (2) a conductive coating disposed in the second region; and (3) a nucleation inhibiting coating disposed in the first region, the nucleation inhibiting coating extending to cover at least a portion of the intermediate region, wherein a thickness of the nucleation inhibiting coating in the intermediate region is less than a thickness of the nucleation inhibiting coating in the first region, and wherein a surface of the nucleation inhibiting coating in the first region is substantially free of the conductive coating.

33 Claims, 30 Drawing Sheets

Related U.S. Application Data filed on Apr. 25, 2019, provisional application No. 62/862,636, filed on Jun. 17, 2019.

(51) Int. Cl.
*H10K 59/12* (2023.01)
*H10K 59/121* (2023.01)
*H10K 59/122* (2023.01)
*H10K 59/65* (2023.01)
*H10K 102/00* (2023.01)

(52) U.S. Cl.
CPC .......... *H10K 59/122* (2023.02); *H10K 59/65* (2023.02); *H10K 59/80522* (2023.02); *H10K 2102/00* (2023.02)

(56) References Cited

U.S. PATENT DOCUMENTS

| | | |
|---|---|---|
| 4,832,983 A | 5/1989 | Nagatomi et al. |
| 5,015,758 A | 5/1991 | Pilgrim et al. |
| 5,399,936 A | 3/1995 | Namiki et al. |
| 6,016,033 A | 1/2000 | Jones et al. |
| 6,407,408 B1 | 6/2002 | Zhou et al. |
| 6,465,115 B2 | 10/2002 | Shi et al. |
| 6,472,468 B1 | 10/2002 | Omura |
| 6,538,374 B2 | 3/2003 | Hosokawa |
| 6,787,468 B2 | 9/2004 | Kim et al. |
| 6,835,950 B2 | 12/2004 | Brown et al. |
| 6,900,470 B2 | 5/2005 | Kobayashi et al. |
| 6,927,270 B2 | 8/2005 | Lichtenhan et al. |
| 6,995,035 B2 | 2/2006 | Cok et al. |
| 7,018,713 B2 | 3/2006 | Padiyath |
| 7,099,299 B2 | 8/2006 | Liang et al. |
| 7,105,298 B2 | 9/2006 | Liu et al. |
| 7,175,815 B2 | 2/2007 | Yamasaki et al. |
| 7,193,015 B1 | 3/2007 | Mabry et al. |
| 7,217,683 B1 | 5/2007 | Blanski et al. |
| 7,319,129 B2 | 1/2008 | Yoshida et al. |
| 7,363,308 B2 | 4/2008 | Dillon et al. |
| 7,402,948 B2 | 7/2008 | Yamazaki et al. |
| 7,427,783 B2 | 9/2008 | Lee et al. |
| 7,449,539 B2 | 11/2008 | Morimoto et al. |
| 7,491,975 B2 | 2/2009 | Kubota |
| 7,495,389 B2 | 2/2009 | Noguchi et al. |
| 7,701,132 B2 | 4/2010 | Oh |
| 7,728,510 B2 | 6/2010 | Oh |
| 7,816,861 B2 | 10/2010 | Choi et al. |
| 7,839,083 B2 | 11/2010 | Kubota |
| 7,897,667 B2 | 3/2011 | Mabry et al. |
| 7,947,519 B2 | 5/2011 | Lee et al. |
| 7,956,351 B2 | 6/2011 | Choi |
| 7,986,672 B2 | 7/2011 | Tiedemann et al. |
| 8,004,180 B2 | 8/2011 | Seo |
| 8,030,838 B2 | 10/2011 | Kwak et al. |
| 8,044,580 B2 | 10/2011 | Yamazaki et al. |
| 8,089,066 B2 | 1/2012 | Yamazaki et al. |
| 8,115,376 B2 | 2/2012 | Fujioka et al. |
| 8,232,350 B2 | 7/2012 | Fujita et al. |
| 8,237,351 B2 | 8/2012 | Sung et al. |
| 8,310,149 B2 | 11/2012 | Lifka et al. |
| 8,318,878 B2 | 11/2012 | Sudo et al. |
| 8,343,637 B2 | 1/2013 | Parham et al. |
| 8,362,469 B2 | 1/2013 | Suh |
| 8,679,647 B2 | 3/2014 | Pflumm et al. |
| 8,703,303 B2 | 4/2014 | Yamamoto et al. |
| 8,766,306 B2 | 7/2014 | Lifka et al. |
| 8,795,847 B2 | 8/2014 | Heil et al. |
| 8,809,838 B2 | 8/2014 | Jeong et al. |
| 8,852,756 B2 | 10/2014 | Vestweber et al. |
| 8,872,206 B2 | 10/2014 | Chung et al. |
| 8,895,972 B2 | 11/2014 | Chung et al. |
| 8,940,568 B2 | 1/2015 | Mohan et al. |
| 8,957,413 B2 | 2/2015 | Song et al. |
| 8,963,137 B2 | 2/2015 | Lee et al. |
| 8,963,414 B2 | 2/2015 | Sawabe |
| 8,986,852 B2 | 3/2015 | Stoessel et al. |
| 8,994,010 B2 | 3/2015 | Choi et al. |
| 9,018,621 B2 | 4/2015 | Park et al. |
| 9,024,307 B2 | 5/2015 | Lee |
| 9,040,962 B2 | 5/2015 | Adamovich et al. |
| 9,051,344 B2 | 6/2015 | Lin et al. |
| 9,064,755 B2 | 6/2015 | Park et al. |
| 9,076,993 B2 | 7/2015 | Kim et al. |
| 9,088,004 B2 | 7/2015 | Chung et al. |
| 9,093,403 B2 | 7/2015 | Kim et al. |
| 9,093,669 B2 | 7/2015 | Park et al. |
| 9,105,865 B2 | 8/2015 | Chung et al. |
| 9,105,867 B2 | 8/2015 | Verschuuren et al. |
| 9,126,970 B2 | 9/2015 | Pflumm |
| 9,231,030 B2 | 1/2016 | Choi et al. |
| 9,245,934 B2 | 1/2016 | Chung et al. |
| 9,246,123 B2 | 1/2016 | Kim et al. |
| 9,287,339 B2 | 3/2016 | Lee et al. |
| 9,293,515 B2 | 3/2016 | Choi |
| 9,331,308 B2 | 5/2016 | Choi et al. |
| 9,444,064 B2 | 9/2016 | Kaiser et al. |
| 9,450,027 B2 | 9/2016 | Pang et al. |
| 9,478,591 B2 | 10/2016 | Nam et al. |
| 9,570,471 B2 | 2/2017 | Heo et al. |
| 9,595,681 B2 | 3/2017 | Mujica-Fernaud |
| 9,624,193 B2 | 4/2017 | Aihara |
| 9,660,195 B2 | 5/2017 | Kawamura et al. |
| 9,711,751 B2 | 7/2017 | Prushinskiy et al. |
| 9,748,318 B2 | 8/2017 | Shim et al. |
| 9,776,983 B2 | 10/2017 | Marchionni et al. |
| 9,859,520 B2 | 1/2018 | Kim |
| 9,954,039 B2 | 4/2018 | Im et al. |
| 9,960,216 B2 | 5/2018 | Lee et al. |
| 9,966,554 B2 | 5/2018 | Lee et al. |
| 10,032,843 B2 | 7/2018 | Lee et al. |
| 10,084,019 B2 | 9/2018 | Shim et al. |
| 10,084,150 B1 | 9/2018 | Lou |
| 10,090,370 B2 | 10/2018 | Lee et al. |
| 10,147,769 B2 | 12/2018 | Lee et al. |
| 10,177,206 B2 | 1/2019 | Jung et al. |
| 10,181,573 B2 | 1/2019 | Im |
| 10,186,568 B2 | 1/2019 | Kim et al. |
| 10,224,386 B2 | 3/2019 | Rieutort-Louis et al. |
| 10,240,084 B2 | 3/2019 | Molaire |
| 10,263,185 B2 | 4/2019 | Matsueda et al. |
| 10,269,879 B2 | 4/2019 | Shim et al. |
| 10,276,641 B2 | 4/2019 | Lou |
| 10,297,762 B2 | 5/2019 | Zeng et al. |
| 10,361,375 B2 | 7/2019 | Zeng et al. |
| 10,501,583 B2 | 12/2019 | Song et al. |
| 10,700,304 B2 | 6/2020 | Helander et al. |
| 2002/0090811 A1 | 7/2002 | Kim et al. |
| 2002/0189392 A1 | 12/2002 | Molstad |
| 2003/0196987 A1 | 10/2003 | Kung et al. |
| 2006/0125390 A1 | 6/2006 | Oh |
| 2007/0077349 A1 | 4/2007 | Newman et al. |
| 2007/0178405 A1 | 8/2007 | Kanda et al. |
| 2009/0033208 A1 | 2/2009 | Nagayama et al. |
| 2009/0199903 A1 | 8/2009 | Oyamada et al. |
| 2010/0078628 A1 | 4/2010 | Chi et al. |
| 2010/0193768 A1 | 8/2010 | Habib |
| 2010/0244197 A1 | 9/2010 | Arena et al. |
| 2011/0006289 A1 | 1/2011 | Mizuki et al. |
| 2011/0094889 A1 | 4/2011 | Shin et al. |
| 2011/0175031 A1 | 7/2011 | Matsunami et al. |
| 2011/0186820 A1 | 8/2011 | Kim et al. |
| 2011/0309307 A1 | 12/2011 | Zeika et al. |
| 2012/0003484 A1 | 1/2012 | Roehrig et al. |
| 2012/0018770 A1 | 1/2012 | Lu et al. |
| 2012/0146030 A1 | 6/2012 | You et al. |
| 2012/0187541 A1 | 7/2012 | Arena et al. |
| 2013/0049024 A1 | 2/2013 | Choi et al. |
| 2013/0056784 A1 | 3/2013 | Lee et al. |
| 2013/0112952 A1 | 5/2013 | Adamovich et al. |
| 2014/0070236 A1 | 3/2014 | Chen et al. |
| 2014/0103306 A1 | 4/2014 | Moon et al. |
| 2014/0110680 A1 | 4/2014 | Choe |
| 2014/0186983 A1 | 7/2014 | Kim et al. |

(56) References Cited

U.S. PATENT DOCUMENTS

| | | |
|---|---|---|
| 2014/0231761 A1 | 8/2014 | Kim et al. |
| 2014/0299866 A1 | 10/2014 | Ruske et al. |
| 2014/0353601 A1 | 12/2014 | Cho et al. |
| 2015/0076456 A1 | 3/2015 | Choi et al. |
| 2015/0090989 A1 | 4/2015 | Matsumoto et al. |
| 2015/0097171 A1 | 4/2015 | Kim et al. |
| 2015/0144902 A1 | 5/2015 | Do et al. |
| 2015/0287846 A1 | 10/2015 | Helander et al. |
| 2015/0376768 A1 | 12/2015 | Veres et al. |
| 2016/0013438 A1 | 1/2016 | Im et al. |
| 2016/0104859 A1 | 4/2016 | Kim et al. |
| 2016/0149156 A1 | 5/2016 | Kim et al. |
| 2016/0180763 A1 | 6/2016 | Park et al. |
| 2016/0211454 A1 | 7/2016 | Kim et al. |
| 2016/0293888 A1 | 10/2016 | Shim et al. |
| 2016/0351638 A1 | 12/2016 | Im et al. |
| 2017/0018733 A1 | 1/2017 | Jin et al. |
| 2017/0033166 A1 | 2/2017 | Shim et al. |
| 2017/0062755 A1 | 3/2017 | Im et al. |
| 2017/0125495 A1 | 5/2017 | Lee et al. |
| 2017/0125506 A1 | 5/2017 | Kim |
| 2017/0155078 A1 | 6/2017 | Lee |
| 2017/0170246 A1 | 6/2017 | Im et al. |
| 2017/0186831 A1 | 6/2017 | Nam et al. |
| 2017/0317154 A1 | 11/2017 | Heo |
| 2017/0338438 A1 | 11/2017 | Kwon et al. |
| 2018/0006264 A1 | 1/2018 | Lee et al. |
| 2018/0040685 A1 | 2/2018 | Yeo et al. |
| 2018/0061323 A1 | 3/2018 | Kwon et al. |
| 2018/0083217 A1 | 3/2018 | Chung et al. |
| 2018/0090063 A1 | 3/2018 | Ying et al. |
| 2018/0102499 A1 | 4/2018 | Pyo et al. |
| 2018/0123078 A1 | 5/2018 | Byun et al. |
| 2018/0158881 A1 | 6/2018 | Lim et al. |
| 2018/0166518 A1 | 6/2018 | Kim |
| 2018/0198080 A1 | 7/2018 | Noh et al. |
| 2018/0212060 A1 | 7/2018 | Kang et al. |
| 2018/0219058 A1 | 8/2018 | Xiang et al. |
| 2018/0226455 A1 | 8/2018 | Kim et al. |
| 2018/0226581 A1* | 8/2018 | Chang .................. H10K 50/828 |
| 2018/0261797 A1 | 9/2018 | Lee |
| 2018/0294436 A1 | 10/2018 | Choi et al. |
| 2018/0309085 A1 | 10/2018 | Park et al. |
| 2018/0337219 A1 | 11/2018 | Rhee et al. |
| 2018/0366678 A1 | 12/2018 | Chi et al. |
| 2019/0081111 A1 | 3/2019 | Lee et al. |
| 2019/0088204 A1 | 3/2019 | Zhang et al. |
| 2019/0130822 A1 | 5/2019 | Jung et al. |
| 2019/0237517 A1 | 8/2019 | Hack |
| 2019/0250450 A1 | 8/2019 | Li |
| 2019/0253591 A1 | 8/2019 | Chen et al. |
| 2019/0273125 A1 | 9/2019 | Takechi |
| 2019/0305246 A1* | 10/2019 | Helander .............. H10K 50/828 |
| 2019/0317629 A1 | 10/2019 | Jung et al. |
| 2019/0325805 A1 | 10/2019 | Moon et al. |
| 2019/0340980 A1 | 11/2019 | Yum et al. |
| 2019/0341435 A1 | 11/2019 | Chang et al. |
| 2019/0341575 A1 | 11/2019 | Chung et al. |
| 2019/0348627 A1 | 11/2019 | Lee et al. |
| 2020/0035951 A1 | 1/2020 | Cheon et al. |
| 2020/0044197 A1 | 2/2020 | Shedletsky et al. |
| 2020/0064968 A1 | 2/2020 | Kim et al. |
| 2020/0075683 A1 | 3/2020 | Polyakov et al. |
| 2020/0075693 A1 | 3/2020 | Polyakov et al. |
| 2020/0075864 A1 | 3/2020 | Helander et al. |
| 2020/0099836 A1 | 3/2020 | Chao |
| 2020/0105843 A1 | 4/2020 | Baek et al. |
| 2020/0111401 A1 | 4/2020 | Zhao et al. |
| 2020/0136077 A1 | 4/2020 | Lee et al. |
| 2020/0159284 A1 | 5/2020 | Mathew et al. |
| 2020/0194676 A1 | 6/2020 | Chang et al. |
| 2020/0194730 A1 | 6/2020 | Park et al. |
| 2020/0212130 A1 | 7/2020 | Kim et al. |
| 2020/0357871 A1 | 11/2020 | Chung et al. |

FOREIGN PATENT DOCUMENTS

| | | |
|---|---|---|
| CN | 101617064 A | 12/2009 |
| CN | 101730938 A | 6/2010 |
| CN | 102456713 A | 5/2012 |
| CN | 102738409 A | 10/2012 |
| CN | 104037359 A | 9/2014 |
| CN | 104769149 A | 7/2015 |
| CN | 105094451 A | 11/2015 |
| CN | 105097877 A | 11/2015 |
| CN | 105206650 A | 12/2015 |
| CN | 105206753 A | 12/2015 |
| CN | 106206995 A | 12/2016 |
| CN | 106992267 A | 7/2017 |
| CN | 107564945 A | 1/2018 |
| CN | 107808895 A | 3/2018 |
| CN | 108376019 A | 8/2018 |
| CN | 108389878 A | 8/2018 |
| CN | 108418928 A | 8/2018 |
| CN | 108630830 A | 10/2018 |
| CN | 108767136 A | 11/2018 |
| CN | 108881531 A | 11/2018 |
| CN | 108900659 A | 11/2018 |
| CN | 109299631 A | 2/2019 |
| CN | 109461758 A | 3/2019 |
| CN | 109599030 A | 4/2019 |
| CN | 109742132 A | 5/2019 |
| CN | 109817672 A | 5/2019 |
| CN | 109817694 A | 5/2019 |
| CN | 109830495 A | 5/2019 |
| CN | 109920931 A | 6/2019 |
| CN | 109950293 A | 6/2019 |
| CN | 110112182 A | 8/2019 |
| CN | 110144551 A | 8/2019 |
| CN | 110265474 A | 9/2019 |
| CN | 110391348 A | 10/2019 |
| CN | 110416269 A | 11/2019 |
| CN | 110429117 A | 11/2019 |
| CN | 110444125 A | 11/2019 |
| CN | 110459175 A | 11/2019 |
| CN | 110473898 A | 11/2019 |
| CN | 110473988 A | 11/2019 |
| CN | 110491917 A | 11/2019 |
| CN | 110491918 A | 11/2019 |
| CN | 110492018 A | 11/2019 |
| CN | 110518034 A | 11/2019 |
| CN | 110570774 A | 12/2019 |
| CN | 110634930 A | 12/2019 |
| CN | 110718580 A | 1/2020 |
| CN | 110727142 A | 1/2020 |
| CN | 110752249 A | 2/2020 |
| CN | 110767662 A | 2/2020 |
| CN | 110767682 A | 2/2020 |
| CN | 110767708 A | 2/2020 |
| CN | 110767709 A | 2/2020 |
| CN | 110767713 A | 2/2020 |
| CN | 110767736 A | 2/2020 |
| CN | 110767830 A | 2/2020 |
| CN | 110767835 A | 2/2020 |
| CN | 110767836 A | 2/2020 |
| CN | 110767844 A | 2/2020 |
| CN | 110780375 A | 2/2020 |
| CN | 110783484 A | 2/2020 |
| CN | 110783485 A | 2/2020 |
| CN | 110783486 A | 2/2020 |
| CN | 110828699 A | 2/2020 |
| CN | 110867527 A | 3/2020 |
| CN | 110914891 A | 3/2020 |
| CN | 110923625 A | 3/2020 |
| CN | 110928453 A | 3/2020 |
| CN | 110956925 A | 4/2020 |
| CN | 110989861 A | 4/2020 |
| CN | 111009619 A | 4/2020 |
| CN | 111020489 A | 4/2020 |
| CN | 111029381 A | 4/2020 |
| CN | 111029382 A | 4/2020 |
| CN | 111046599 A | 4/2020 |
| CN | 111048564 A | 4/2020 |
| CN | 111142180 A | 5/2020 |

(56) References Cited

FOREIGN PATENT DOCUMENTS

| | | |
|---|---|---|
| CN | 111155055 A | 5/2020 |
| CN | 111180490 A | 5/2020 |
| CN | 111223908 A | 6/2020 |
| CN | 111261641 A | 6/2020 |
| CN | 111292617 A | 6/2020 |
| CN | 111293235 A | 6/2020 |
| CN | 111293236 A | 6/2020 |
| CN | 111312795 A | 6/2020 |
| CN | 111341936 A | 6/2020 |
| CN | 210668382 U | 6/2020 |
| CN | 111403621 A | 7/2020 |
| CN | 111524460 A | 8/2020 |
| CN | 111524469 A | 8/2020 |
| CN | 111584725 A | 8/2020 |
| CN | 111584748 A | 8/2020 |
| CN | 111640882 A | 9/2020 |
| CN | 111668240 A | 9/2020 |
| CN | 111682055 A | 9/2020 |
| CN | 111682120 A | 9/2020 |
| CN | 111725288 A | 9/2020 |
| CN | 111739921 A | 10/2020 |
| CN | 111739924 A | 10/2020 |
| CN | 111755493 A | 10/2020 |
| CN | 111755623 A | 10/2020 |
| CN | 111799374 A | 10/2020 |
| CN | 111834547 A | 10/2020 |
| CN | 111862875 A | 10/2020 |
| CN | 111863900 A | 10/2020 |
| EP | 1 850 368 A1 | 10/2007 |
| EP | 1 873 162 A1 | 1/2008 |
| EP | 2 998 997 A1 | 3/2016 |
| EP | 3 182 477 A1 | 6/2017 |
| EP | 2 248 849 B1 | 7/2017 |
| EP | 3 240 036 A1 | 11/2017 |
| EP | 3 316 311 A1 | 5/2018 |
| EP | 3 331 045 A1 | 6/2018 |
| EP | 3 336 899 A1 | 6/2018 |
| EP | 3 406 752 A1 | 11/2018 |
| EP | 3 499 576 A1 | 6/2019 |
| JP | 2004-352815 A | 12/2004 |
| JP | 2006-318910 A | 11/2006 |
| JP | 2007-188854 A | 7/2007 |
| JP | 2007-273261 | 10/2007 |
| JP | 2008-091323 A | 4/2008 |
| JP | 2010-258410 A | 11/2010 |
| JP | 5233074 B2 | 7/2013 |
| JP | 2013-219278 A | 10/2013 |
| KR | 1020100054630 A | 5/2010 |
| KR | 1020100123735 A | 11/2010 |
| KR | 1020140062258 A | 5/2014 |
| KR | 1020150127368 A | 11/2015 |
| KR | 101640772 B1 | 7/2016 |
| KR | 1020170075865 A | 7/2017 |
| KR | 20180075589 A | 7/2018 |
| KR | 1020180115655 A | 10/2018 |
| KR | 1020180121304 A | 11/2018 |
| TW | 201929219 A | 7/2019 |
| WO | WO-2011/012212 A1 | 2/2011 |
| WO | WO-2011/049284 A1 | 4/2011 |
| WO | WO-2016/056364 A1 | 4/2016 |
| WO | WO-2017/072678 A1 | 5/2017 |
| WO | WO-2018/198052 A1 | 11/2018 |
| WO | WO-2018/206575 A1 | 11/2018 |
| WO | WO-2018/211460 A1 | 11/2018 |
| WO | WO-2019/002198 A1 | 1/2019 |
| WO | WO-2019/006749 A1 | 1/2019 |
| WO | WO-2019/047126 A1 | 3/2019 |
| WO | WO-2019/062221 A1 | 4/2019 |
| WO | WO-2019/062236 A1 | 4/2019 |
| WO | WO-2019/088594 A2 | 5/2019 |
| WO | WO-2019/141198 A1 | 7/2019 |
| WO | WO-2019/147012 A1 | 8/2019 |
| WO | WO-2019/178782 A1 | 9/2019 |
| WO | WO-2019/199131 A1 | 10/2019 |
| WO | WO-2019/199139 A1 | 10/2019 |
| WO | WO-2019/199693 A1 | 10/2019 |
| WO | WO-2019/200862 A1 | 10/2019 |
| WO | WO-2019/233298 A1 | 12/2019 |
| WO | WO-2019/242510 A1 | 12/2019 |
| WO | WO-2020/029559 A1 | 2/2020 |
| WO | WO-2020/029612 A1 | 2/2020 |
| WO | WO-2020/029621 A1 | 2/2020 |
| WO | WO-2020/045262 A1 | 3/2020 |
| WO | WO-2020/052232 A1 | 3/2020 |
| WO | WO-2020/079456 A1 | 4/2020 |
| WO | WO-2020/105015 A1 | 5/2020 |
| WO | WO-2020/134914 A1 | 7/2020 |
| WO | WO-2020/191889 A1 | 10/2020 |
| WO | WO-2020/192051 A1 | 10/2020 |
| WO | WO-2020/195917 A1 | 10/2020 |
| WO | WO-2020/199445 A1 | 10/2020 |
| WO | WO-2020/226383 A1 | 11/2020 |
| WO | WO-2020/261191 A1 | 12/2020 |

OTHER PUBLICATIONS

"Forrest, James A.""Reductions of the glass transition temperature in thin polymer films: Probing the length scale of cooperative dynamics."" Physical Review E 61.1 (2000): R53-6."

Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.

Aqra, Fathi, and Ahmed Ayyad. "Surface free energy of alkali and transition metal nanoparticles." Applied surface science 314 (2014): 308-313.

Baek, Seungin, et al. "74-2: Diffracted Image Retrieving with Deep Learning."?SID Symposium Digest of Technical Papers. vol. 51. No. 1. 2020.

Bechtolsheim, C. V., V. Zaporojtchenko, and F. Faupel. "Interface structure and formation between gold and trimethylcyclohexane polycarbonate." Journal of materials research 14.9 (1999): 3538-3543.

Chen, Yu-Hung, et al. "58.2: High-Performance Large-Size OLED Tv with Ultra Hd Resolution." SID Symposium Digest of Technical Papers. vol. 46. No. 1. 2015.

Ching, Suet Ying. "Plasmonic properties of silver-based alloy thin films." (2015). Open Access Theses and Dissertations. 194.

Ching, Suet Ying. "Plasmonic properties of silver-based alloy thin films." (2016).

David, Robert, Neumann, A. Wilhelm. "A Theory for the Surface Tensions and Contact Angles of HydrogenBonding Liquids." Langmuir 30.39 (2014):11634-11639.

Dubrovskii, Vladimir. "Fundamentals of Nucleation Theory." Nucleation Theory and Growth of Nanostructures. Springer, Berlin, Heidelberg, 2014. 1-73.

Eguchi, Shingo, et al. "35-1: Strategy for Developing an Ultra-High-Luminance AMOLED Display." SID Symposium Digest of Technical Papers. vol. 49. No. 1. 2018.

Eilers, H., et al. "Teflon AF/Ag nanocomposites with tailored optical properties." Journal of materials research 21.9 (2006): 2168-2171.

Emerton, Neil, David Ren, and Tim Large. "28-1: Image Capture Through TFT Arrays." SID Symposium Digest of Technical Papers. vol. 51. No. 1. 2020.

Faupel, F., et al. "Nucleation, growth, interdiffusion, and adhesion of metal films on polymers."?AIP Conference Proceedings. vol. 491. No. 1. American Institute of Physics, 1999.

Feng, Zhengyu, et al. "28-3: Pixel Design for Transparent MicroLED Display with Low Blurring."?SID Symposium Digest of Technical Papers. vol. 51. No. 1. 2020.

Flores-Camacho, Jose Manuel, et al. "Growth and optical properties of Ag clusters deposited on poly (ethylene terephthalate)." Nanotechnology 22.27 (2011): 275710.

Fowkes, Frederick M. "Attractive Forces at Interfaces." Industrial and Engineering Chemistry 56.12 (1964): 40-52.

Frey, Kurt, et al. "Implications of coverage-dependent O adsorption for catalytic NO oxidation on the late transition metals." Catalysis Science & Technology 4.12 (2014): 4356-4365.

(56) References Cited

OTHER PUBLICATIONS

Fryer, David S., et al. "Dependence of the glass transition temperature of polymer films on interfacial energy and thickness."? Macromolecules?34.16 (2001): 5627-5634.

Fusella, Michael A., et al. "Plasmonic enhancement of stability and brightness in organic light-emitting devices." Nature 585.7825 (2020): 379-382.

Heaney, James B. "Evaluation of commercially supplied silver coated Teflon for spacecraft temperature control usage." (1974).

Ho, P. S. "Chemistry and adhesion of metal-polymer interfaces." Applied surface science 41 (1990): 559-566.

Ho, P. S., et al. "Chemical bonding and reaction at metal/polymer interfaces." Journal of Vacuum Science & Technology A: Vacuum, Surfaces, and Films 3.3 (1985): 739-745.

Hopkin, Hywel T., Edward A. Boardman, and Tim M. Smeeton. "36-4: Solution-Processed Transparent Top Electrode for QD-LED." SID Symposium Digest of Technical Papers. vol. 51. No. 1. 2020.

Jiao, Zhiqiang, et al. "61-2: Weakening Micro-Cavity Effects in White Top-Emitting WOLEDs with Semitransparent Metal Top Electrode."?SID Symposium Digest of Technical Papers. vol. 49. No. 1. 2018.

Kanzow, J., et al. "Formation of a metal/epoxy resin interface." Applied surface science 239.2 (2005): 227-236.

Karabacak, Tansel. "Thin-film growth dynamics with shadowing and re-emission effects." Journal of Nanophotonics 5.1 (2011): 052501.

Kaspaul, A. F., and E. E. Kaspaul. "Application of molecular amplification to microcircuitry." Trans. 10th National Vacuum Symposium. 1963. pp. 422-427.

Kato, Daimotsu, et al. "52.4 L Transmissive One-Side-Emission OLED Panel using Alignment-Free Cathode Patterning."?SID Symposium Digest of Technical Papers. vol. 46. No. 1. 2015.

Kim, Haewon, et al. "Analysis of Semi-Transparent Cathode Performance Based on Fabrication Methods." IDW '19. 2019.

Kim, Hyun-Chang, et al. "39-4: A Method of Panel-Current Limitation for Automotive OLED Displays."?SID Symposium Digest of Technical Papers. vol. 51. No. 1. 2020.

Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.

Kisin, Srdjan.?Adhesion changes at metal-polymer interfaces: Study of the copper-(acrylonitrile-butadiene-styrene) system. Diss. Dissertation, Technische Universiteit Eindhoven, 2007.

Knight Jr, L. B., et al. "Unusual behavior of vaporized magnesium under low pressure conditions."?The Journal of Physical Chemistry? 79.12 (1975): 1183-1190.

Koma, N. et al. "44.2: Novel Front-light System Using Fine-pitch Patterned OLED." SID Symposium Digest of Technical Papers, 39: 655-658. 2008.

Lee, Chang-Jun, et al. "Microcavity effect of top-emission organic light-emitting diodes using aluminum cathode and anode." Bulletin of the Korean Chemical Society 26.9 (2005): 1344-1346.

Lee, Chia-Tse, et al. "58.3: A Novel Highly Transparent 6-in. AMOLED Display Consisting of IGZO TFTs."?SID Symposium Digest of Technical Papers. vol. 46. No. 1. 2015.

Lifka, H. et al. "P-169: Single Side Emitting Transparent OLED Lamp." SID Symposium Digest of Technical Papers, 42: 1737-1739. 2011.

Lim, Sehoon, et al. "74-1: Image Restoration for Display-Integrated Camera." SID Symposium Digest of Technical Papers. vol. 51. No. 1. 2020.

Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.

Liu, Yang, et al. "P-168: Top Emission WOLED for High Resolution OLED TV." SID Symposium Digest of Technical Papers. vol. 49. No. 1. 2018.

Liu, Yunfei, et al. "P-202: High Transmittance Top Conductive Electrodes of OLEDs by Using Conductive Interface Layer." SID Symposium Digest of Technical Papers. vol. 51. No. 1. 2020.

Lund, L. G., et al. "514. Phosphonitrilic derivatives. Part I. The preparation of cyclic and linear phosphonitrilic chlorides." Journal of the Chemical Society (Resumed) (1960): 2542-2547.

Maissel, Leon I., and Maurice H. Francombe. An introduction to thin films. CRC Press, 1973. pp. 61-83, 198, 199.

Meinders, Marcel BJ, William Kloek, and Ton van Vliet. "Effect of surface elasticity on Ostwald ripening in emulsions." Langmuir 17.13 (2001): 3923-3929.

Michele Ricks. Advanced OLED Materials Enabling Large-Size OLED Displays by Ink Jet Printing. OLEDs World Summit, Sep. 2020.

Mittal, Kashmiri Lal, ed. Metallized plastics 3: fundamental and applied aspects. Springer Science & Business Media, 2012.

Morgenstern, Karina, Georg Rosenfeld, and George Comsa. "Decay of two-dimensional Ag islands on Ag (111)." Physical review letters 76.12 (1996): 2113.

Murano, Sven, et al. "30.3: Invited Paper: AMOLED Manufacturing-Challenges and Solutions from a Material Makers Perspective."? SID Symposium Digest of Technical Papers. vol. 45. No. 1. 2014.

Nakamura, Daiki, et al. "68-4: Top-emission OLED Kawara-type Multidisplay with Auxiliary Electrode." SID Symposium Digest of Technical Papers. vol. 49. No. 1. 2018.

Nittler, Laurent, et al. "Morphology study of small amounts of evaporated gold on polymers." Surface and interface analysis 44.8 (2012): 1072-1075.

Ohring, Milton. Materials science of thin films. Elsevier, 2001.

Okuyama, Kentaro, et al.?"79-4L:?Late-News Paper: Highly Transparent LCD using New Scattering-type Liquid Crystal with Field Sequential Color Edge Light."?SID Symposium Digest of Technical Papers,?48, 2017.

Pandharkar, Riddhish, et al. "A Computational Study of AlF3 and ACF Surfaces." Inorganics 6.4 (2018): 124.

Park, Chan II, et al. "54-1: Distinguished Paper: World 1st Large Size 77-inch Transparent Flexible OLED Display."?SID Symposium Digest of Technical Papers. vol. 49. No. 1. 2018.

Park, Jongwoong, et al. "8-1: The Method to Compensate IR-Drop of AMOLED Display." SID Symposium Digest of Technical Papers. vol. 50. No. 1. 2019.

Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.

Peters, Richard D., et al. "Using Self-Assembled Monolayers Exposed to X-rays To Control the Wetting Behavior of Thin Films of Diblock Copolymers." Langmuir 16.10 (2000): 4625-4631.

Quan, Wei, et al. "69-2: Transparent Conductive Hybrid Cathode Structure for Top-Emitting Organic Light-Emitting Devices."?SID Symposium Digest of Technical Papers. vol. 51. No. 1. 2020.

Rokni-Fard, Mahroo, and Quanmin Guo. "Biased Ostwald ripening in site-selective growth of two-dimensional gold clusters." The Journal of Physical Chemistry C 122.14 (2018): 7801-7805.

Safonov, Alexey I., et al. "Deposition of thin composite films consisting of fluoropolymer and silver nanoparticles having surface plasmon resonance." Thin Solid Films 603 (2016): 313-316.

Satulu, Veronica, et al. "Combining fluorinated polymers with Ag nanoparticles as a route to enhance optical properties of composite materials." Polymers 12.8 (2020): 1640.

Scharnberg, M., et al. "Radiotracer measurements as a sensitive tool for the detection of metal penetration in molecular-based organic electronics." Applied Physics Letters 86.2 (2005): 024104.

Schissel, Paul, and Alvin Warren Czanderna. "Reactions at the silver/polymer interface: a review." Solar Energy Materials 3.1-2 (1980): 225-245.

Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.

(56) References Cited

OTHER PUBLICATIONS

Shen, Mingmin, et al. "Destabilization of Ag nanoislands on Ag (100) by adsorbed sulfur." The Journal of chemical physics 135.15 (2011): 154701.
Shi, Shiming, et al. "56-1: Invited Paper: Research on Commercial Foldable AMOLED and Relevant Technologies."?SID Symposium Digest of Technical Papers. vol. 51. No. 1. 2020.
Shin, Dong-Youn, and Inyoung Kim. "Self-patterning of fine metal electrodes by means of the formation of isolated silver nanoclusters embedded in polyaniline."?Nanotechnology?20.41 (2009): 415301.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Song, Hongwei, Olusegun J. Ilegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Tang, Quan, et al. "28-2: Study of the Image Blur through FFS LCD Panel Caused by Diffraction for Camera under Panel." SID Symposium Digest of Technical Papers. vol. 51. No. 1. 2020.
Tarasevich, Y. I. "Surface energy of oxides and silicates." Theoretical and Experimental Chemistry 42 (2006): 145-161.
Thran, A., et al. "Condensation coefficients of Ag on polymers." Physical review letters 82.9 (1999): 1903.
Tsai, Yu-Hsiang, et al. "P-202: A Flexible Transparent OLED Display with FlexUPTM Technology."?SID Symposium Digest of Technical Papers. vol. 48. No. 1. 2017.
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Selective metal deposition on photoswitchable molecular surfaces." Journal of the American Chemical Society 130.32 (2008): 10740-10747.
Varagnolo, Silvia, et al. "Embedded-grid silver transparent electrodes fabricated by selective metal condensation."?Journal of Materials Chemistry C?8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vitos, Levente, et al. "The surface energy of metals." Surface science 411.1-2 (1998): 186-202.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Wang, Hailiang, et al. "P-132: An Under-Display Camera Optical Structure for Full-Screen LCD."?SID Symposium Digest of Technical Papers. vol. 51. No. 1. 2020.
Wang, Zhibin, et al. "55-1: Invited Paper: Self-Assembled Cathode Patterning in AMOLED for Under-Display Camera."?SID Symposium Digest of Technical Papers. vol. 51. No. 1. 2020.
Wang, Zhibin, et al. "60-5: Late-News Paper: 17-inch Transparent AMOLED Display With Self-Assembled Auxiliary Electrode." SID Symposium Digest of Technical Papers. vol. 50. No. 1. 2019.
Weimer, P. K. "Physics of Thin Films, vol. 2.". Academic Press, (1964).
Wolfgang Decker, Vast Films, Ltd. "Pattern Metallization: Selective Deposition of Metals on Polymer Films for Functional Applications" AIMCAL Fall Conference 2005.
Wu, Zhongyuan, et al. "34-2: Distinguished Paper: Development of 55inch 8K AMOLED TV by Inkjet Printing Process."?SID Symposium Digest of Technical Papers. vol. 51. No. 1. 2020.
Xu, Hua, et al. "Transparent AMOLED Display Derived by Metal Oxide Thin Film Transistor with Praseodymium Doping." Proceedings of the International Display Workshops vol. 26 (IDW '19). 2019.
Yamada, Toshikazu, et al. "Nanoparticle chemisorption printing technique for conductive silver patterning with submicron resolution." Nature communications 7.1 (2016): 1-9.
Yang, Jun-Yu, et al. "32-3: AMOLED IR Drop Compensation for Channel Length Modulation." SID Symposium Digest of Technical Papers. vol. 51. No. 1. 2020.
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method."?Surface science?532 (2003): 300-305.
Zaporojtchenko, V., et al. "Determination of condensation coefficients of metals on polymer surfaces."?Surface science?454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zeng, Yang, et al. "28-4: Investigation of Moir? Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects."?SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Zhenhua. "74-3: Image Deblurring of Camera Under Display by Deep Learning."?SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.
Abroshan, H. et al. "66-3: Active Learning for the Design of Novel OLED Materials." SID Symposium Digest of Technical Papers. 53.1 (2022).
Alhadid A. et al., "Design of Deep Eutectic Systems: A Simple Approach for Preselecting Eutectic Mixture Constituents", Molecules, 25.5 (2020): 1077.
Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

(56) References Cited

OTHER PUBLICATIONS

Allcock, H.R. "Phosphorus-nitrogen Compounds", pp. 400-407, Academic Press (1972).
Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.
Allcock, Harry R., and Dawn E. Smith. "Surface studies of poly (organophosphazenes) containing dimethylsiloxane grafts." Chemistry of materials 7.8 (1995): 1469-1474.
Allcock, Harry R., and Michael L. Turner. "Ring expansion and polymerization of transannular bridged cyclotriphosphazenes and their spirocyclic analogs." Macromolecules 26.1 (1993): 3-10.
Allcock, Harry R., Gayann S. McDonnell, and James L. Desorcie. "Ring expansion and equilibration in organophosphazenes and the relationship to polymerization." Inorganic chemistry 29.19 (1990): 3839-3844.
Allcock, Harry R., Michael L. Turner, and Karyn B. Visscher. "Synthesis of transannular- and spiro-substituted cyclophosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {O2C10H6}], and 1, 3-[N3P3 (OCH2CF3) 4} O2C10H6}]." Inorganic chemistry 31.21 (1992): 4354-4364.
Araki, H. and Naka, K., "Syntheses and Properties of Dumbbell-Shaped POSS Derivatives Linked by Luminescent p-Conjugated Units", Polymer Chemistry, 50.20 (2012):4170-4181.
Araki, H. and Naka, K., "Syntheses and Properties of Star- and Dumbbell-Shaped POSS Derivatives Containing Isobutyl Groups", Polymer Journal, 44 (2012):340-346.
Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.
Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.
Bae, J. et al. "Optically recoverable, deep ultraviolet (UV) stable and transparent sol-gel fluoro siloxane hybrid material for a UV LED encapsulant." RSC advances 6.32 (2016): 26826-26834.
Baradie, B. et al. "Synthesis and characterization of novel polysiloxane-grafted fluoropolymers." Canadian journal of chemistry 83.6-7 (2005): 553-558.
Barry, B., "Routes to Silsesquioxanes Functionalization—Capping of DDSQs for the Synthesis of Asymmetric POSS Compounds", Masters Thesis, Michigan State University (2019).
Bertolucci, M. et al. "Wetting Behavior of Films of New Fluorinated Styrene—Siloxane Block Copolymers." Macromolecules 37.10 (2004): 3666-3672.
Besli, S. et al., "Bridged Cyclophosphazenes Resulting From Deprotonation Reactions of Cyclotriphophazenes Bearing a P—NH Group", 40.19 (2011):5307.
Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.
Biederman, H. et al., "The Properties of Fluorocarbon Films Prepared by R.F. Sputtering and Plasma Polymerization in Inert and Active Gas", Thin Solid Films, 41.3 (1977):329-339.
Blanchet, G.B., "Deposition of Amorphous Fluoropolymers Thin Films by Laser Ablation", Appl. Phys. Lett. 62 (1993):479-481.
Blanco, I., "The Rediscovery of Poss: A Molecule Rather than a Filler", Polymers, 10.8 (2018):904-914.
Boyne, D. et al., "Vacuum Thermal Evaporation of Polyaniline Doped with Camphor Sulfonic Acid", Journal of Vacuum Science & Technology A, 33.3 (2015):031510.
Brickley, J.F. et al., "Supramolecular Variations on a Molecular Theme: the Structural Diversity of Phosphazenes (RNH)6P3N3 in the Solid State", Dalton Trans., 7 (2003):1235-1244.
Brown, Douglas E., et al. "Poly [(vinyloxy) cyclophosphazenes]." Macromolecules 34.9 (2001): 2870-2875.
Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.
Buzin, M. I., et al. "Solid-state polymerization of hexaphenylcyclotrisiloxane." Journal of Polymer Science Part A: Polymer Chemistry 35.10 (1997): 1973-1984.
Cai, J. et al. "P-13.10: A New Color Space Model for AMOLED Display Based on IR Drop" SID Symposium Digest of Technical Papers 54 (2023).
Camino, G. et al., "Polydimethylsiloxane Thermal Degradation Part 1. Kinetic Aspects", Polymer, 42.6 (2001):2395-2402.
Chaiprasert, T. et al. "Vinyl-functionalized Janus ring siloxane: potential precursors to hybrid functional materials." Materials 14.8 (2021): 2014.
Chan, E.P. et al., "Viscoelastic Properties of Confined Polymer Films Measured via Thermal Wrinkling", Soft Matter, 5.23 (2009):4638-4641.
Chan, K.L. et al., "Cubic Silsesquioxanes for Use in Solution Processable Organic Light Emitting Diodes (OLED)", Journal of Materials Chemistry, 19.48 (2009):9103-9120.
Chandrasekhar, V. et al., "Cyclophosphazene-Based Multi-Site Coordination Ligands", Coordination Chemistry Reviews, 251.9-10 (2007):1045-1074.
Chaudhury, M. and Pocius, A. V. "Adhesion science and engineering-2: Surfaces, Chemistry and Applications" Elsevier (2002).
Chen, G. K. J., and J. Chen. "Flexible displays: Flexible AMOLED manufacturing." Handbook of Visual Display Technology; Chen, J., Cranton, W., Fihn, M., Eds (2016).
Chen, W. et al., "Highly Thermal Stable Phenolic Resin Based on Double-Decker-Shaped POSS Nanocomposites for Supercapacitors", Polymers, 12.9 (2020):2151-2165.
Cho, H.U. et al. "17-1: Invited Paper: Enhancement of Current Efficiency for OLED Devices Using Meta-Heuristic Algorithm." SID Symposium Digest of Technical Papers. 52.1 (2021).
Choi, B. K. et al. "48-1: Invited Paper: Next Generation Highly Efficient and Stable Phosphorescent Emitting Materials For OLEDs." SID Symposium Digest of Technical Papers 51.1 (2020).
Choi, J. et al., "Light Extraction Enhancement in Flexible Organic Light-Emitting Diodes by a Light-Scattering Layer of Dewetted Ag Nanoparticles at Low Temperatures", App. Mater. Interfaces, 10 (2018):32373-32379.
Cordes, D.B. et al., "Recent Developments in the Chemistry of Cubic Polyhedral Oligosilsesquioxanes", Chem. Rev., 110 (2010):2081-2173.
Dalvi, V.H. and Rossky, P.J., "Molecular Origins of Fluorocarbon Hydrophobicity", PNAS, 107.31 (2010):13603-13607.
Dash, P. and Y. C.H. "How much battery does dark mode save? An accurate OLED display power profiler for modern smartphones." Proceedings of the 19th Annual International Conference on Mobile Systems, Applications, and Services (2021).
De Wilde, W., "Evaporation of Polytetrafluoroethylene by Electron Bombardment of the Bulk Material", Thin Solid Films, 24.1 (1974):101-111.
Dong, H. et al., "Surface Properties and Thermal Stability of a Novel Low-Surface-Energy Polybenzoxazine/Clay Nanocomposites", Polymer Composites, 33.8 (2012):1313-1320.
Drelich, J. et al., "Hydrophilic and Superhydrophilic Surfaces and Materials", Soft Matter, 7.21 (2011):9804-9828.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019):504-542.
Dutkiewicz, M. et al., "New Fluorocarbofunctional Spherosilicates: Synthesis and Characterization", Organometallics, 30.8 (2011):2149-2153.
Ellison, A. H., H. W. Fox, and W. A. Zisman. "Wetting of fluorinated solids by hydrogen-bonding liquids." The Journal of Physical Chemistry 57.7 (1953): 622-627.

(56) References Cited

OTHER PUBLICATIONS

English translation of 026-07-KR NP Office Action dated Dec. 13, 2023.
English translation of 026-08-JP NP Office Action dated Mar. 16, 2023.
English translation of 026-08-JP NP Office Action dated Oct. 31, 2023.
Feher, F.J. and Budzichowski, T.A., "Silasesquioxanes as Ligands in Inorganic and Organometallic Chemistry", Polyhedron, 14.22 (1995):3239-3253.
Fox, H.W. et al., "Polyorganosiloxanes . . . Surface Active Properties", Ind. Eng. Chem., 39.11 (1947):1401-1409.
Gabler, D.G. and Haw, J.F., "Hydrolysis Chemistry of the Chlorophosphazene Cyclic Trimer", Inorganic Chemistry, 29.20 (1990):4018-4021.
Gan, Y. et al., "Self-Wrinkling Patterned Surface of Photocuring Coating Induced by the Fluorinated POSS Containing Thiol Groups (F—POSS—SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Giebink, C. "Catastrophic OLED failure and pathways to address it" Department of Energy, url:https://www.energy.gov/sites/prod/files/2018/02/f48/giebink_oled-failure_nashville18_0.pdf (2018).
Glüge, J. et al., An Overview of the Uses of Per- and Polyfluoroalkyl Substances (PFAS), Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014):1212-1220.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019):371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Grant Norton, M. et al., "Pulsed Laser Ablation and Deposition of Fluorocarbon Polymers", Applied Surface Science, 96-98 (1996):617-620.
Gritsenko, K.P. and Krasovsky, A.M., "Thin-Film Deposition of Polymers by Vacuum Degradation", Chem. Rev., 103.9 (2003):3607-3649.
Grytsenko, K. "Vacuum-deposited fluoropolymer films for organic electronics" International Symposium on Plastics Electronics (Part of Semicon Europe—2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016):139-148.
Hoge, J. "Novel Benzoxazine Resin System for Flame Retardant Aircraft Interior Applications" The Sixth Triennial International Aircraft Fire and Cabin Safety Research (2010).
Holland, L. et al., "Sputtered and Plasma Polymerized Fluorocarbon Films", Thin Solid Films, 35 (1976): L19-L21.
Hwang, S. et al., "ChemInform Abstract: Dendritic Macromolecules for Organic Light-Emitting Diodes", Chemical Society Reviews, 37.11 (2008):2543-2557.
Iacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).
Iacono, S.T. et al., "Preparation of Composite Fluoropolymers with Enhanced Dewetting Using Fluorinated Silsesquioxanes as Drop-In Modifiers", J. Mater. Chem., 20.15 (2010):2979-2984.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009):125-135.

Ikonnikov, D.A., "Controlling Multiple Diffraction with Quasiperiodic Gratings", Laser Phys. Lett., 16.12 (2019):126202.
Imoto, H. et al., "Corner- and Side-Opened Cage Silsesquioxanes: Structural Effects on the Materials Properties", European Journal of Inorganic Chemistry, 2020.9 (2020):737-742.
Imoto, H. et al., "Tripodal Polyhedral Oligomeric Silsesquioxanes as a Novel Class of Three-Dimensional Emulsifiers", Polymer Journal, 47 (2015):609-615.
Interior Applications"The Sixth Triennial International Aircraft Fire and Cabin Safety Research (2010)".
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1-yl)alkyl]acetamides", Russian Journal of Organic Chemistry, 52.11 (2016):1558-1564.
Iwamori, S. et al., "Adsorption Properties of Fluorocarbon Thin Films Prepared by Physical Vapor Deposition Methods", Surface & Coatings Technology, 204:16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jarvis, N.L. and Zisman, W.A., "Surface Chemistry of Fluorochemicals", Defense Technical Information Center (1965):1-37.
Jin, Y. et al. "Two-Tier Ensemble Deep Learning Model for Anomaly Detection in OLED Encapsulation Process" The 21st International Meeting on Information Display, Seoul, Korea (2021).
Jung, W. et al. "High-precision laser glass cutting for future display" Journal of the Society for Information Display 30.5 (2022): 462-470.
Kaesler, K., "The hidden defenders : Silane and siloxane impregnation protects construction materials", European coatings journal, 3 (2006):36-41.
Khanin, D. A., et al. "New hybrid materials based on cyclophosphazene and polysiloxane precursors: Synthesis and properties." Polymer 186 (2020): 122011.
Kim, Chiwoo, et al. "Fine metal mask material and manufacturing process for high-resolution active-matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001):386-389.
Kim, S et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Invited Paper: Prolonging Device Lifetime of Blue Organic Light-Emitting Diodes." SID Symposium Digest of Technical Papers 53.1 (2022).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scentific Reports, 8.6391 (2018): 1-7.

(56) References Cited

OTHER PUBLICATIONS

Kim, T. et al., "Electrical Injection and Transport in Teflon-Diluted Hole Transport Materials", Organic Electronics, 83 (2020):105754.
Kim, Y. "AI & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
Kiskan, B., "Adapting Benzoxazine Chemistry for Unconventional Applications", Reactive and Functional Polymers, 129 (2018):76-88.
Koh, K et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005):1264-1270.
Kota, Arun K., Gibum Kwon, and Anish Tuteja. "The design and applications of superomniphobic surfaces." NPG Asia Materials 6.7 (2014): e109.
Kovacik, P. et al., "Vacuum-Deposited Planar Heterojunction Polymer Solar Cells", ACS Appl. Mater. Interfaces, 3.1 (2011):11-15.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Lanoux, S. and Mas, R.H., "Reactions of the Hydrolyzed Phosphazene N3P3(OCH2CF3)5ONa", Phosphorus and Sulfur and the Related Elements, 26.2 (1986):139-142.
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).
Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Lee, S. et al. "20-2: High Efficiency and Long Device Lifetime Green Organic Light Emitting Diodes using a Pt Complex." SID Symposium Digest of Technical Papers 51.1 (2020).
Li, L. et al., "Synthesis and Properties of Microporous Organic Polymers Based on Adamantane", Progress in Chemistry, 32 (2020):190-203.
Li, P. et al. "Preparation and application of fluorinated-siloxane protective surface coating material for stone inscriptions." Journal of Polymer Engineering 35.6 (2015): 511-522.
Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).
Liu, C. et al., "Mechanistic Studies on Ring-Opening Polymerization of Benzoxazines: A Mechanistically Based Catalyst Design", Macromolecules, 44.12 (2011):4616-4622.
Liu, F. et al. "Syntheses and structure of the first eight-membered fluoro and chloro hafnium siloxane complexes" Zeitschrift für anorganische und allgemeine Chemie 622.5 (1996): 819-822.
Liu, Z. et al., "Two-Dimensional Gratings of Hexagonal Holes for High Order Diffraction Suppression", Optics Express, 25.2 (2017): 1339-1349.
Lowe, R.D. et al., "Deposition of Dense Siloxane Monolayers from Water and Trimethoxyorganosilane Vapor", Langmuir, 27.16 (2011):9928-9935.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane-OH and Epoxy Resins", Journal of Applied Polymer Science, 106.6 (2007):4117-4123.
Lysien, M. et al. "55-1: Deposition of Conductive and Insulating Materials at Micrometer Scale for Display-Component Prototyping." SID Symposium Digest of Technical Papers 53.1 (2022).
Mabry, J.M. et al., "Fluorinated Polyhedral Oligomeric Silsesquioxanes (F-POSS)", Angew. Chem. Int. Ed., 47.22 (2008):4137-4140.
Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.
Mackus, A.J.M. et al. "From the bottom-up: toward area-selective atomic layer deposition with high selectivity" Chemistry of Materials 31.1 (2018): 2-12.
Majhy, B. et al., "Facile Fabrication and Mechanistic Understanding of a Transparent Reversible Superhydrophobic—Superhydrophilic Surface", Scientific Reports, 8 (2018):18018.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Marzari, N. et al. "Electronic-structure methods for materials design." Nature materials 20.6 (2021):736-749.
Mikhaylov, D.Y. and Budnikova, Y.H., "Fluoroalkylation of Organic Compounds", Russian Chemical Reviews, 82.9 (2013):835-864.
Mugisawa, M. et al., "Synthesis and Application of Novel Fluoroalkyl End-Capped Cooligomers Having Adamantane as a Pendant Group", Colloid Polym Sci, 285 (2007):737-744.
Murray, M. et al., "NMR Studies of Hydrolysis and Rearrangement Reactions of Cyclophosphazenes", Phosphorus, Sulfur, and Silicon and the Related Elements, 65.1-4 (1992):83-86.
Nason, T.C. et al., "Deposition of Amorphous Fluoropolymer Thin Films by Thermolysis of Teflon Amorphous Fluoropolymer", Appl. Phys. Lett. 60 (1992):1866-1868.
Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on—CF3 Alignment", Langmuir, 15 (1999):4321-4323.
Niu, J. et al., "High Order Diffraction Suppression by Quasi-Periodic Two-Dimensional Gratings", Optical Materials Express, 7.2 (2017):366-375.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Oka, M. and Satoshi, H. "Synthesis of photoresponsive cyclic poly (dimethyl siloxane) s from monodisperse linear precursors" Reactive and functional polymers 158 (2021): 104800.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Olejnik, A. et al., "Silsesquioxanes in the Cosmetics Industry—Applications and Perspectives", Materials, 15.3 (2022):1126-1143.
Owen, M. J. "A review of significant directions in fluorosiloxane coatings" Surface Coatings International Part B: Coatings Transactions 87:B2 (2004).
Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.
Pham, J.Q. and Green, P.F., "The Glass Transition of Thin Film Polymer/Polymer Blends: Interfacial Interactions and Confinement", J. Chem. Phys., 116.13 (2002):5801-5806.
Pocius, A. V. and Dillard, D.A. "Adhesion science and engineering-1: The Mechanics of Adhesion" Elsevier (2002).
Pu, T. et al., "Effects of Structure Parameters on High-Order Diffraction Suppression of Quasi-Periodic Gratings", Journal of the Optical Society of America B, 35.4 (2018):711-717.
Ramirez, S.M. et al., "Incompletely Condensed Fluoroalkyl Silsesquioxanes and Derivatives: Precursors for Low Surface Energy Materials", J. Am. Chem. Soc. 133.50 (2011):20084-20087.

(56) References Cited

OTHER PUBLICATIONS

Reichert, V.R. and Mathias, L.J., "Expanded Tetrahedral Molecules from 1,3,5,7-Tetraphenyladamantane", Macromolecules, 27.24 (1994):7015-7023.

Riberiro, P et al., "Optics, Photonics and Laser Technology 2017", Chapters 2 and 3, Springer (2019).

Ringe, E., "Shapes, Plasmonic Properties, and Reactivity of Magnesium Nanoparticles", J. Phys. Chem. C, 124 (2020):15665.

Roy, M.R., "Surface Properties of Hard Fluorinated Amorphous Carbon Films Deposited by Pulsed-DC Discharges", Doctoral Thesis, Universitat de Barcelona (2012).

Schilling, C.I. et al., "Fourfold Suzuki-Miyaura and Sonogashira Cross-Coupling Reactions on Tetrahedral Methane and Adamantane Derivatives", Eur. J. Org. Chem., 2011.9 (2011):1743-1754.

Seebauer, E.G. and Allen, C.E., "Estimating Surface Diffusion Coefficients", Progress in Surface Science, 49.3 (1995): 265-330.

Senchyk, A.G. et al., "1,2,4-Triazole Functionalized Adamantanes: a New Library of Polydentate Tectons for Designing Structures of Coordination Polymers", Dalton Trans., 41.28 (2012):8675-8689.

Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.

Sessler, C.D. et al., "CF2H, a Hydrogen Bond Donor", J. Am. Chem. Soc., 139.27 (2017):9325-9332.

Shen. Y, et al. "32.1: Research of Nanocomposite Materials with High Refractive Index for HLEMS Application" SID Symposium Digest of Technical Papers 54 (2023).

Shevlin, S. et al. "Computational materials design." Nature Materials 20.6 (2021): 727-727.

Shih, H. et al., "A Cross-Linkable Triphenylamine Derivative as a Hole Injection/Transporting Material in Organic Light-Emitting Diodes", Polym. Chem., 6 (2015):6227-6237.

Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.

Sohn, I. et al. "Improved modeling of material deposition during OLED manufacturing using direct simulation monte carlo method on GPU Architecture." International Journal of Precision Engineering and Manufacturing—Green Technology 6 (2019): 861-873.

Sohn, I. et al. "Numerical Experiment Using Direct Simulation Monte Carlo for Improving Material Deposition Uniformity During OLED Manufacturing." International Journal of Precision Engineering and Manufacturing—Green Technology (2021): 1-14.

Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.

Spoljaric, S. et al., "Novel Elastomer-Dumbbell Functionalized POSS Composites: Thermomechanical and Morphological Properties", Journal of Applied Polymer Science, 123.1 (2012):585-600.

Starr, F.W. et al., "Bound Layers 'Cloak' Nanoparticles in Strongly Interacting Polymer Nanocomposites", ACS Nano, 10.12 (2016):10960-10965.

Sun, J. et al. "6-4: Late-News Paper: Realizing Deep Blue Emission in Blue Phosphorescent Organic Light-Emitting Diodes", SID Symposium Digest of Technical Papers, 51,2020: 65-66.

Sun, T. et al., "Reversible Switching between Superhydrophilicity and Superhydrophobicity", Angew. Chem. Int. Ed., 43.3 (2004):357-360.

Svorcik, V. et al., "Deposition of Polystyrene Films by Vacuum Evaporation", Journal of Materials Science Letters, 16 (1997):1564-1566.

Takele, H. et al., "Plasmonic Properties of Ag Nanoclusters in Various Polymer Matrices", Nanotechnology, 17.14 (2006):3499-3505.

Tao, C. et al., "Highly Icephobic Properties on Slippery Surfaces Formed From Polysiloxane and Fluorinated POSS", Progress in Organic Coatings, 103 (2017):48-59.

Thran, A., et al. "Condensation coefficients of Ag on polymers." Physical review letters 82.9 (1999):1903-1906.

Tokuchi. S et al. "8-4: Oxide Semiconductor In—Zn—O—X system with High Electron Mobility." SID Symposium Digest of Technical Papers 54.1 (2023).

Tong, T. et al., "Adhesion in Organic Electronics Structures", Journal of Applied Physics, 106.8 (2009): 083708.

Töpper, T. et al. "Siloxane-based thin films for biomimetic low-voltage dielectric actuators." Sensors and Actuators A: Physical 233 (2015): 32-41.

Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).

Tsujioka, Tsuyoshi, Rie Takagi, and Takahiro Shiozawa. "Light-controlled metal deposition on photochromic polymer films." Journal of Materials Chemistry 20.43 (2010): 9623-9627.

Tuteja, A. et al., "Designing Superoleophobic Surfaces", Science, 318.5856 (2007):1618-1622.

Uslu, A. and Yesilot, S., "Chiral Configurations in Cyclophosphazene Chemistry", Coordination Chemistry Reviews, 291 (2015):28-67.

Usui, H. et al., "Anthracene and Polyethylene Thin Film Depositions by Ionized Cluster Beam", J. Vac. Sci. Technol., 4.1 (1986):52-60.

Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.

Usui, H., "Deposition of Polymeric Thin Films by Ionization-Assisted Method", IEICE Trans. Electron., E83-C:7 (2000):1128-1133.

Vampola, K. J. et al. "12-1: Invited Paper: Through-OLED Display Ambient Color Sensing." SID Symposium Digest of Technical Papers. 53.1 (2022).

Van de Grampel, R.D., "Surfaces of Fluorinated Polymer Systems", Doctoral Thesis, Technische Universiteit Eindhoven (2002).

Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.

Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).

Vogelsang, D.F. et al., "Separation of Asymmetrically Capped Double-Decker Silsesquioxanes Mixtures", Polyhedron, 155 (2018): 189-193.

Von R. Schleyer, P. and Nicholas, R. D., "The Reactivity of Bridgehead Compounds of Adamantane", J. Am. Chem. Soc., 83.12 (1961):2700-2707.

Vu, B.D. et al., "Simple Two-step Procedure for the Synthesis of Memantine Hydrochloride from 1,3-Dimethyl-adamantane", ACS Omega, 5.26 (2020):16085-16088.

Wang, B. et al., "Graded-Index Fluoropolymer Antireflection Coatings for Invisible Plastic Optics", Nano Lett. 19.2 (2019):787-792.

Wang, C. et al., "Stable Superhydrophobic Polybenzoxazine Surfaces over a Wide pH Range", Langmuir, 22.20 (2006):8289-8292.

Wang, J. et al. "A new fluorinated polysiloxane with good optical properties and low dielectric constant at high frequency based on easily available tetraethoxysilane (TEOS)." Macromolecules 50.23 (2017):9394-9402.

Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.

Wang, Y. et al., "Substrate Effect on the Melting Temperature of Thin Polyethylene Films", Physical Review Letters, 96.2 (2006):028303.

(56) References Cited

OTHER PUBLICATIONS

Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.

Weigel, W.K. et al., "Direct Radical Functionalization Methods to Access Substituted Adamantanes and Diamondoids", Org. Biomol. Chem., 20 (2022):10-36.

Weiss, F.M. et al., "Molecular Beam Deposition of High-Permittivity Polydimethylsiloxane for Nanometer-Thin Elastomer Films in Dielectric Actuators", Materials and Design, 105 (2016):106-113.

Winget, P. et al. "57-1: Accelerating Next-Generation Display Materials Development with a Smart Digital Chemistry Platform." SID Symposium Digest of Technical Papers 54.1 (2023).

Wojtczak, L., "The Melting Point of Thin Films", Phys. Stat. Sol., 23.2 (1967):K163-K166.

Wu, Y. et al. "P-13.5: Investigation on Chromatic Dispersion of Reflection for CFOT Display" SID Symposium Digest of Technical Papers 54 (2023).

Xie, J. et al., "Regioselective Synthesis of Methyl-Substituted Adamantanes for Promoting Oxidation Stability of High-Density Fuels", Energy Fuels, 34.4 (2020):4516-4524.

Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.

Xu, X. et al. "A Unified Spatial-Angular Structured Light for Single-View Acquisition of Shape and Reflectance" Proceedings of the IEEE/CVF Conference on Computer Vision and Pattern Recognition (2023).

Xu, Y. et al. "Depth Estimation by Combining Binocular Stereo and Monocular Structured-Light" Proceedings of the IEEE/CVF Conference on Computer Vision and Pattern Recognition (2022).

Yang, H. et al. "Catalyst-Controlled C—H Functionalization of Adamantanes Using Selective H-Atom Transfer", ACS Catal., 9.6 (2019):5708-5715.

Yang, J. et al. "25-4: Methodology and Correlation of Al-Based Design for OLED Materials." SID Symposium Digest of Technical Papers 52.1 (2021).

Yao, Y. et al. "P-7.12: Research on High Brightness Mode Uniformity Problem of Flexible AMOLED Mobile" SID Symposium Digest of Technical Papers 54 (2023).

Yao, Z. et al. "Inverse design of nanoporous crystalline reticular materials with deep generative models." Nature Machine Intelligence 3.1 (2021): 76-86.

Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.

Yoo, D. et al. "Retrosynthesis Planning for Thermally Activated Delayed Fluorescence Molecules" The 21st International Meeting on Information Display, Seoul, Korea (2021).

Youn, S. et al. "73-4: Novel Materials and Structures for High Efficiency and Long Lifetime Green Phosphorescent OLEDs in Automotive Applications." SID Symposium Digest of Technical Papers. 53.1 (2022).

Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).

Zalewski, K. et al., "A Review of Polysiloxanes in Terms of Their Application in Explosives", Polymers, 13.7 (2021):1080-1090.

Zhang, W. et al., "Polymer/polyhedral Oligomeric Silsesquioxane (POSS) Nanocomposites: An Overview of Fire Retardance", Progress in Polymer Science, 67 (2017):77-125.

Zhang, W. et al., "Why We Need to Look Beyond the Glass Transition Temperature to Characterize the Dynamics of Thin Supported Polymer Films", PNAS Latest Articles, 115.22 (2018):5641-5646.

Zhu, C. et al. "A novel synthetic UV-curable fluorinated siloxane resin for low surface energy coating." Polymers 10.9 (2018): 979.

Zibarov, A. et al., "AB5 Derivatives of Cyclotriphosphazene for the Synthesis of Dendrons and Their Applications", Molecules, 26.13 (2021):4017-4040.

\* cited by examiner

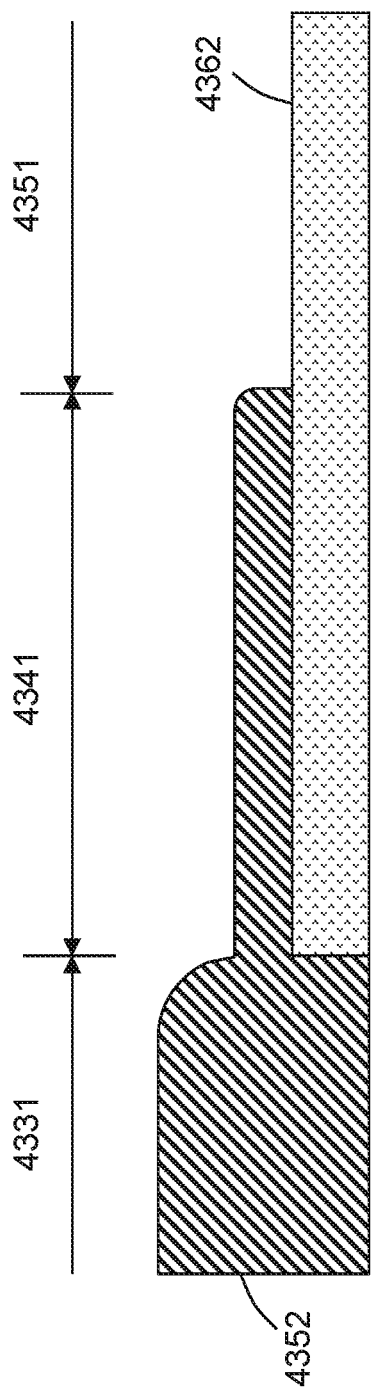
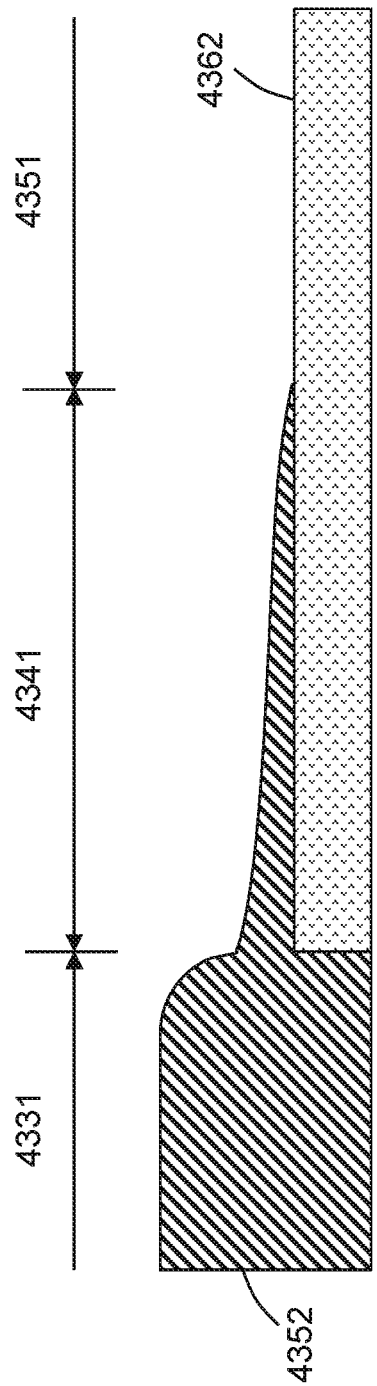
FIG. 3A
FIG. 3B

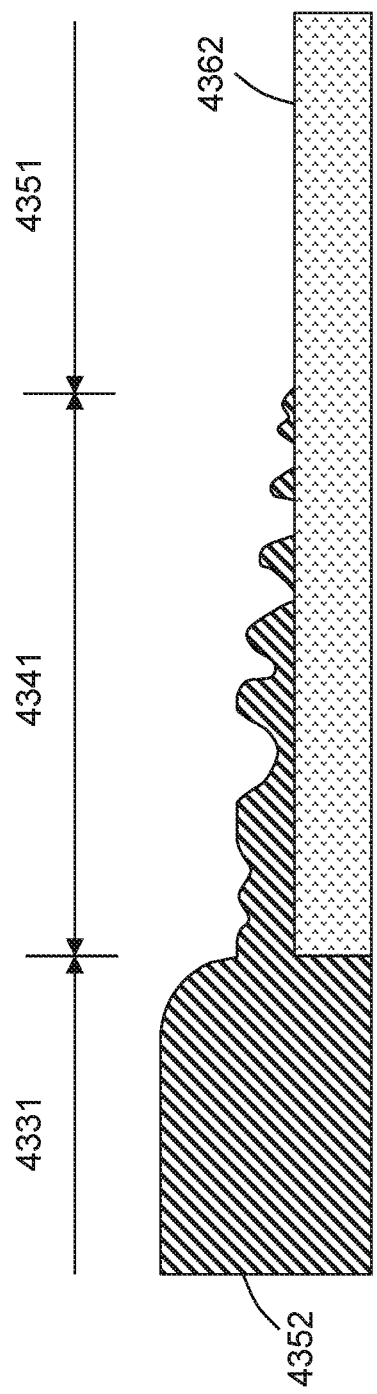
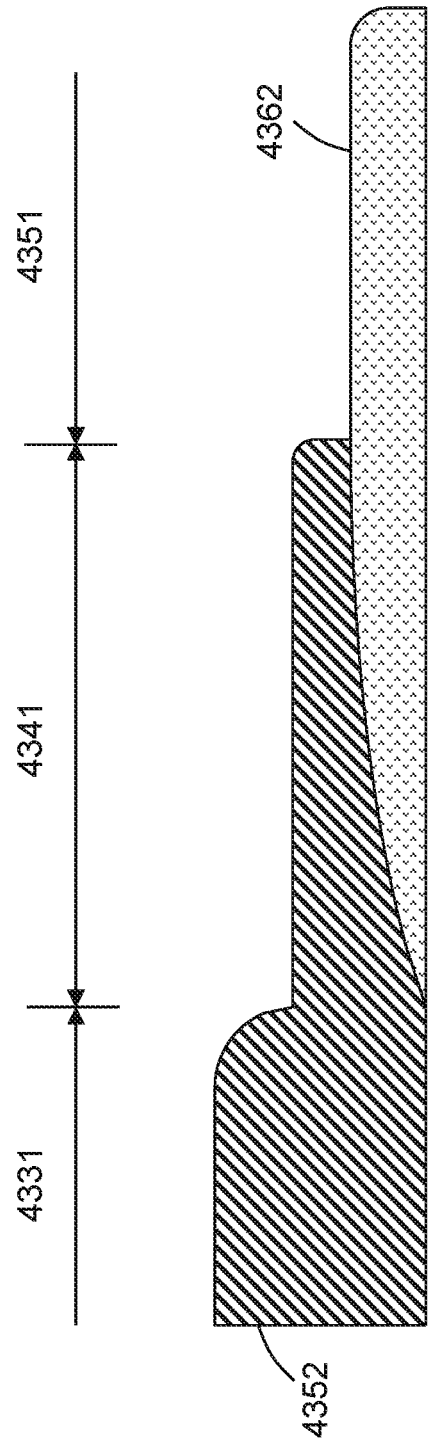

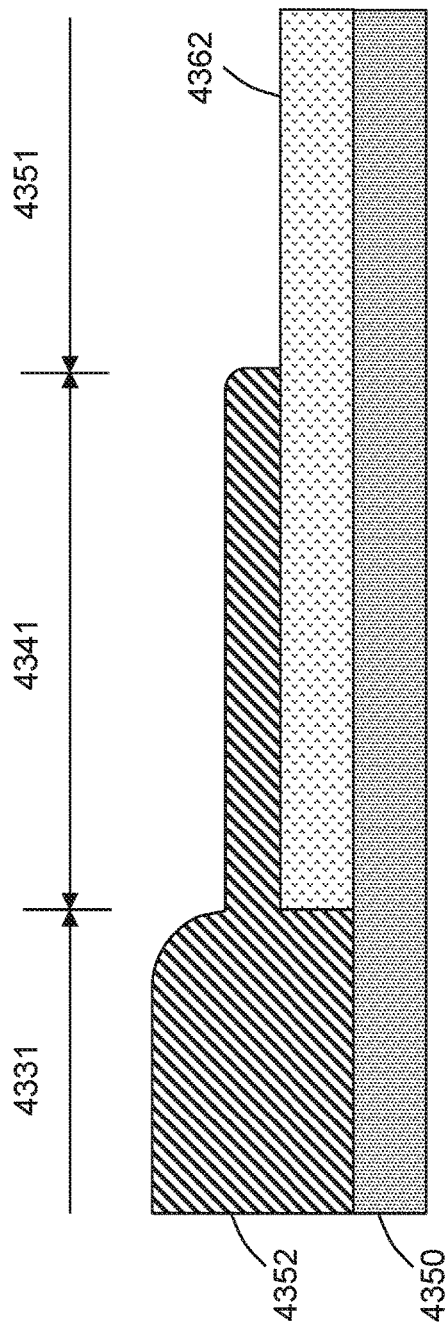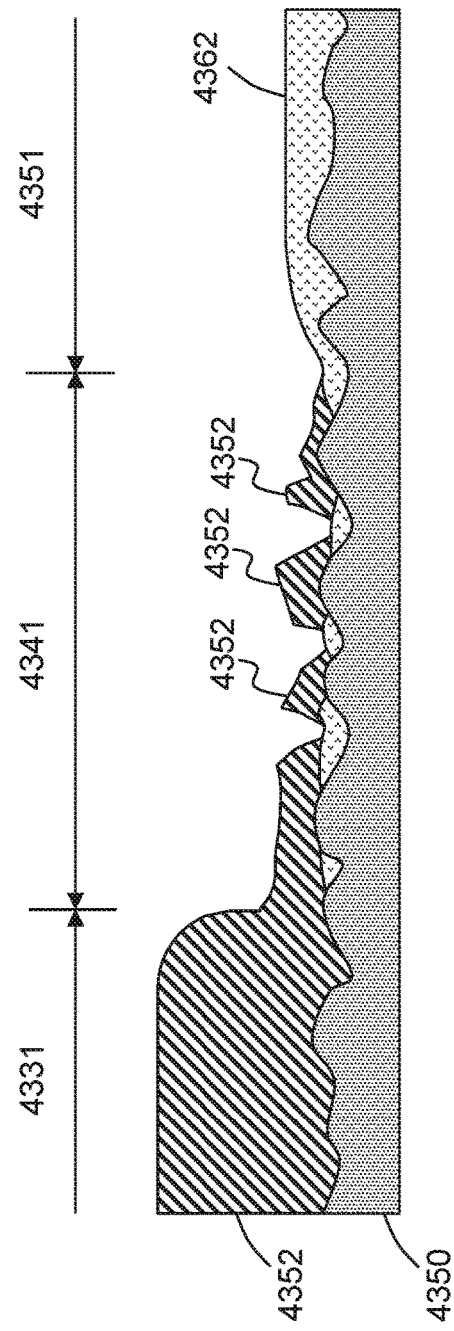

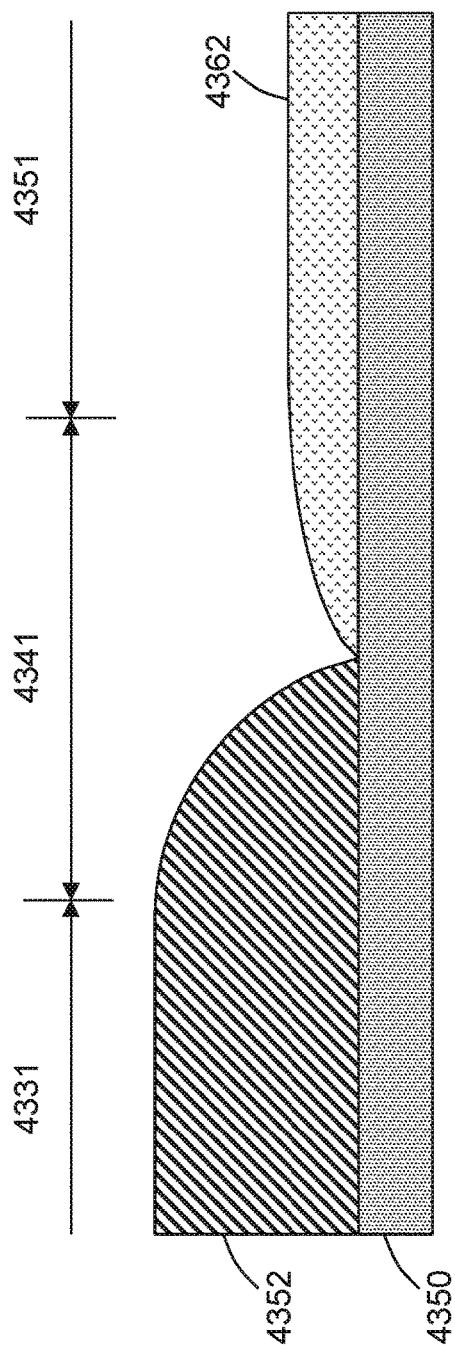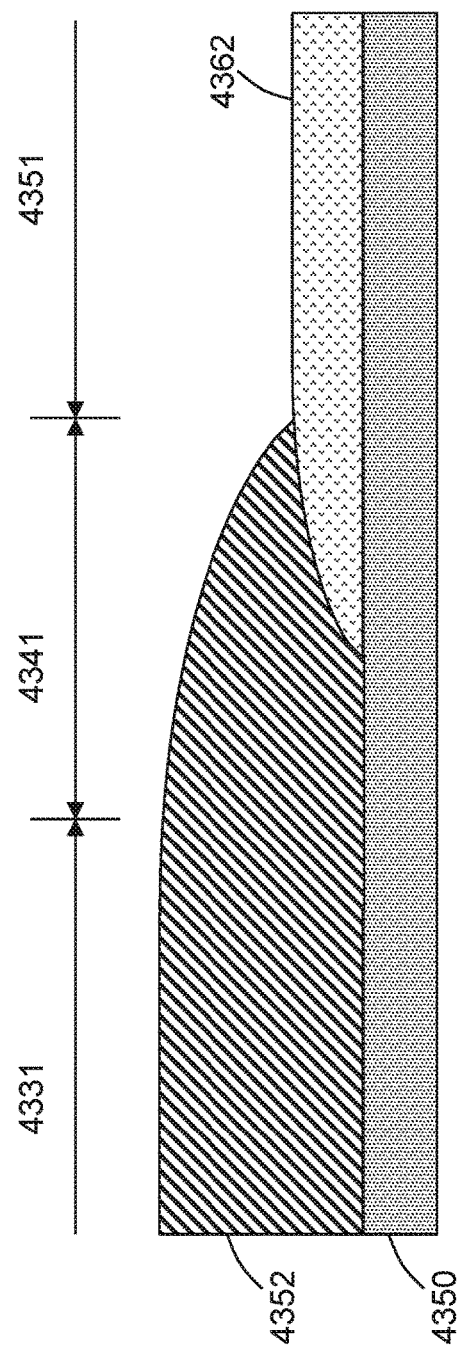

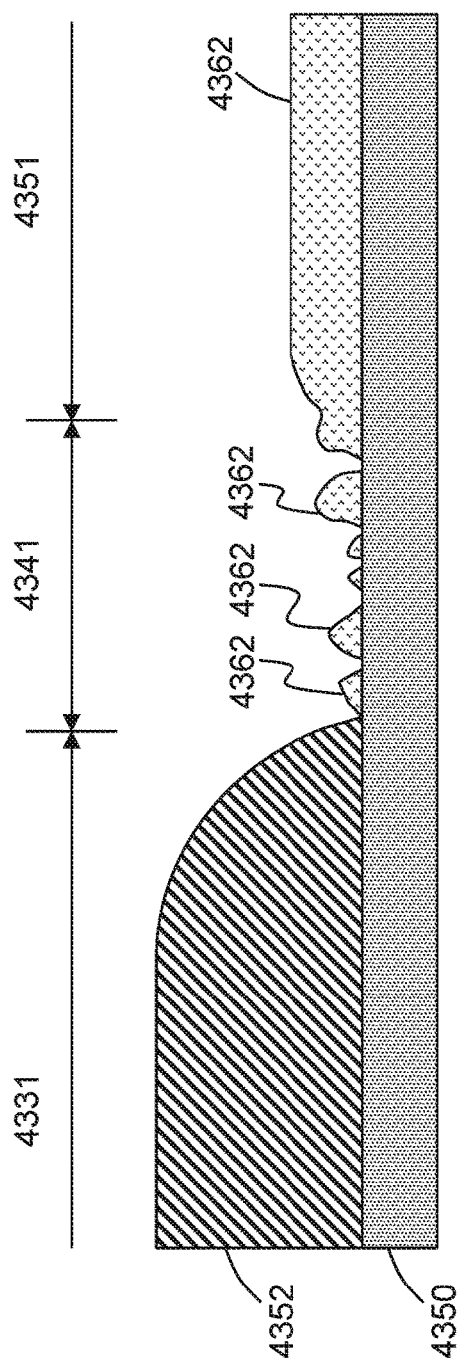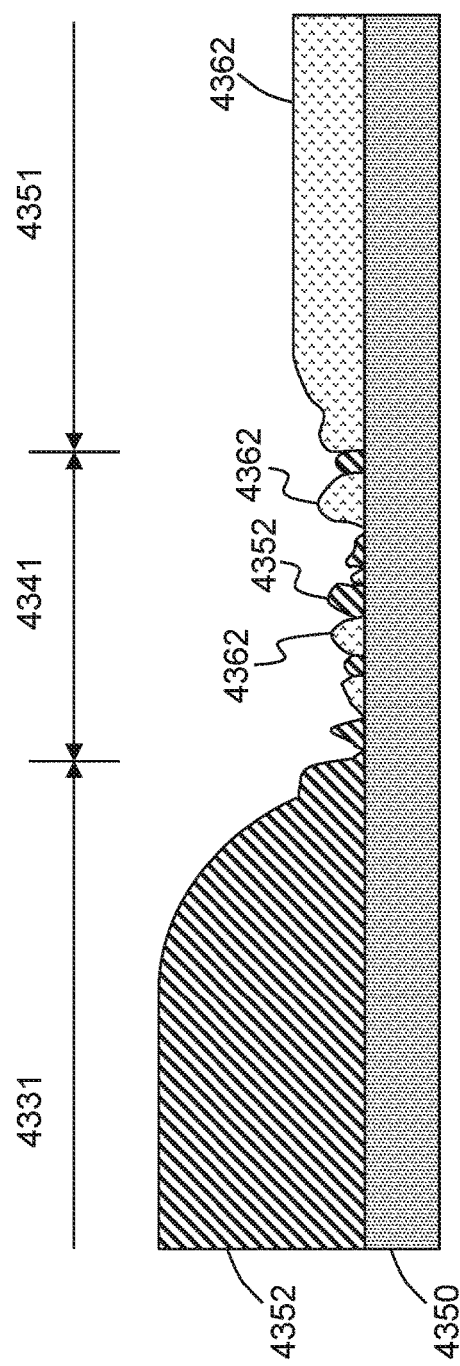

OPTOELECTRONIC DEVICE INCLUDING A LIGHT TRANSMISSIVE REGION

CROSS REFERENCE TO RELATED APPLICATIONS

This application is a U.S. National Stage Application under 35 U.S.C. § 371 of International Application No. PCT/IB2019/060092, filed Nov. 23, 2019, which claims the benefit of and priority to U.S. Provisional Application No. 62/771,015, filed Nov. 23, 2018, U.S. Provisional Application No. 62/838,892, filed Apr. 25, 2019, and U.S. Provisional Application No. 62/862,636, filed Jun. 17, 2019, the contents of which are incorporated herein by reference in their entireties.

TECHNICAL FIELD

The following generally relates to an optoelectronic device including a light transmissive region.

BACKGROUND

Organic light emitting diodes (OLEDs) typically include several layers of organic materials interposed between conductive thin film electrodes, with at least one of the organic layers being an electroluminescent layer. When a voltage is applied to electrodes, holes and electrons are injected from an anode and a cathode, respectively. The holes and electrons injected by the electrodes migrate through the organic layers to reach the electroluminescent layer. When a hole and an electron are in close proximity, they are attracted to each other due to a Coulomb force. The hole and electron may then combine to form a bound state referred to as an exciton. An exciton may decay through a radiative recombination process, in which a photon is released. Alternatively, an exciton may decay through a non-radiative recombination process, in which no photon is released. It is noted that, as used herein, internal quantum efficiency (IQE) will be understood to be a proportion of all electron-hole pairs generated in a device which decay through a radiative recombination process.

A radiative recombination process can occur as a fluorescence or phosphorescence process, depending on a spin state of an electron-hole pair (namely, an exciton). Specifically, the exciton formed by the electron-hole pair may be characterized as having a singlet or triplet spin state. Generally, radiative decay of a singlet exciton results in fluorescence, whereas radiative decay of a triplet exciton results in phosphorescence.

More recently, other light emission mechanisms for OLEDs have been proposed and investigated, including thermally activated delayed fluorescence (TADF). Briefly, TADF emission occurs through a conversion of triplet excitons into singlet excitons via a reverse inter system crossing process with the aid of thermal energy, followed by radiative decay of the singlet excitons.

An external quantum efficiency (EQE) of an OLED device may refer to a ratio of charge carriers provided to the OLED device relative to a number of photons emitted by the device. For example, an EQE of 100% indicates that one photon is emitted for each electron that is injected into the device. As will be appreciated, an EQE of a device is generally substantially lower than an IQE of the device. The difference between the EQE and the IQE can generally be attributed to a number of factors such as absorption and reflection of light caused by various components of the device.

An OLED device can typically be classified as being either a "bottom-emission" or "top-emission" device, depending on a relative direction in which light is emitted from the device. In a bottom-emission device, light generated as a result of a radiative recombination process is emitted in a direction towards a base substrate of the device, whereas, in a top-emission device, light is emitted in a direction away from the base substrate. Accordingly, an electrode that is proximal to the base substrate is generally made to be light transmissive (e.g., substantially transparent or semi-transparent) in a bottom-emission device, whereas, in a top-emission device, an electrode that is distal to the base substrate is generally made to be light transmissive in order to reduce attenuation of light. Depending on the specific device structure, either an anode or a cathode may act as a transmissive electrode in top-emission and bottom-emission devices.

An OLED device also may be a double-sided emission device, which is configured to emit light in both directions relative to a base substrate. For example, a double-sided emission device may include a transmissive anode and a transmissive cathode, such that light from each pixel is emitted in both directions. In another example, a double-sided emission display device may include a first set of pixels configured to emit light in one direction, and a second set of pixels configured to emit light in the other direction, such that a single electrode from each pixel is transmissive.

In addition to the above device configurations, a transparent or semi-transparent OLED device also can be implemented, in which the device includes a transparent portion which allows external light to be transmitted through the device. For example, in a transparent OLED display device, a transparent portion may be provided in a non-emissive region between each neighboring pixels. In another example, a transparent OLED lighting panel may be formed by providing a plurality of transparent regions between emissive regions of the panel. Transparent or semi-transparent OLED devices may be bottom-emission, top-emission, or double-sided emission devices.

While either a cathode or an anode can be selected as a transmissive electrode, a typical top-emission device includes a light transmissive cathode. Materials which are typically used to form the transmissive cathode include transparent conducting oxides (TCOs), such as indium tin oxide (ITO) and zinc oxide (ZnO), as well as thin films, such as those formed by depositing a thin layer of silver (Ag), aluminum (Al), or various metallic alloys such as magnesium silver (Mg:Ag) alloy and ytterbium silver (Yb:Ag) alloy with compositions ranging from about 1:9 to about 9:1 by volume. A multi-layered cathode including two or more layers of TCOs and/or thin metal films also can be used.

Particularly in the case of thin films, a relatively thin layer thickness of up to about a few tens of nanometers contributes to enhanced transparency and favorable optical properties for use as a top-emission electrode in OLEDs. The top-emission electrode may be a common electrode coating a plurality of pixels. For example, such common electrode may be a relatively thin conductive layer having a substantially uniform thickness across the device.

SUMMARY

According to some embodiments, an electroluminescent device includes: (1) a first region, a second region, and an intermediate region arranged between the first region and the second region; (2) a conductive coating disposed in the second region; and (3) a nucleation inhibiting coating disposed in the first region, the nucleation inhibiting coating extending to cover at least a portion of the intermediate region, wherein a thickness of the nucleation inhibiting coating in the intermediate region is less than a thickness of the nucleation inhibiting coating in the first region, and wherein a surface of the nucleation inhibiting coating in the first region is substantially free of the conductive coating.

According to some embodiments, an electroluminescent device includes: (1) a plurality of electrodes; (2) a bank disposed over the plurality of electrodes, the bank defining a plurality of first well regions and a plurality of second well regions, the plurality of second well regions exposing surfaces of the plurality of electrodes through the bank; (3) a semiconducting layer disposed in the plurality of second well regions, the semiconducting layer covering the surfaces of the plurality of electrodes; (4) a nucleation inhibiting coating disposed in the plurality of first well regions; and (5) a conductive coating disposed over the semiconducting layer in the plurality of second well regions, wherein a surface of the nucleation inhibiting coating is substantially free of the conductive coating.

According to some embodiments, an electroluminescent device includes: (1) a first portion comprising a plurality of first pixels, the plurality of first pixels being arranged in a first pixel density; and (2) a second portion comprising a plurality of second pixels, the plurality of second pixels being arranged in a second pixel density, wherein the first pixel density is less than the second pixel density.

BRIEF DESCRIPTION OF THE DRAWINGS

Some embodiments will now be described by way of example with reference to the appended drawings wherein:

FIGS. 3A to 3E are cross-sectional views of the device at or near an intermediate region according to various embodiments;

FIGS. 5A to 5F are cross-sectional views of the device at or near an intermediate region according to various embodiments wherein the device includes an interfacial coating;

DETAILED DESCRIPTION

Figure 1:
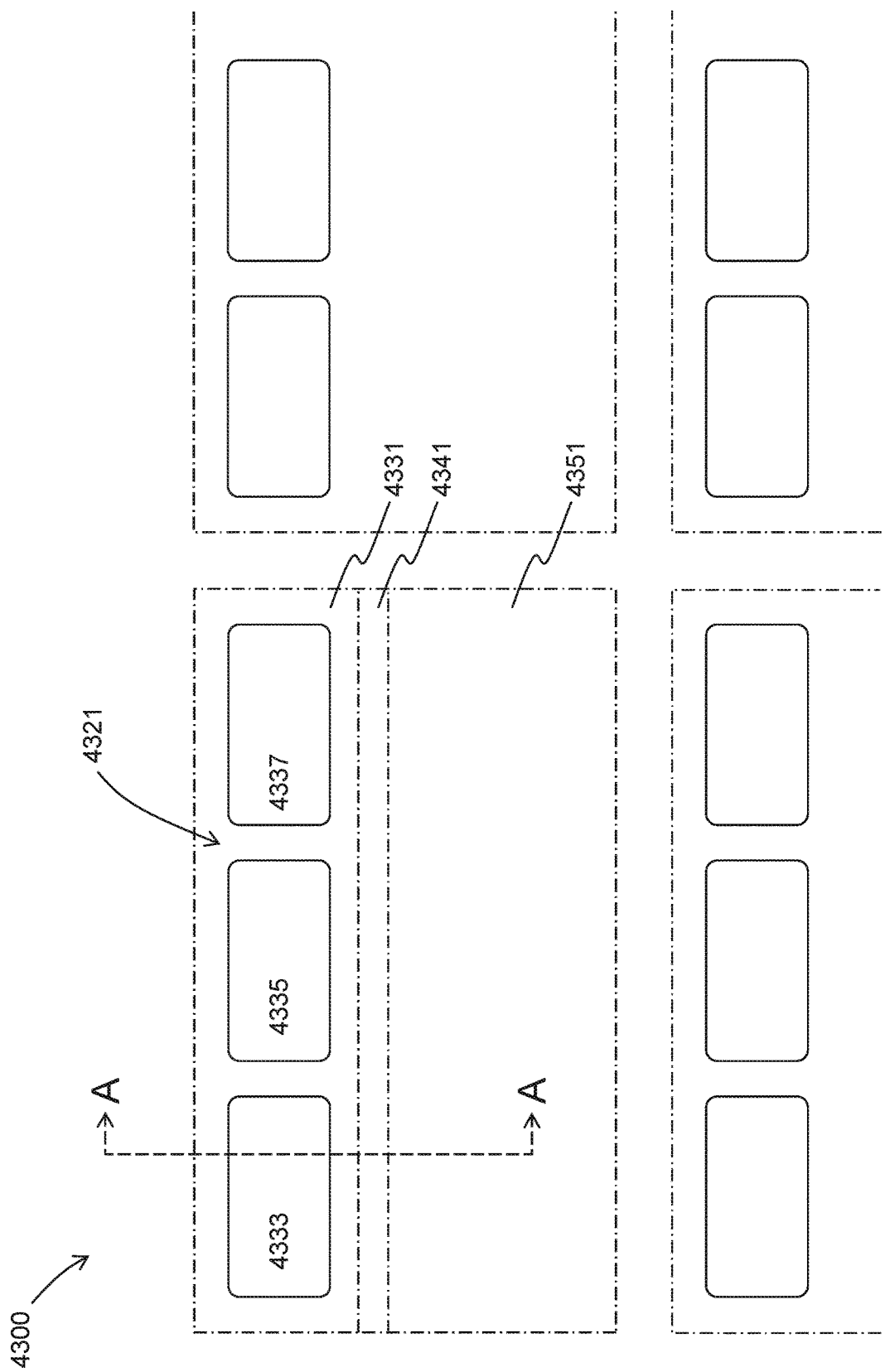
FIG. 1 is a diagram of a portion of an electroluminescent device according to one embodiment.

It will be appreciated that for simplicity and clarity of illustration, where considered appropriate, reference numerals may be repeated among the figures to indicate corresponding or analogous components. In addition, numerous specific details are set forth in order to provide a thorough understanding of example embodiments described herein. However, it will be understood by those of ordinary skill in the art that the example embodiments described herein may be practiced without some of those specific details. In other instances, certain methods, procedures and components have not been described in detail so as not to obscure the example embodiments described herein.

As used herein, the term "nucleation inhibiting" is used to refer to a coating or a layer of a material having a surface which exhibits a relatively low affinity towards deposition of an electrically conductive material, such that the deposition of the conductive material or auxiliary electrode material on the surface is inhibited, while the term "nucleation promoting" is used to refer to a coating or a layer of a material having a surface which exhibits a relatively high affinity towards deposition of an electrically conductive material, such that the deposition of the conductive material on the surface is facilitated. One measure of nucleation inhibiting or nucleation promoting property of a surface is an initial sticking probability of the surface for an electrically conductive material, such as magnesium. For example, a nucleation inhibiting coating with respect to magnesium can refer to a coating having a surface which exhibits a relatively low initial sticking probability for magnesium vapor, such that deposition of magnesium on the surface is inhibited, while a nucleation promoting coating with respect to magnesium can refer to a coating having a surface which exhibits a relatively high initial sticking probability for magnesium vapor, such that deposition of magnesium on the surface is facilitated. As used herein, the terms "sticking probability" and "sticking coefficient" may be used interchangeably. Another measure of nucleation inhibiting or nucleation promoting property of a surface is an initial deposition rate of an electrically conductive material, such as magnesium, on the surface relative to an initial deposition rate of the conductive material on another (reference) surface, where both surfaces are subjected or exposed to an evaporation flux of the conductive material.

As used herein, the terms "evaporation" and "sublimation" are interchangeably used to generally refer to deposition processes in which a source material is converted into a vapor (e.g., by heating) to be deposited onto a target surface in, for example, a solid state.

As used herein, a surface (or a certain area of the surface) which is "substantially free of" or "is substantially uncovered by" a material refers to a substantial absence of the material on the surface (or the certain area of the surface). One measure of an amount of a material on a surface is a percentage coverage of the surface by the material, such as where the surface can be deemed to be substantially free of the material if the percentage coverage by the material is no greater than about 10%, no greater than about 8%, no greater than about 5%, no greater than about 3%, or no greater than about 1%. Surface coverage can be assessed using imaging techniques, such as using transmission electron microscopy (TEM), atomic force microscopy (AFM), or scanning electron microscopy (SEM). Such imaging techniques may also be combined with other analytical techniques such as energy-dispersive x-ray spectroscopy (EDX).

In one aspect, an optoelectronic device is provided. In some embodiments, the optoelectronic device is an electroluminescent device. The electroluminescent device includes a first region, a second region, and an intermediate region arranged between the first region and the second region. A nucleation inhibiting coating is disposed in the first region, and a conductive coating is disposed in the second region.

In some embodiments, the nucleation inhibiting coating is also disposed in the intermediate region. In some further embodiments, the thickness of the nucleation inhibiting coating in the intermediate region is less than the thickness of the nucleation inhibiting coating in the first region. For example, the thickness of the nucleation inhibiting coating in the intermediate region may be less than or equal to about 60% of the thickness of the nucleation inhibiting coating in the first region, less than or equal to about 50% of the thickness of the nucleation inhibiting coating in the first region, less than or equal to about 40% of the thickness of the nucleation inhibiting coating in the first region, less than or equal to about 30% of the thickness of the nucleation inhibiting coating in the first region, less than or equal to about 25% of the thickness of the nucleation inhibiting coating in the first region, less than or equal to about 20% of the thickness of the nucleation inhibiting coating in the first region, less than or equal to about 15% of the thickness of the nucleation inhibiting coating in the first region, or less than or equal to about 10% of the thickness of the nucleation inhibiting coating in the first region.

The surface of the nucleation inhibiting coating in the first region is substantially free of the conductive coating. In some embodiments, the nucleation inhibiting coating in the first region is formed continuously or integrally with the nucleation inhibiting coating in the intermediate region.

In some embodiments, the first region includes a light transmissive region. In some embodiments, the light transmittance in the light transmissive region is greater than about 50%. For example, the light transmittance in the visible wavelength range of the electromagnetic spectrum (e.g., in the wavelength range of from about 390 nm to about 700 nm) may be greater than about 50%, greater than about 60%, greater than about 75%, greater than about 80%, or greater than about 90%. In another example, the light transmittance of the light transmissive region in the non-visible wavelength range (e.g., infrared or near infrared wavelength such as from about 700 nm to about 1500 nm) may be greater than about 50%, greater than about 60%, greater than about 75%, greater than about 80%, greater than about 90%, or greater than about 95%.

In some embodiments, the second region includes an emissive region. Generally, the emissive region is configured to emit light. For example, the emissive region may correspond to a pixel or a subpixel of the device.

In some embodiments, the conductive coating is disposed in the second region and in the intermediate region. In some further embodiments, the conductive coating has a first thickness in the intermediate region, and a second thickness in the second region. In some further embodiments, the second thickness is greater than the first thickness. In some further embodiments, the conductive coating is disposed over the nucleation inhibiting coating in the intermediate region. For example, the second thickness may be from about 5 nm to about 50 nm, from about 5 nm to about 40 nm, from about 10 nm to about 35 nm, from about 12 nm to about 30 nm, from about 15 nm to about 30 nm, or from about 18 nm to about 25 nm. For example, the first thickness may be less than or equal to about 60% of the second thickness, less than or equal to about 50% of the second thickness, less than or equal to about 40% of the second thickness, less than or equal to about 30% of the second thickness, less than or equal to about 25% of the second thickness, less than or equal to about 20% of the second thickness, less than or equal to about 15% of the second thickness, or less than or equal to about 10% of the second thickness. For example, the first thickness may be from about 1% to about 60% of the second thickness, from about 11% to about 50% of the second thickness, from about 1% to about 40% of the second thickness, from about 1% to about 30% of the second thickness, or from about 1% to about 10% of the thickness.

In some embodiments, the intermediate region is arranged at a boundary between the first region and the second region. For example, the intermediate region may laterally form a perimeter of the second region towards a neighboring first region. For example, the intermediate region may extend laterally from about 100 nm to about 4 µm, from about 200 nm to about 3 µm, from about 200 nm to about 2 µm, or from about 300 nm and about 3 µm from the perimeter of the second region. In some embodiments, the intermediate region extends laterally from the perimeter a distance of from about 10 times to about 250 times, from about 12 times to about 200 times, from about 15 times to about 180 times, or from about 20 times to about 150 times the thickness of the conductive coating in the second region.

In some embodiments, a surface coverage of the conductive coating in the intermediate region is less than a surface coverage of the conductive coating in the second region. For example, the surface coverage of the conductive coating in the intermediate region may be from about 5% to about 95%, from about 10% to about 95%, from about 30% to about 95%, or from about 50% to about 95%. In some embodiments, the surface coverage of the conductive coating in the intermediate region is less than 100%. In some embodiments, the conductive coating in the intermediate region is formed continuously or integrally with the conductive coating in the second region.

In some embodiments, the density of the conductive coating in the intermediate region is less than the density of the conductive coating in the second region. For example, without wishing to be bound by any particular theory, it is postulated that the conductive coating deposited in the intermediate region may have a different film morphology than the conductive coating deposited in the second region. Accordingly, the density of the conductive coating deposited in the intermediate region may differ from that deposited in the second region.

In some embodiments, the conductive coating in the intermediate region includes disconnected clusters.

In some embodiments, the average grain size of the conductive coating in the intermediate region is less than the average grain size of the conductive coating in the second region. For example, the average grain size of the conductive coating in the intermediate region may be from about 10 nm to about 60 nm, from about 10 nm to about 50 nm, or from about 15 nm to about 45 nm. In some examples, the average grain size of the conductive coating in the second region is greater than about 30 nm, greater than about 40 nm, greater than about 50 nm, greater than about 60 nm, greater than about 65 nm, or greater than about 70 nm. For example, the average grain size of the conductive coating in the intermediate region may be less than about 20 nm, and the average grain size of the conductive coating in the second region may be greater than about 30 nm.

In some embodiments, the electroluminescent device further includes an interfacial coating disposed beneath, and in direct contact with, the conductive coating in the second region. In some further embodiments, the interfacial coating extends laterally to be arranged beneath the conductive coating in the intermediate region. In some further embodiments, the interfacial coating is in direct contact with the conductive coating in the intermediate region. In some embodiments, the interfacial coating is also disposed in the first region. For example, the interfacial coating may be arranged beneath the nucleation inhibiting coating in the first region. In some further examples, the interfacial coating is in direct physical contact with the nucleation inhibiting coating in the first region. In some embodiments, the presence of the interfacial coating is substantially omitted from the first region.

In some embodiments, the interfacial coating includes a nucleation promoting material. For example, the interfacial coating may include a fullerene, a metal including Ag, Yb, and Mg, and combinations thereof. In some embodiments, the presence of Ag and Mg are omitted from the interfacial coating. In some embodiments, the interfacial coating includes a material selected from the following: alkali metals, alkaline earth metals, fluorides of alkali or alkaline earth metals, oxides of alkaline earth metals, rare earth elements, fluorides of rare earth elements, oxides of rare earth elements, fullerene, and mixtures of two or more of the foregoing. In some embodiments, the interfacial coating includes materials which are used to form an electron injection layer. In some embodiments, two or more materials may be mixed to form the interfacial coating. Generally, the interfacial coating is a nucleation promoting coating.

In some embodiments, the conductive coating has a first light transmittance in the intermediate region, and a second light transmittance in the second region. In some embodiments, the first light transmittance is greater than the second light transmittance.

In some embodiments, the conductive coating has a first light reflectance in the intermediate region, and a second light reflectance in the second region. In some embodiments, the second light reflectance is greater than the first light reflectance.

In some embodiments, the conductive coating forms at least a portion of an electrode of the electroluminescent device. For example, the conductive coating may form a cathode or a portion thereof.

In some embodiments, the conductive coating includes magnesium. In some embodiments, the conductive coating includes high vapor pressure materials, such as ytterbium (Yb), cadmium (Cd), zinc (Zn), and combinations thereof.

In some embodiments, the nucleation inhibiting coating extends laterally to be disposed beneath the conductive coating in the intermediate region. In some further embodiments, the nucleation inhibiting coating is arranged beneath the interfacial coating in the intermediate region. Accordingly, in such embodiments, the intermediate region comprises the interfacial coating disposed over the nucleation inhibiting coating, and the conductive coating disposed over the interfacial coating. In some further embodiments, the conductive coating is in direct physical contact with the interfacial coating (e.g., contact without the presence of any intervening layers or coatings).

In some embodiments, the nucleation inhibiting coating is characterized as having an initial sticking probability for a material of the conductive coating of no greater than about 0.3, no greater than about 0.2, no greater than about 0.1, no greater than about 0.08, no greater than about 0.05, no greater than about 0.03, no greater than about 0.02, no greater than about 0.01, no greater than about 0.008, no greater than about 0.005, no greater than about 0.003, or no greater than about 0.001.

FIG. 1 illustrates a portion of an electroluminescent device 4300 according to one embodiment. The device includes a plurality of pixel areas 4321. Each pixel area 4321 includes an emissive region or a subpixel region 4331, which further includes a plurality of subpixels 4333, 4335, 4337, and a light transmissive region 4351. For example, the subpixel 4333 may correspond to a red subpixel, the subpixel 4335 may correspond to a green subpixel, and the subpixel 4337 may correspond to a blue subpixel. As will be explained, the light transmissive region 4351 is substantially transmissive to allow light to pass through the device 4300. Each pixel area also includes an intermediate region 4341 arranged between the subpixel region 4331 and the light transmissive region 4351.

Figure 2:
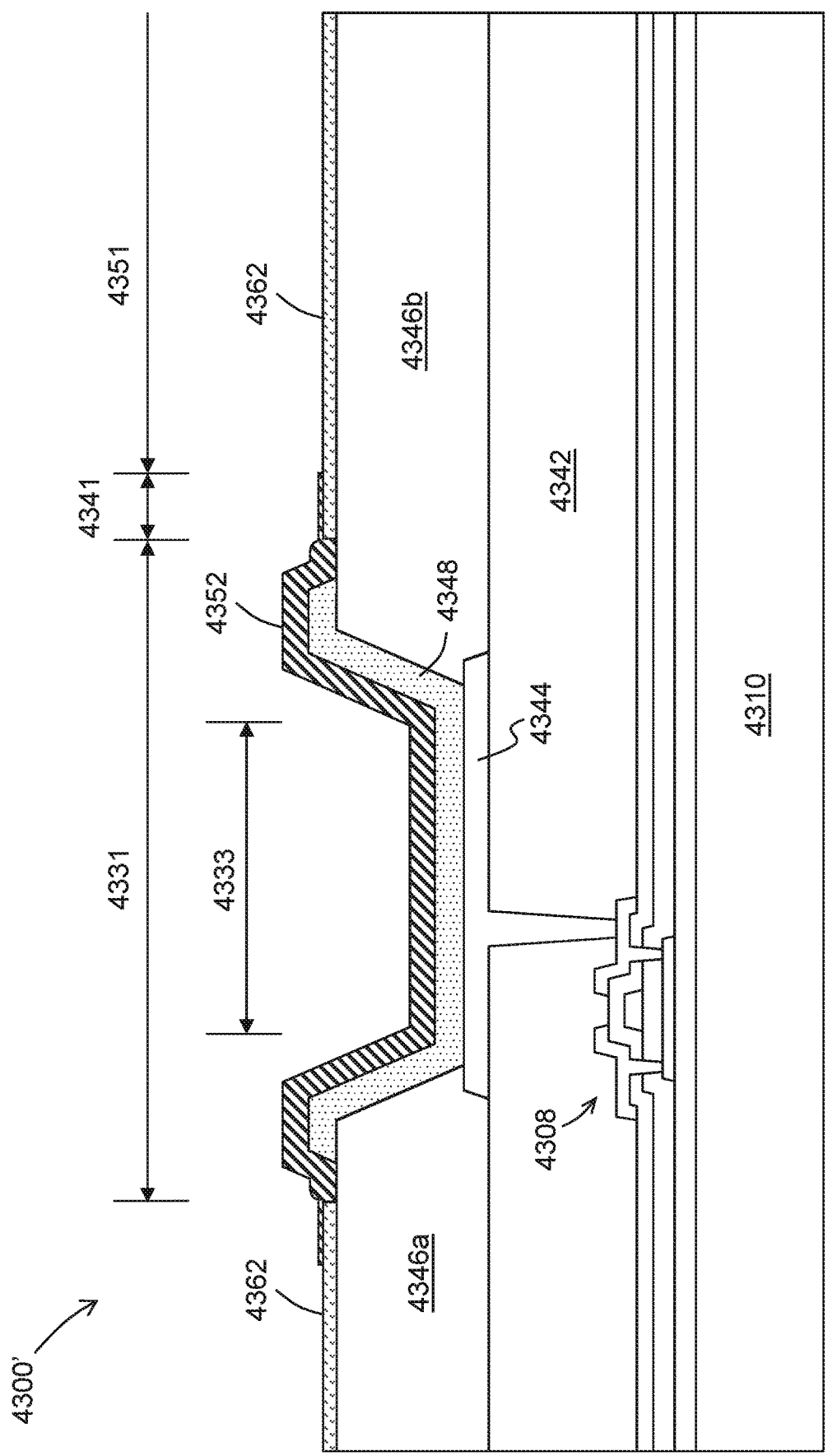
FIG. 2 is a cross-sectional view of the device of FIG. 1 taken along line A-A according to one embodiment.

FIG. 2 illustrates a cross-sectional view of the device 4300 taken along line A-A according to one embodiment. The device 4300 includes a base substrate 4310, a thin-film transistor (TFT) 4308, an insulating layer 4342, and a first electrode 4344 formed on the insulating layer 4342 and in electrical communication with the TFT 4308. In the present embodiment, the first electrode 4344 may also be referred to as the anode. A first pixel definition layer (PDL) 4346a and a second PDL 4346b are formed over the insulating layer 4342 and cover the edges of the anode 4344. A semiconducting layer 4348 is deposited to cover an exposed region of the anode 4344 and portions of the PDLs 4346a, 4346b. Next, a nucleation inhibiting coating 4362 is deposited to cover portions of the device 4300 corresponding to the light transmissive region 4351.

The entire device surface is then exposed to a vapor flux of a material for forming the conductive coating 4352. The material used to form the conductive coating 4352 generally exhibits a relatively poor affinity (e.g., low initial sticking probability) towards being deposited onto the surface of the nucleation inhibiting coating 4362. Accordingly, selective deposition is achieved to result in the conductive coating 4352 being selectively deposited in an uncoated region of the device 4300'. Specifically, the conductive coating 4352 is disposed over a portion of the device 4300' corresponding to the subpixel region 4331, which is substantially exposed from, or is uncovered by, the nucleation inhibiting coating 4362. In this way, the conductive coating 4352 may form a second electrode (e.g., a cathode) of the device 4300'.

FIGS. 3A to 3E illustrate detailed views of the intermediate region 4341 according to various embodiments. In the illustrated embodiments, the thickness of the conductive coating 4352 in the intermediate region 4341 is generally less than the thickness of the conductive coating 4352 in the subpixel region 4331. It is postulated that the presence of the nucleation inhibiting coating 4362 in the intermediate region 4341 may reduce the rate at which the material for forming the conductive coating 4352 is deposited in the intermediate region 4341 in comparison to the subpixel region 4331. In this way, a difference may arise in the thickness of the conductive coating 4352 in the intermediate region 4341 and the subpixel region 4331.

In the embodiment of FIG. 3A, the conductive coating 4352 in the intermediate region 4341 is illustrated as having a substantially uniform thickness in such region. For example, the thickness of the conductive coating 4351 disposed in the intermediate region 4341 may not substantially vary in such embodiment.

In the embodiment of FIG. 3B, the thickness of the conductive coating 4352 in the intermediate region 4341 is thicker in a portion proximal to the subpixel region 4331 than in a portion distal to the subpixel region 4331. In other words, the thickness of the conductive coating 4352 in the intermediate region 4341 may be non-uniform, such that a portion proximal to the subpixel region 4331 may have a greater thickness than another portion proximal to the light transmissive region 4351. For example, the thickness profile of the conductive coating 4352 in the intermediate region 4341 may be tapered in a direction towards the light transmissive region 4351.

In the embodiment of FIG. 3C, the conductive coating 4352 in the intermediate region 4341 is discontinuously formed. For example, the conductive coating 4352 may form as islands or disconnected clusters on a portion of the nucleation inhibiting coating 4362 in the intermediate region 4341. For example, such islands or disconnected clusters may include features which are physically separated from one another, such that the islands or clusters are not formed as a continuous layer.

In the embodiment of FIG. 3D, the thickness of the nucleation inhibiting coating 4362 is illustrated as being non-uniform in the intermediate region 4341. For example, the thickness of the nucleation inhibiting coating 4362 in a portion distal to the light transmissive region 4351 may be less than in another portion proximal to the light transmissive region 4351. For example, the thickness profile of the nucleation inhibiting coating 4362 may be tapered in a direction towards the subpixel region 4331 such that the thickness of the nucleation inhibiting coating 4362 is decreased towards the subpixel region 4331. Also, the thickness profile of the conductive coating 4352 in the intermediate region 4341 may be tapered in a direction towards the light transmissive region 4351.

Figure 3E:
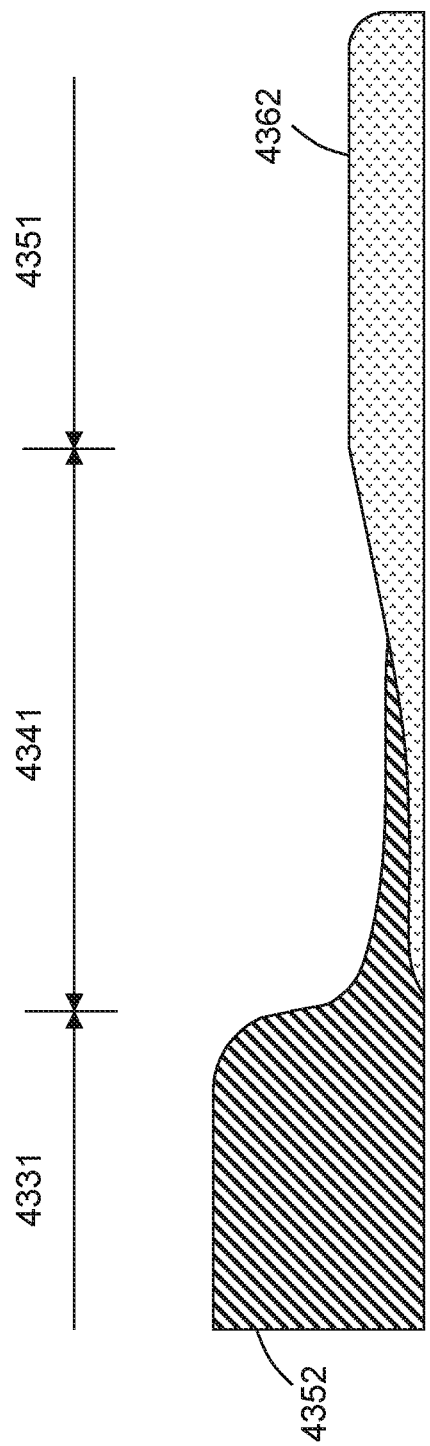

In the embodiment of FIG. 3E, both the nucleation inhibiting coating 4362 and the conductive coating 4352 are illustrated as extending into the intermediate region 4341. Specifically, the thickness of the nucleation inhibiting coating 4362 in the intermediate region 4341 is less than the thickness of the nucleation inhibiting coating 4362 in the light transmissive region 4351, and the thickness of the conductive coating 4352 in the intermediate region 4341 is less than the thickness of the conductive coating 4352 in the subpixel region 4331. In the intermediate region 4341, at least a portion of the surface of the nucleation inhibiting coating 4362 is covered by the conductive coating 4352. For example, without wishing to be bound by any particular theory, it is postulated that below a threshold thickness of the nucleation inhibiting coating 4362, the conductive coating 4352 may be deposited on the surface of the nucleation inhibiting coating 4362 in at least some conditions. However, the deposition of the conductive coating 4362 may nevertheless be inhibited to some extent over such portion of the nucleation inhibiting coating 4362, resulting in the deposition of a relatively thin conductive coating 4362. For example, such threshold thickness may be from about 0.1 angstroms to about 2 nm, from about 0.1 angstroms to about 1.5 nm, from about 0.1 angstroms to about 1 nm, from about 0.3 angstroms to about 1 nm, or from about 0.5 angstroms to about 1 nm. In some embodiments, the thickness of the nucleation inhibiting coating 4362 in at least a portion of the intermediate region 4341 is at or below the threshold thickness. The conductive coating 4352 may be deposited over such portion of the nucleation inhibiting coating 4362. In some embodiments, the thickness of the conductive coating 4352 deposited over the nucleation inhibiting coating 4362 in the intermediate region 4341 is less than the thickness of the conductive coating 4352 in the subpixel region 4331.

Figure 4:
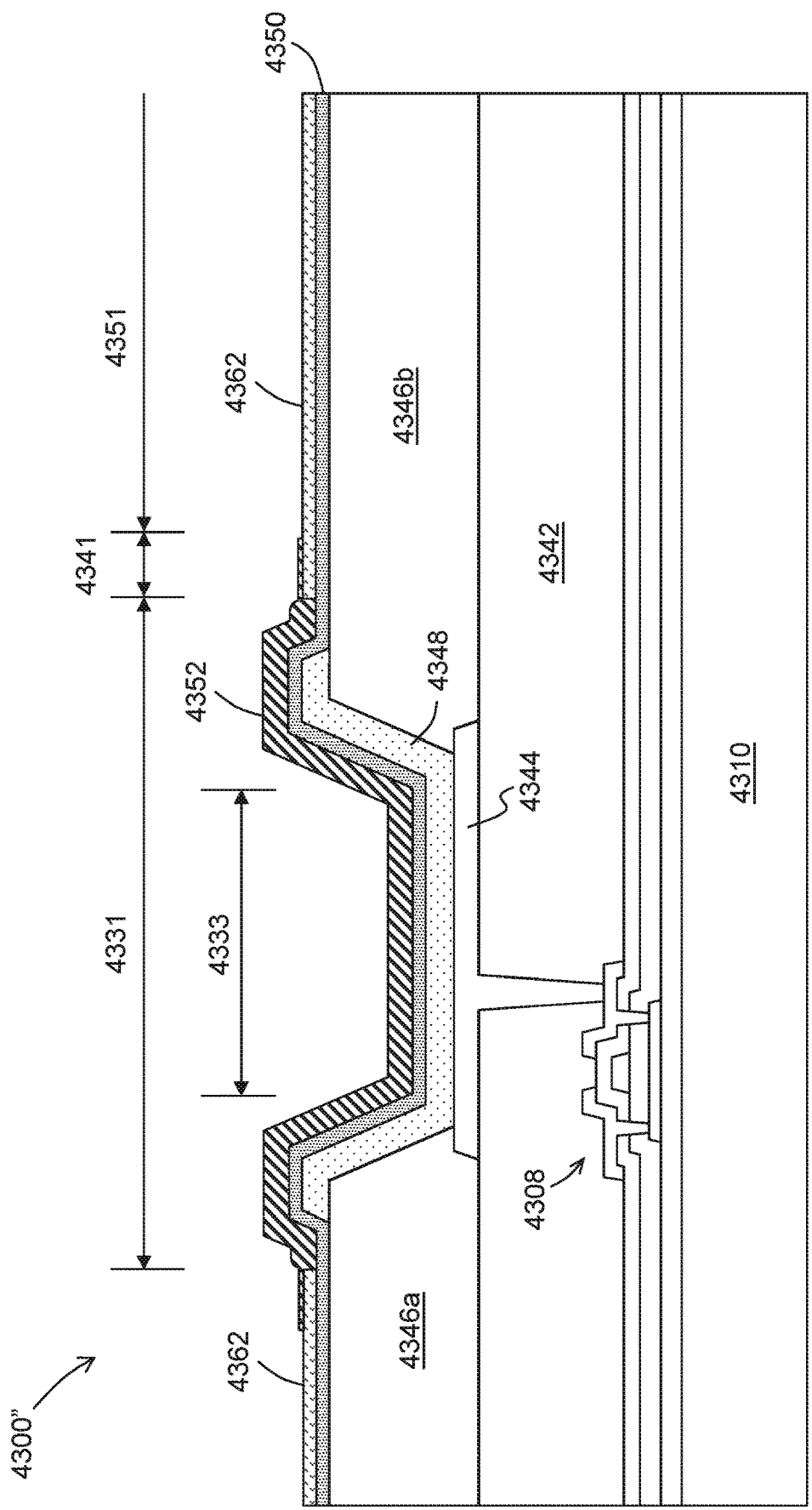
FIG. 4 is a cross-sectional view of the device of FIG. 1 taken along line A-A according to another embodiment.

FIG. 4 illustrates a cross-sectional view of the device 4300" taken along line A-A according to another embodiment, wherein an interfacial coating 4350 is provided. In the illustrated embodiment, the interfacial coating 4350 is deposited after depositing the semiconducting layer 4348, and before depositing the nucleation inhibiting coating 4362 and the conductive coating 4352. In the illustrated embodiment, the interfacial coating 4350 is disposed over the subpixel region 4331, the intermediate region 4341, and the light transmissive region 4351. In such embodiment, the interfacial coating 4350 may be substantially transparent or light transmissive. For example, the thickness of the interfacial coating 4350 may be relatively thin such that the presence of the interfacial coating 4350 does not substantially attenuate transmission of light through the light transmissive region 4351. The interfacial coating 4350 may, for example, be deposited using an open mask or mask-free deposition process. For example, the interfacial coating 4350 may be less than or equal to about 10 nm thick, less than or equal to about 7 nm thick, less than or equal to about 5 nm thick, less than or equal to about 3 nm thick, or less than or equal to about 1 nm thick. For example, the interfacial coating 4350 may be from about 0.1 nm to about 10 nm thick, from about 1 nm to about 8 nm thick, or from about 2 nm to about 5 nm thick. In some embodiments, the interfacial coating 4350 may be configured to facilitate charge injection. In some embodiments, the interfacial coating 4350 includes a nucleation promoting material. In some embodiments, the interfacial coating 4350 may include an electrically conductive material. For example, the interfacial coating 4350 and the conductive coating 4352 may together form an electrode of the device 4300".

FIGS. 5A to 5F illustrate detailed views of the intermediate region 4341 according to various embodiments wherein the interfacial coating 4350 is provided.

FIG. 5A illustrates an embodiment wherein the conductive coating 4352 is deposited in the subpixel region 4331, the nucleation inhibiting coating 4362 is deposited in the light transmissive region 4351, and both the nucleation inhibiting coating 4362 and the conductive coating 4352 extend into the intermediate region 4341. In the embodiment of FIG. 5A, both the nucleation inhibiting coating 4362 and the conductive coating 4352 have substantially uniform thicknesses in the intermediate region 4341. In other words, the thickness of each coating may not substantially vary within the intermediate region 4341. Particularly in the intermediate region 4341, the nucleation inhibiting coating 4362 is disposed over the interfacial coating 4350, and the conductive coating 4331 is disposed over the nucleation inhibiting coating 4362. The interfacial coating 4350 is also disposed in the subpixel region 4331 and the light transmissive region 4351.

FIG. 5B illustrates another embodiment wherein the conductive coating 4352 is provided as a discontinuous coating in the intermediate region 4341. For example, in the embodiment of FIG. 5B, the interfacial coating 4350, the nucleation inhibiting coating 4362, and the conductive coating 4352 are illustrated as having non-uniform thicknesses. As a result, the intermediate region 4341 includes portions in which the surface of the interfacial coating 4350 is exposed from, or substantially uncovered by, the nucleation inhibiting coating 4362. The intermediate region 4341 further includes portions in which the surface of the interfacial coating 4350 is covered by the nucleation inhibiting coating 4362. Without wishing to be bound by any particular theory, it is postulated that providing portions which are uncovered by the nucleation inhibiting coating 4362 may cause the conductive coating 4352 to form as islands or disconnected clusters in the intermediate region 4341. For example, such islands or disconnected clusters may include features which are physically separated from one another, such that the islands or clusters are not formed as a continuous layer.

FIG. 5C illustrates yet another embodiment wherein the thicknesses of both the conductive coating 4352 and the nucleation inhibiting coating 4362 are reduced in the intermediate region 4341 compared to their respective thicknesses in the subpixel region 4331 and the light transmissive region 4351, respectively. In the embodiment of FIG. 5C, the conductive coating 4352 is illustrated as having a tapered thickness profile in the intermediate region 4341 in a direction towards the light transmissive region 4351, wherein the coating thickness is gradually reduced from the subpixel region 4331 towards the light transmissive region 4351. Similarly, the nucleation inhibiting coating 4362 is illustrated as having a tapered thickness profile in the intermediate region 4341 in a direction towards the subpixel region 4331, wherein the coating thickness is gradually reduced from the light transmissive region 4351 towards the subpixel region 4331.

FIG. 5D illustrates yet another embodiment wherein the conductive coating 4352 and the nucleation inhibiting coating 4362 are arranged in an overlapping manner in the intermediate region 4341, and wherein the thicknesses of both the conductive coating 4352 and the nucleation inhibiting coating 4362 are reduced in the intermediate region 4341 compared to their respective thicknesses in the subpixel region 4331 and the light transmissive region 4351, respectively. In the embodiment of FIG. 5D, the conductive coating 4352 is disposed over the nucleation inhibiting coating 4352 in the intermediate region 4341 such that the surface of the nucleation inhibiting coating 4352 is covered by the conductive coating 4352.

FIG. 5E illustrates yet another embodiment wherein the nucleation inhibiting coating 4362 is provided as a discontinuous coating in the intermediate region 4341. For example, the nucleation inhibiting coating 4362 may be formed as islands or disconnected clusters in the intermediate region 4341. For example, such islands or disconnected clusters may include features which are physically separated from one another, such that the nucleation inhibiting coating 4362 includes a portion which is not formed as a continuous layer. In some examples, the nucleation inhibiting coating 4362 does not fully cover the surface of the interfacial coating 4350 in the intermediate region 4341. For example, the nucleation inhibiting coating 4362 may include apertures or portions containing islands or disconnected clusters in the intermediate region 4341, such that a portion of the surface of the interfacial coating 4350 is exposed from or uncovered by the nucleation inhibiting coating 4362. In the illustrated embodiment, the intermediate region 4341 is substantially free from or omits the presence of the conductive coating 4352.

FIG. 5F illustrates yet another embodiment, wherein portions of the interfacial coating 4350 is exposed from or uncovered by the nucleation inhibiting coating 4362 in the intermediate region 4341, and such portions are covered by the conductive coating 4352. For example, the nucleation inhibiting coating 4362 may include apertures or portions containing islands or disconnected clusters in the intermediate region 4341, such that a portion of the surface of the interfacial coating 4350 is exposed from or uncovered by the nucleation inhibiting coating 4362. Such portions of the intermediate region 4341 may be covered by the conductive coating 4352, since the deposition of the conductive coating 4352 is not inhibited by the presence of the nucleation inhibiting coating 4362. In this way, the surface of the interfacial layer 4350 is substantially covered by the combination of the nucleation inhibiting coating 4362 and the conductive coating 4352 in the intermediate region 4341.

Figure 6:
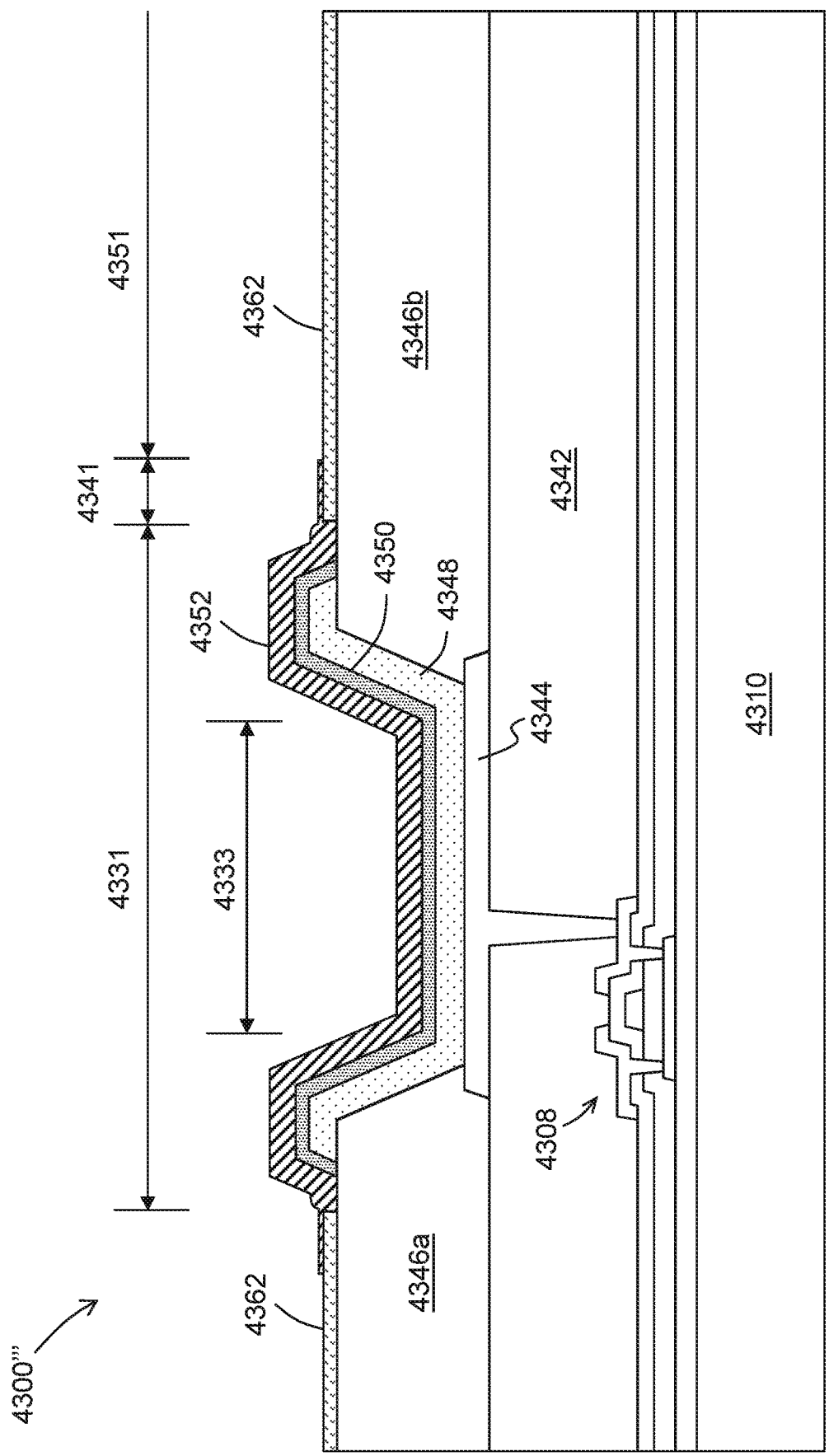
FIG. 6 is a cross-sectional view of the device of FIG. 1 taken along line A-A according to yet another embodiment.

FIG. 6 illustrates a cross-sectional view of the device 4300''' taken along line A-A of FIG. 1 according to yet another embodiment, wherein an interfacial coating 4350 is selectively provided in the subpixel region 4331. Accordingly, the intermediate region 4341 and the light transmissive region 4351 are substantially free of the interfacial coating 4350. In some embodiments, it may be advantageous to omit the presence of the interfacial coating 4350 from the light transmissive region 4351 to enhance the transparency in such region. In other embodiments, the interfacial coating 4350 may be provided in the subpixel region 4331 and the intermediate region 4341, but omitted from the light transmissive region 4351.

In some embodiments, an auxiliary electrode may also be provided in a non-emissive region of the device 4300. The auxiliary electrode may be electrically connected to the conductive coating 4352. For example, such auxiliary electrode may be provided in the regions between neighboring pixels 4321 such that it does not substantially affect the light transmittance in the subpixel regions 4331 or the light transmissive regions 4351. The auxiliary electrode may also be provided in the region between the subpixel region 4331 and the light transmissive region 4351, and/or be provided between neighbouring subpixels, if desired. For example, the auxiliary electrode may be provided in the intermediate region 4341.

The thickness of the auxiliary electrode is generally greater than the thickness of the conductive coating 4352. For example, the thickness of the auxiliary electrode may be greater than about 50 nm, greater than about 80 nm, greater than about 100 nm, greater than about 150 nm, greater than about 200 nm, greater than about 300 nm, greater than about 400 nm, greater than about 500 nm, greater than about 700 nm, greater than about 800 nm, greater than about 1 µm, greater than about 1.2 µm, greater than about 1.5 µm, greater than about 2 µm, greater than about 2.5 µm, or greater than about 3 µm. In some embodiments, the auxiliary electrode may be substantially non-transparent or opaque. However, since the auxiliary electrode is generally provided in the non-emissive region(s) of the device 4300, the auxiliary electrode may not cause significant optical interference. For example, the light transmittance of the auxiliary electrode may be less than about 50%, less than about 70%, less than about 80%, less than about 85%, less than about 90%, or less than about 95% in the visible portion of the electromagnetic spectrum. In some embodiments, the auxiliary electrode may absorb light in at least a portion of the visible wavelength range of the electromagnetic spectrum.

In some embodiments, various layers or coatings, including the semiconducting layers 4348, may cover a portion of the light transmissive region 4351 if such layers or coatings are substantially transparent. Alternatively, the PDLs 4346a, 4346b may be omitted from the light transmissive region 4351, if desired.

It will be appreciated that pixel and subpixel arrangements other than the arrangement illustrated in FIG. 1 may also be used.

In one aspect, an electroluminescent device is provided. The device includes a plurality of first electrodes, and a bank disposed over the plurality of first electrodes. The bank defines a plurality of first well regions and a plurality of second well regions. The plurality of second well regions are configured to expose the surfaces of the plurality of first electrodes through the bank. The device further includes a semiconducting layer disposed in the plurality of second well regions to cover the surfaces of the plurality of first electrodes. A nucleation inhibiting coating is disposed in the plurality of first well regions. A conductive coating is disposed over the semiconducting layer in the plurality of second well regions. The surface of the nucleation inhibiting coating is substantially free of the conductive coating. In some embodiments, each first well region of the plurality of first well regions includes a plurality of wells. In some embodiments, each second well region of the plurality of second well regions includes a plurality of wells. In some further embodiments, the plurality of wells in the first well regions are arranged substantially identically to the plurality of wells in the second well regions.

Figure 9:
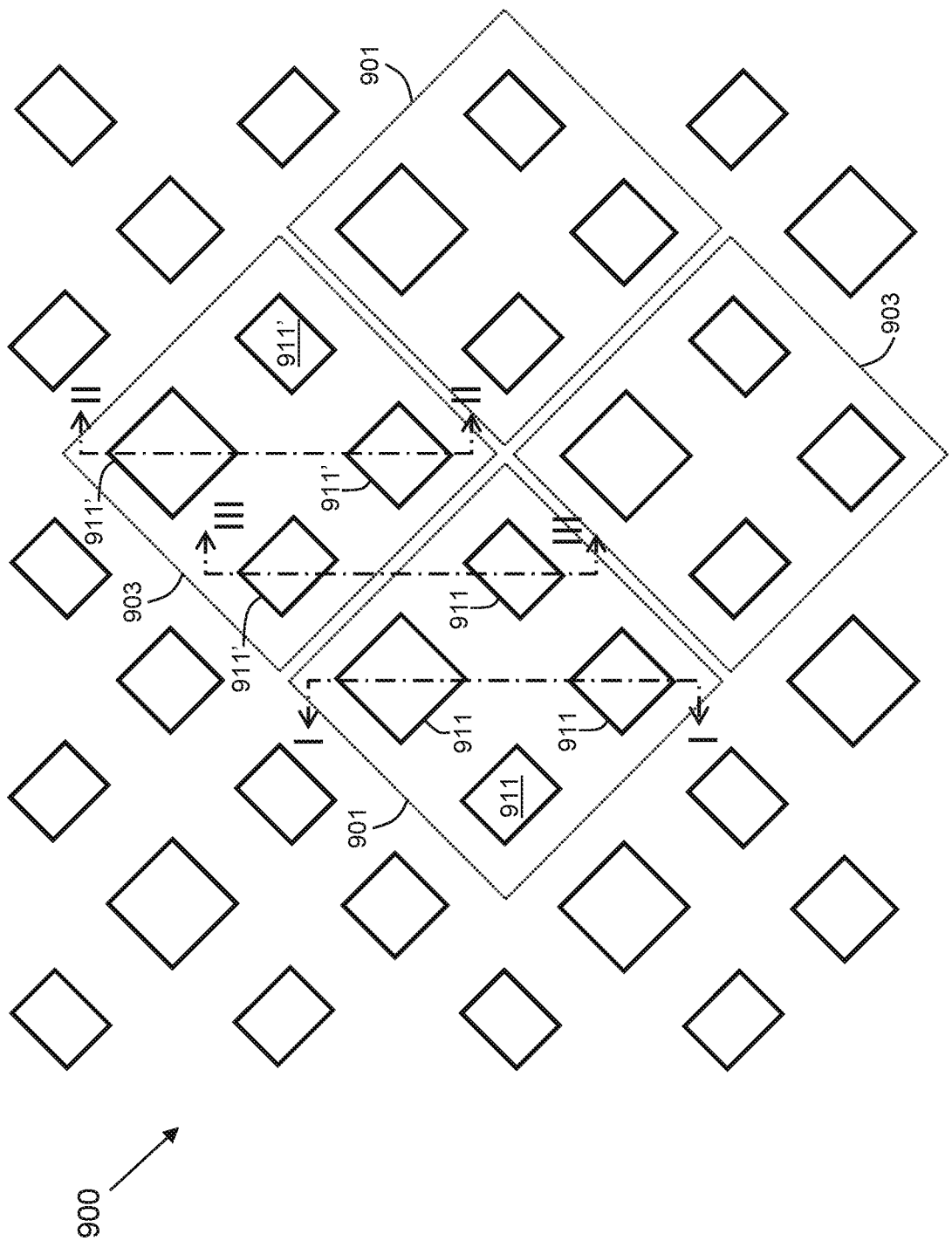
FIG. 9 is a diagram of a portion of an electronic device according to one embodiment.

FIG. 9 illustrates a portion of an electroluminescent device 900 according to one embodiment. The device 900 includes a plurality of first well regions 901 and a plurality of second well regions 903. In the illustrated embodiment, each first well region 901 includes a plurality of first wells 911, and each second well region 903 includes a plurality of second wells 911'. The cross-sectional view of the first well region 901 taken along line I-I is illustrated in FIG. 10A and the cross-sectional view of the second well region 903 taken along line II-II is illustrated in FIG. 10B.

Figure 10A:
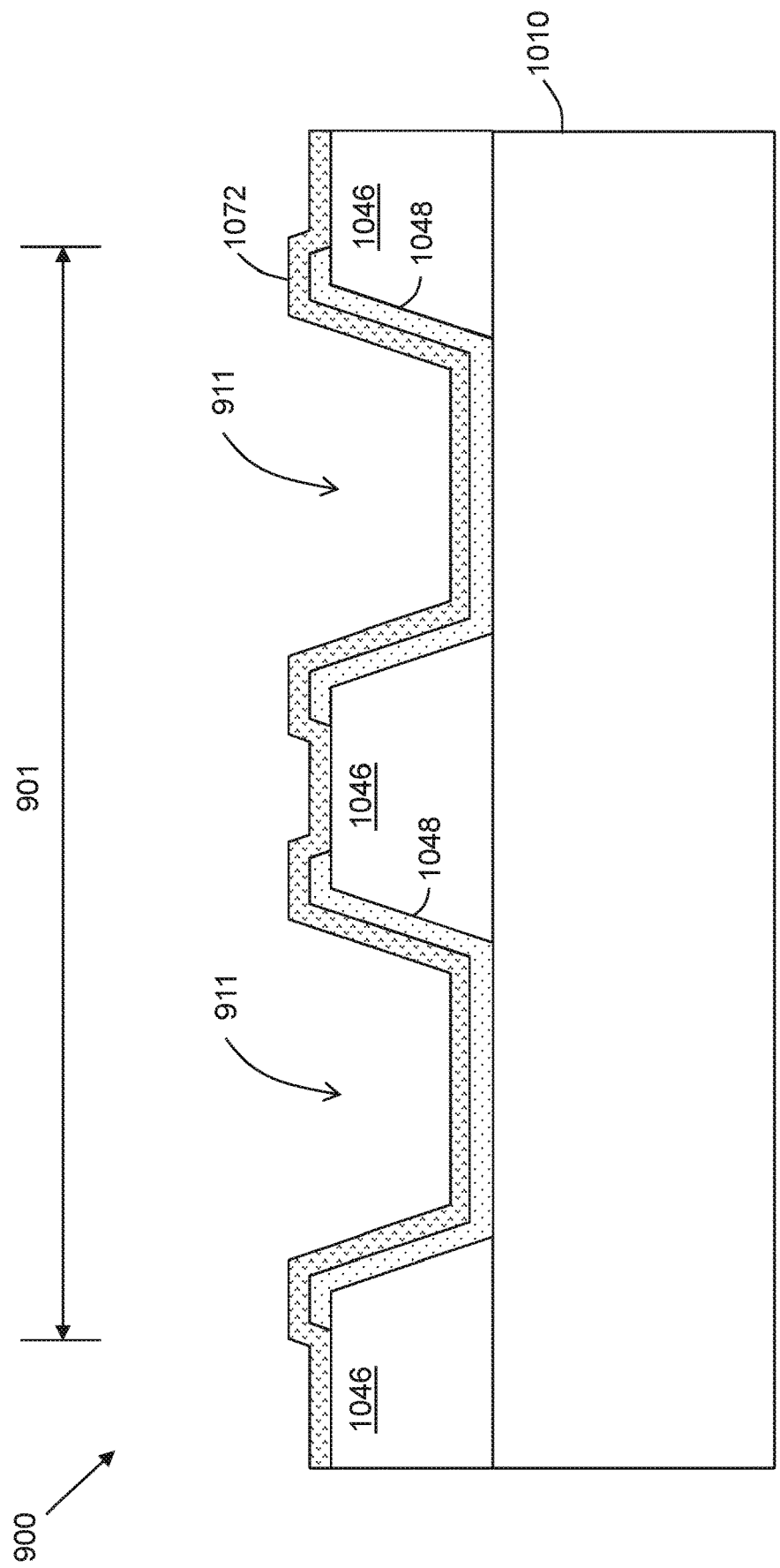
FIG. 10A is a cross-sectional view of the device of FIG. 9 taken along line I-I according to one embodiment.

Referring now to FIG. 10A, the cross-sectional view of the portion of the device 900 corresponding to the first well region 901 is illustrated. The device includes first wells 911 which are defined by the bank 1046. For example, the first wells 911 may be formed as apertures which extend through the bank 1046 to expose the underlying surface. In the illustrated embodiment, the bank 1046 is disposed on the substrate 1010. For example, the apertures forming the first wells 911 may extend through the bank 1046 such that the surface of the substrate 1010 is exposed from a material used to form the bank 1046 defining the first wells 911. In the illustrated embodiment, a semiconducting layer 1048 is provided in the first wells 911. As will be explained below, the semiconducting layer 1048 generally includes the materials used to form various layers of the electroluminescent device 900. In some embodiments, the semiconducting layer 1048 in the first wells 911 may be provided as a single monolithic or continuous structure, such that the semiconducting layer 1048 provided in neighbouring first wells 911 is formed as a single layer (e.g., a non-discrete structure). In a further embodiment, the semiconducting layer 1048 disposed in the first wells 911 includes materials deposited as a common layer of the electroluminescent device 900. Examples of such materials include, but are not limited to, the materials used to form the following layers: hole injection layer, hole transport layer, electron transport layer, and electron injection layer. In other embodiments, the semiconducting layer 1048 may be formed as discrete structures, such that the semiconducting layer 1048 present in neighboring first wells 911 are not continuously formed. In yet other embodiments, the semiconducting layer 1048 is omitted from the first wells 911. In the illustrated embodiment, a nucleation inhibiting coating 1072 is disposed over the semiconducting layer 1048 and the bank 1046. For example, the nucleation inhibiting coating 1072 may be disposed to substantially cover the surface(s) of the first well region 901.

Figure 10B:
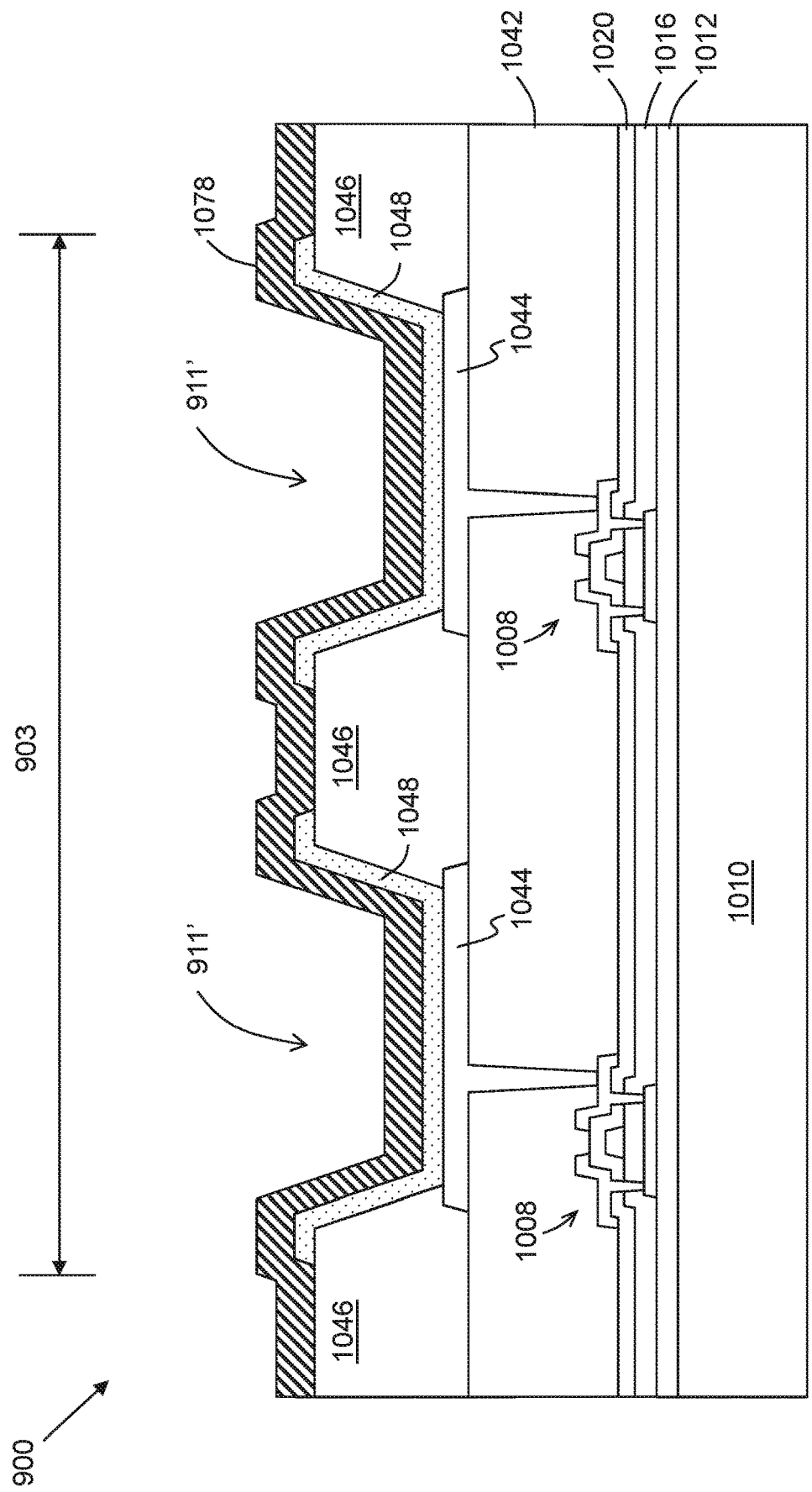
FIG. 10B is a cross-sectional view of the device of FIG. 9 taken along line II-II according to one embodiment.

FIG. 10B illustrates the cross-sectional view of the portion of the device 900 corresponding to the second well region 903. A plurality of second wells 911' are illustrated as being provided in the second well region 903. For example, each second well 911' may correspond to a subpixel or emissive region of the device 900. In each second well 911', a first electrode 1044, the semiconducting layer 1048, and a conductive coating 1078 are provided. The first electrode 1044 is electrically connected to one or more TFTs 1008 provided on the substrate 1010. The substrate 1010 may further include additional layer(s) and structure(s) for providing mechanical, electrical, or other functionalities. For example, in the illustrated embodiment, the substrate 1010 includes a buffer layer 1012, a semiconductor active layer (not shown), a gate insulating layer 1016, an electrode layer (e.g. for forming source and drain electrodes), an interlayer insulating layer 1020, and an insulating layer 1042. The TFTs 1008 may be formed using such layers.

A process for fabricating the device 900 is also provided. According to one embodiment, the process includes the stages of: (i) providing a substrate 1010 including a plurality of first electrodes 1044 disposed thereon; (ii) providing a bank 1046 for defining a plurality of first well regions 901 and a plurality of second well regions 903; (iii) depositing a semiconducting layer 1048; (iv) depositing a nucleation inhibiting coating 1072 in the plurality of first well regions 901; and (v) depositing a conductive coating 1078 in the plurality of second well regions 903. The plurality of second well regions 903 is substantially free of or exposed from the nucleation inhibiting coating 1072. In some embodiments, the semiconducting layer 1048 or portions thereof is deposited in both the plurality of first well regions 901 and the plurality of second well regions 903. In some embodiments, in (v), both the plurality of first well regions 901 and the plurality of second well region 903 are exposed to an evaporated flux of the material for forming the conductive coating 1078. However, as explained above, due to the presence of the nucleation inhibiting coating 1072 in the plurality of first well regions 901, the plurality of first well regions 901 remain exposed from, or is free of, the conductive coating 1078.

Figure 10C:
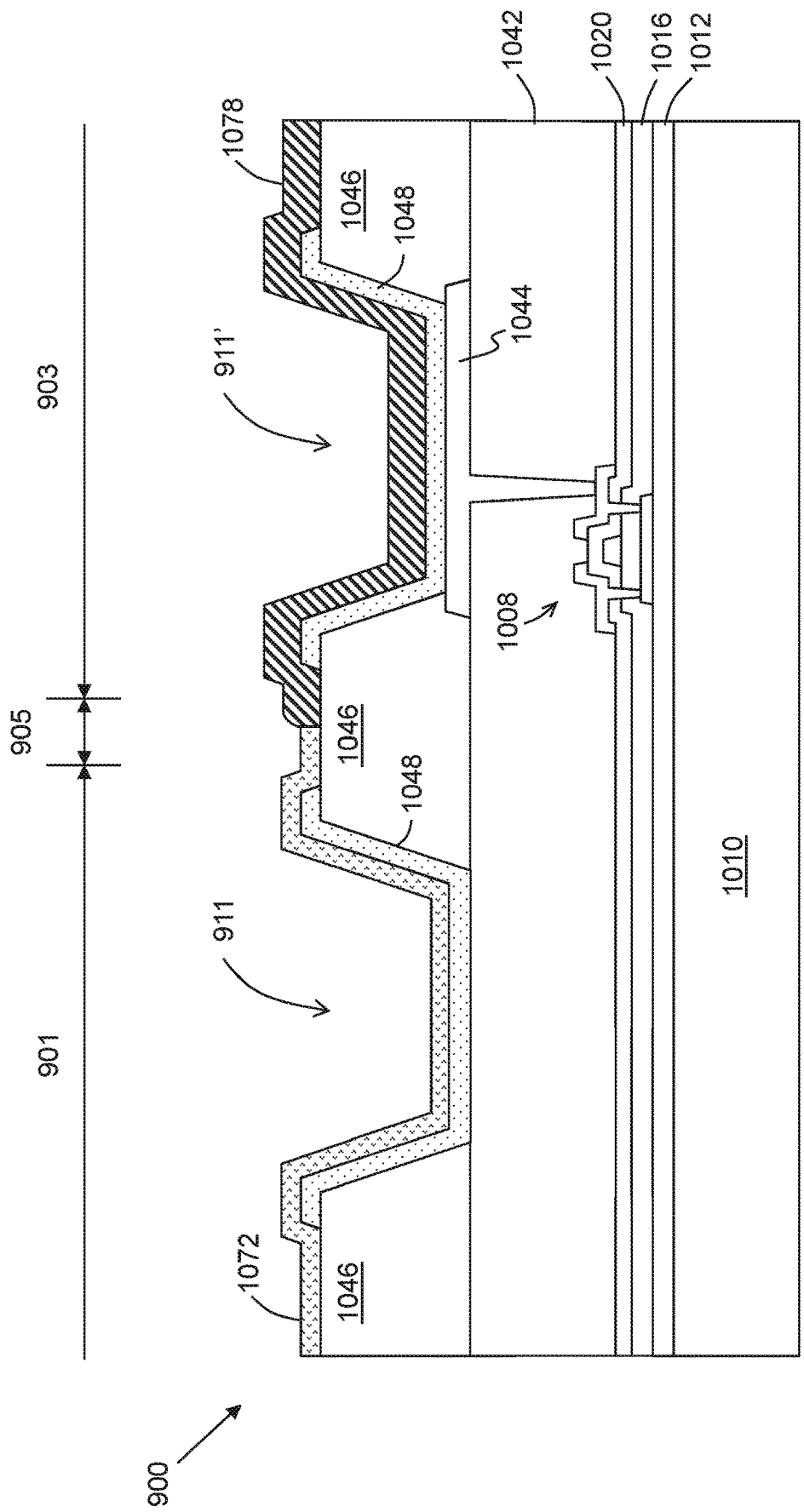
FIG. 10C is a cross-sectional view of the device of FIG. 9 taken along line III-III according to one embodiment.

FIG. 10C illustrates the cross-sectional view of the device 900 taken along line III-III as shown in FIG. 9, in which both the first well region 901 and the second well region 903 are illustrated. In some embodiments, an intermediate region 905 may be provided between the first well region 901 and the second well region 903. The intermediate region 905 generally corresponds to a region of the device at or near the interface between the adjacent first well region 901 and the second well region 903. In some embodiments, at least a portion of the intermediate region 905 is coated with both the nucleation inhibiting coating 1072 and the conductive coating 1078. For example, the conductive coating 1078 may be formed as disconnected clusters or islands over the surface of the nucleation inhibiting coating 1072 in the intermediate region 905. Various embodiments of the intermediate region are described above, and such description shall similarly apply to the intermediate region 905 of FIG. 10C.

The electroluminescent device 900 may be a transparent or semi-transparent display device. Generally, the first well region 901 forms a non-emissive region of the device 900 and the second well region 903 forms an emissive region of the device 900. For example, the first well region 901 may correspond to a light-transmissive region to allow transmission of incident light through the device 900. In contrast, the transmissivity of the device 900 in the second well region 903 is generally lower than that of the first well region 901 due to the presence of the conductive coating 1078. For example, while the conductive coating 1078 generally allows for transmission of at least a portion of incident light, particularly in the visible portion of the electromagnetic spectrum, at least a portion of the incident light is attenuated by the material used to form the conductive coating 1078. Moreover, in the illustrated embodiment, the first electrode 1044 is also omitted in the first well region 901 to further enhance the light transmissivity in such region of the device 900. Typically, in a top-emission electroluminescent device, the first electrode 1044 is configured to be generally opaque and reflective to enhance the emission of light through a semi-transparent second electrode (corresponding to the conductive coating 1078). Accordingly, the presence of the combination of the first electrode 1044 and the conductive coating 1078 in the second well region 903 substantially inhibits transmission of light through the second well region 903, while a greater proportion of external light incident on the device 900 would be transmitted through the first well region 901.

For example, the light transmittance of the device 900 in the first well region 901 may be greater than about 30%, greater than about 40%, greater than about 50%, greater than about 60%, greater than about 65%, greater than about 70%, greater than about 75%, greater than about 80%, greater than about 85%, greater than about 90%, or greater than about 95% for a portion of the electromagnetic spectrum corresponding to the visible wavelengths (e.g., from about 390 nm to about 700 nm) and/or the infrared wavelengths. Examples of infrared wavelengths include, but are not limited to, from about 700 nm to about 1 mm, from about 750 nm to about 5000 nm, from about 750 nm to about 3000 nm, from about 750 nm to about 1400 nm, and from about 850 nm to about 1200 nm. In some embodiments, the light transmittance of the device 900 in the first well region 901 may be greater than about 30%, greater than about 40%, greater than about 50%, greater than about 60%, greater than about 65%, greater than about 70%, greater than about 75%, greater than about 80%, greater than about 85%, greater than about 90%, or greater than about 95% for a portion of the electromagnetic spectrum corresponding to wavelengths of from about 400 nm to about 1400 nm, from about 420 nm to about 1200 nm, or from about 430 nm to about 1100 nm.

Figure 11A:
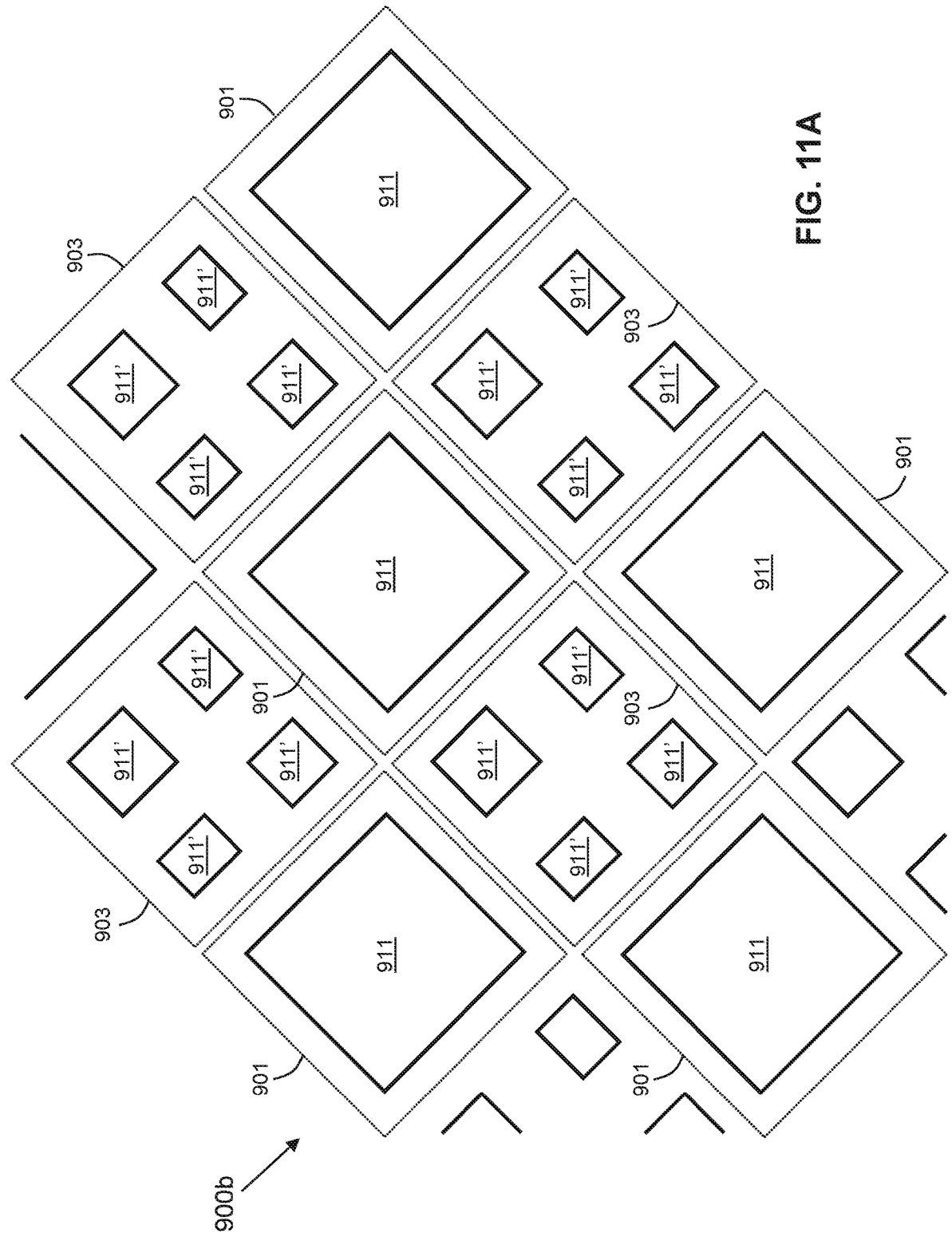
FIG. 11A is a diagram of a portion of an electronic device according to one embodiment.

FIG. 11A illustrates a portion of the electroluminescent device 900b according to an embodiment wherein each first well region 901 is provided with a single first well 911. For example, providing a single first well 911 in each first well region 901 may be particularly advantageous in some cases for achieving higher light transmittance through the first well region 901 by omitting the presence of any bank materials therein. It is also postulated that reducing the bank material in the first well region 901 may potentially reduce the likelihood of any undesirable optical interferences. In the embodiment of FIG. 11A, the first well 911 is substantially free of the bank material.

While each first well 911 and each second well 911' are illustrated as being substantially quadrilateral in shape, it will be understood that each well 911, 911' may be in any shape. For example, each first well 911 and each second well 911' may be shaped as a polygon (including but not limited to a triangle, quadrilateral, pentagon, hexagon, heptagon, or an octagon), an ellipse, or other shapes and configurations.

Figure 14:
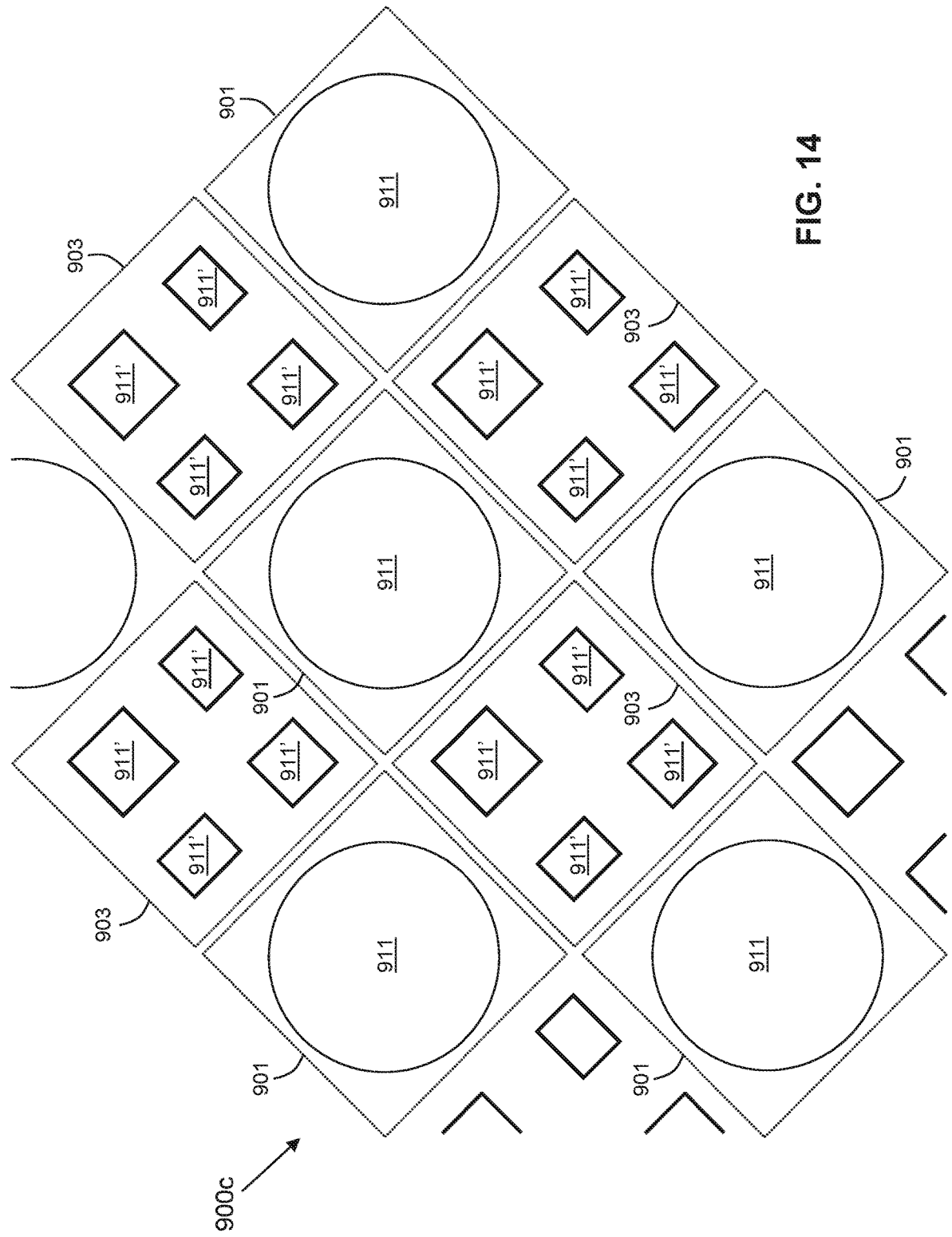
FIG. 14 is a diagram of a portion of a device according to one embodiment.

FIG. 14 illustrates a portion of the electroluminescent device 900c according to an embodiment wherein each first well 911 is substantially circular in shape. Without wishing to be bound by any particular theory, it is postulated that providing a first well 911 having a non-polygonal shape may reduce or mitigate the likelihood of a viewer detecting the presence of the light transmissive first well region 901 or any undesirable optical interference caused due to the presence of such region. For example, a repeating pattern of a polygonal first well 911 may cause linear segment(s) of the first well 911 to align with linear segment(s) of one or more neighboring or adjacent first well(s) 911; thus, a viewer viewing such device from a typical viewing distance may observe visible lines or other patterns on the panel due to such alignment. It is postulated that, by omitting linear segments from the shape of the first well 911, the likelihood of such lines or patterns being observed may be reduced, thus enhancing user experience at least in some cases.

Figure 15:
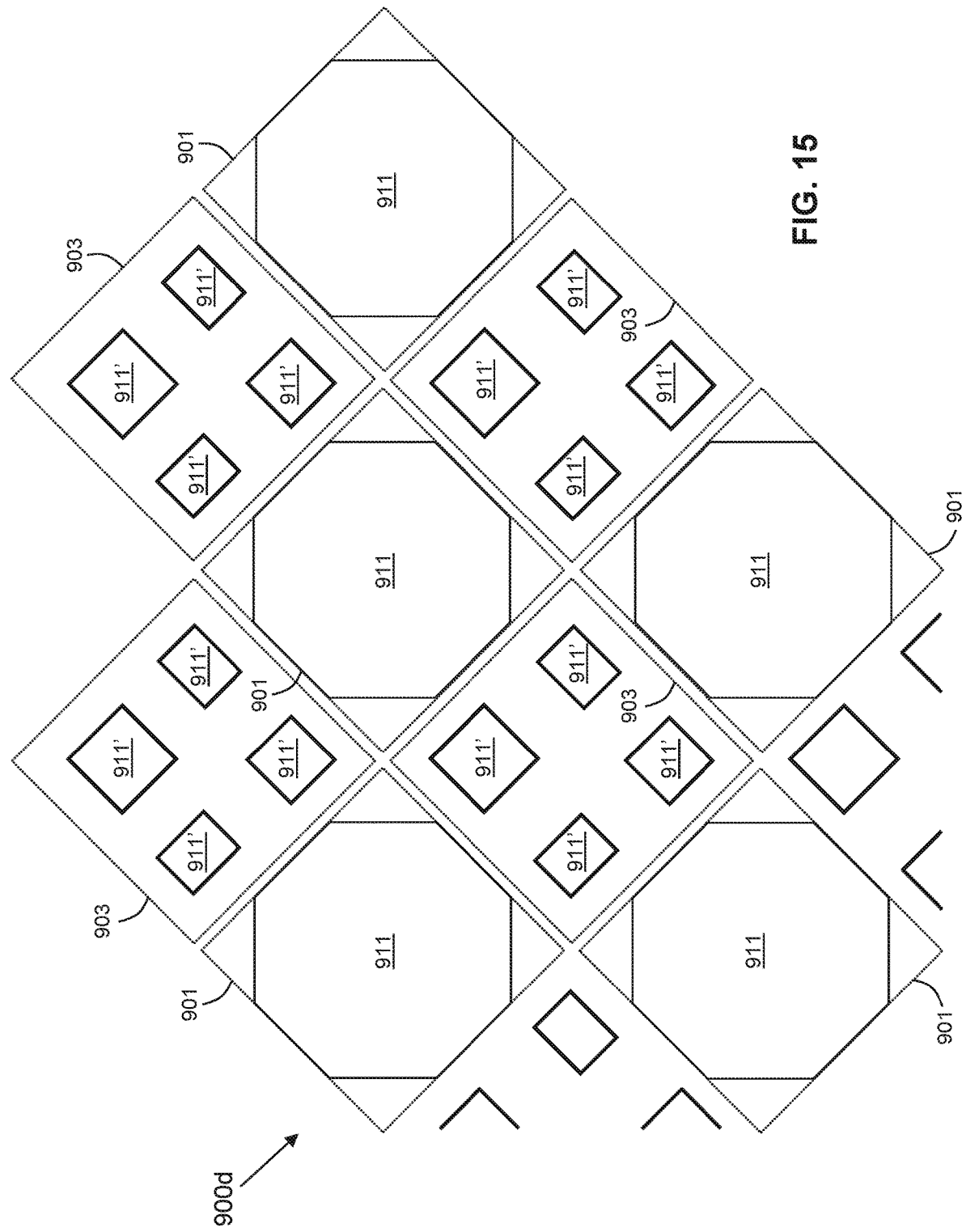
FIG. 15 is a diagram of a portion of a device according to another embodiment.

FIG. 15 illustrates a portion of the electroluminescent device 900d according to an embodiment wherein each first well 911 is substantially octagonal in shape. It is postulated that, in embodiments wherein each first well 911 is polygonal, incorporating 4, 5, 6, 7, 8 or more substantially linear segments may reduce the likelihood of a viewer being able to detect the presence of the light transmissive first well region 901 or visible patterns caused due to inclusion of such regions in the device.

In some embodiments, each first well region 901 is arranged adjacent to each second well region 903 as illustrated in FIGS. 9, 11A, 14, and 15. In some embodiments, each first well region 901 and each second well region 903 are configured substantially identically to one another. For example, each first well region 901 and each second well region 903 may have substantially the same dimensions, shapes, and/or layout as one another. In this way, devices incorporating light transmissive portions may be fabricated without introducing significant changes to the manufacturing equipment and/or process. For example, during certain deposition stages of the semiconducting layer 1048, one or more fine metal masks (FMMs) may typically be used for selectively depositing certain materials (such as, for example, electroluminescent layers and charge blocking layers) in certain subpixel regions. Significant changes to the device layout are relatively expensive and time-consuming to implement. For example, changes to the device layout may involve modifications to the design of FMMs. However, the process and device structure described herein may be compatible with the FMMs and evaporation procedure, thus mitigating significant design and process changes to producing devices having light transmissive regions.

In some embodiments, the first well region 901 and the second well region 903 are arranged in a substantially repeating pattern. In some embodiments, an area of the device corresponding to the first well region 901 is greater than an area corresponding to the second well region 903. For example, such configuration may increase the overall light transmittance through the device. In some embodiments, the area corresponding to the first well region 901 is less than the area corresponding to the second well region 903. For example, such configuration may increase the total emissive area of the device and may be desirable for enhancing the brightness and/or lifetime of the device.

In some embodiments, each second well region 903 corresponds to a pixel. The pixel as used herein generally refers to the smallest repeating unit of the device for displaying an image. For example, the pixel may include one or more subpixels, which may, for example, include red, green, and blue subpixel(s). In other examples, the pixel may include red, green, blue, and white subpixels. In some embodiments, each second well region 903 includes or encompasses a first well region 901. For example, one or more first well 911 may be arranged in between or interspersed among a group of second wells 911' for forming a pixel of the device. For example, two or more first wells 911 may be provided within a single second well region 903.

Figure 11B:
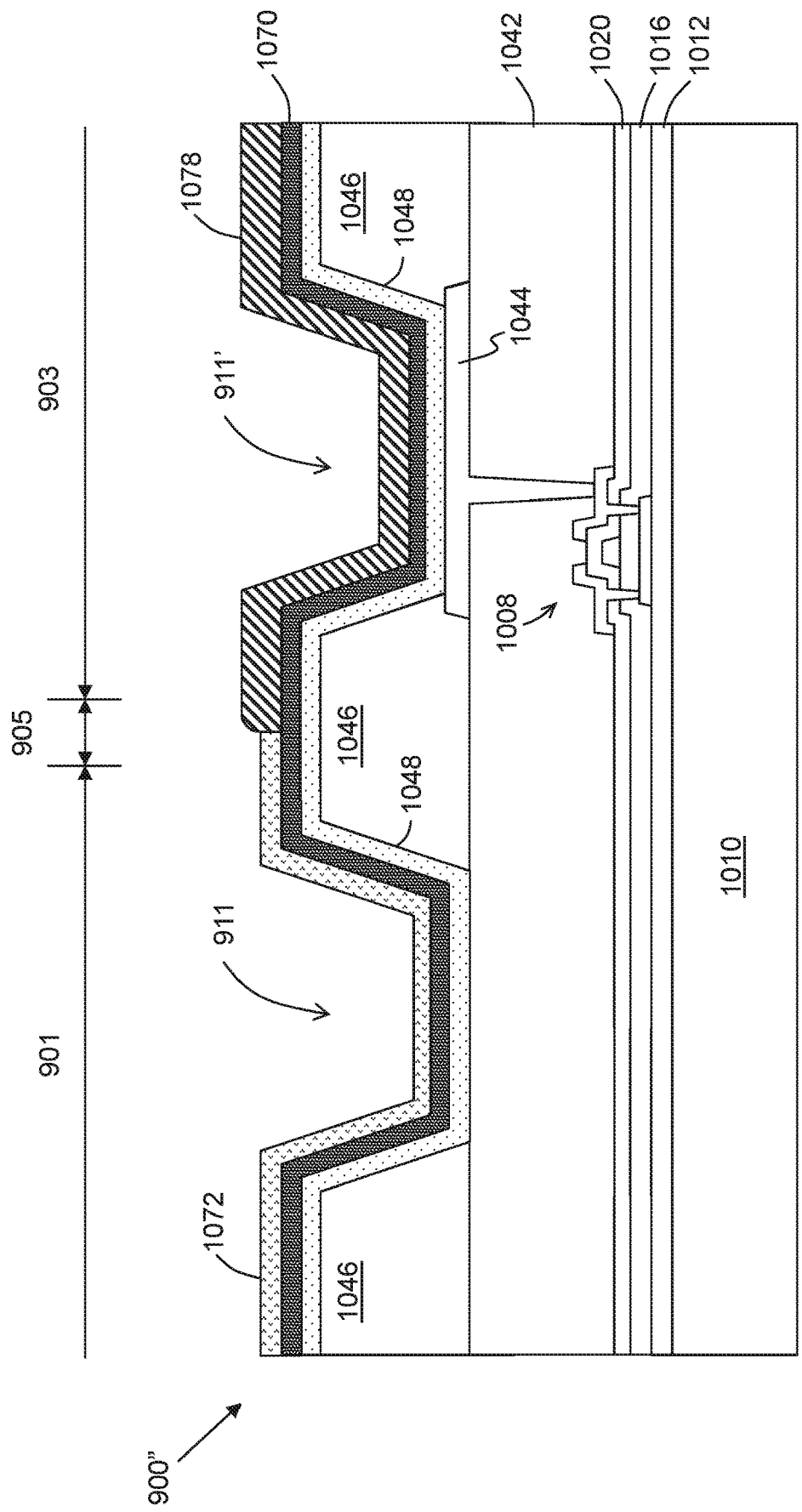
FIG. 11B is a cross-sectional view of the device of FIG. 11A according to one embodiment.

FIG. 11B illustrates a cross-sectional view of the device 900" according to an embodiment wherein the semiconducting layer 1048 is provided as a single monolithic or continuous layer in the device 900". For example, the semiconducting layer 1048 is arranged such that it is disposed in the first well region 901, the second well region 903, and the intermediate region 905. In the illustrated embodiment, an interfacial coating 1070 is provided to coat the surface of the semiconducting layer 1048. For example, the interfacial coating 1070 may also be provided as a single monolithic or continuous coating to substantially cover the first well region 901, the second well region 903, and the intermediate region 905. In the first well region 901, the nucleation inhibiting coating 1072 is disposed over the interfacial coating 1070. In the second well region 903, the conductive coating 1078 is disposed over the interfacial coating 1070. For example, in the second well 911', the interfacial layer 1070 is generally arranged to be in direct physical contact with both the conductive coating 1078 and the semiconducting layer 1048. The first electrode 1044 is also arranged to be in direct physical and electrical contact with the semiconducting layer 1048. Details of the intermediate region described with respect to other embodiments described herein, including but not limited to those of FIGS. 5A to 5F, and 6, may similarly apply to the embodiment of FIG. 11B. For example, during fabrication of the device 900", at least a portion of the semiconducting layer 1048 may be deposited using an open mask to result in deposition of a continuous structure of the semiconducting layer 1048. Similarly, the interfacial coating 1070 may be deposited using an open mask deposition process.

In some embodiments, the interfacial coating 1070 includes a material selected from the following: alkali metals, alkaline earth metals, fluorides of alkali or alkaline earth metals, oxides of alkaline earth metals, rare earth elements, fluorides of rare earth elements, oxides of rare earth elements, fullerene, and mixtures of two or more of foregoing. Examples of such materials include, but are not limited to, the following: lithium (Li), ytterbium (Yb), ytterbium fluoride (YbF$_3$), magnesium fluoride (MgF$_2$), and cesium fluoride (CsF). In some embodiments, the interfacial coating 1070 includes materials which are used to form an electron injection layer. In some embodiments, two or more materials may be mixed to form the interfacial coating 1070. Generally, the interfacial coating 1070 is a nucleation promoting coating.

In some embodiments, the interfacial coating 1070 is substantially free of, or does not contain, elemental silver (Ag). In some embodiments, the interfacial coating 1070 is substantially free of, or does not contain, elemental magnesium (Mg). In a further embodiment, the portion of the device corresponding to the first well region 901 is substantially free of, or does not contain, elemental silver or magnesium. For example, it has now been found that the inclusion of silver and/or magnesium in the interfacial coating 1070 may reduce the light transmittance in the first well region 901 and is therefore unfavorable. For example, a device fabricated using an interfacial coating 1070 formed by a 1 nm thick layer of Ag was found to exhibit lower light transmittance than another device fabricated using an interfacial coating 1070 formed by a 3 nm thick layer of Yb. Specifically, at a wavelength of 450 nm, the light transmittance of the device fabricated using Ag as the interfacial layer was approximately 29%, whereas that of the device fabricated using Yb as the interfacial layer was approximately 42%. The light transmittance across the visible portion as well as the infrared and near infrared portion of the electromagnetic spectrum was also found to be reduced in the sample fabricated using Ag in comparison to the sample fabricated using Yb. Moreover, the variability in the level of light transmittance across the visible portion of the electromagnetic spectrum was found to be greater for the sample fabricated using Ag in comparison to the sample fabricated using Yb. Specifically, the sample fabricated using Ag exhibited a maximum difference in light transmittance of about 33% across the visible range, while the sample fabricated using Yb exhibited a maximum difference in light transmittance of about 20%. High variability in light transmittance with wavelength can cause light being transmitted through the device to appear colored and is generally unfavorable.

In some embodiments, the interfacial coating 1070 includes a material selected from: elemental ytterbium, a fluoride of ytterbium, an oxide of ytterbium, and a fluoride of magnesium.

In some embodiments, the semiconducting layer 1048 in the wells 911, 911' may be different from one well to another. For example, the semiconducting layer 1048 disposed in a well corresponding to a blue subpixel may contain different materials than the semiconducting layer 1048 disposed in another well corresponding to a red or green subpixel. For example, in certain embodiments, portions of the semiconducting layer 1048 may be provided as a common layer (e.g., as a continuous or single monolithic structure) while at least a portion of the semiconducting layer 1048 is provided as a patterned discrete structure.

In some embodiments, the device includes a backplane which is configured such that certain elements of the backplane which are substantially opaque, light attenuating, reflective, and/or light absorbing are omitted from the first well region 901. For example, the backplane generally includes a plurality of TFTs and conductive traces. Since the materials used to form the TFTs and the conductive traces generally exhibit relatively low light transmittance, it may be advantageous in at least some cases to omit these from the light transmissive regions of the device (e.g., the first well regions 901). For example, such elements may be arranged in the second well regions 903 such that the presence of these elements in the backplane do not substantially affect the light transmittance through the device. Additionally, in some embodiments, one or more layers of the backplane may be selectively removed from the first well region 901. For example, one or more of the following may be omitted from the portion of the device corresponding to the first well regions 901: a buffer layer 1012, a semiconductor active layer, a gate insulating layer 1016, an interlayer insulating layer 1020, and an insulating layer 1042.

It will be appreciated that the device according to various embodiments described above may include additional layers and/or coatings. For example, the device may further include index-matching coating, outcoupling layer, and encapsulation layer(s) including thin film encapsulation (TFE) layers. For example, an outcoupling layer may be provided as a common layer over the first well region 901 and the second well region 903 over the nucleation inhibiting coating 1072 and the conductive coating 1078. In a further example, the encapsulation layer(s) may be additionally provided to cover the outcoupling layer.

While various embodiments have been shown and described with each of the first well region and second well region having 1 or 4 wells, it will be appreciated that any number of wells may be provided in each well region. For example, 1, 2, 3, 4, 5, 6 or more wells may be provided in each well region.

In one aspect, an electronic device is provided. The electronic device includes a display panel. The display panel includes a plurality of first well regions and a plurality of second well regions. In some embodiments, the plurality of first well regions correspond to the light transmissive regions of the display panel, and the plurality of second well regions correspond to the light emissive regions of the display panel. The device further includes a sensor, the sensor being arranged behind the display panel. In some embodiments, at least a portion of the sensor is arranged to overlap with at least one first well region for detecting electromagnetic radiation incident on the device.

Figure 12A:
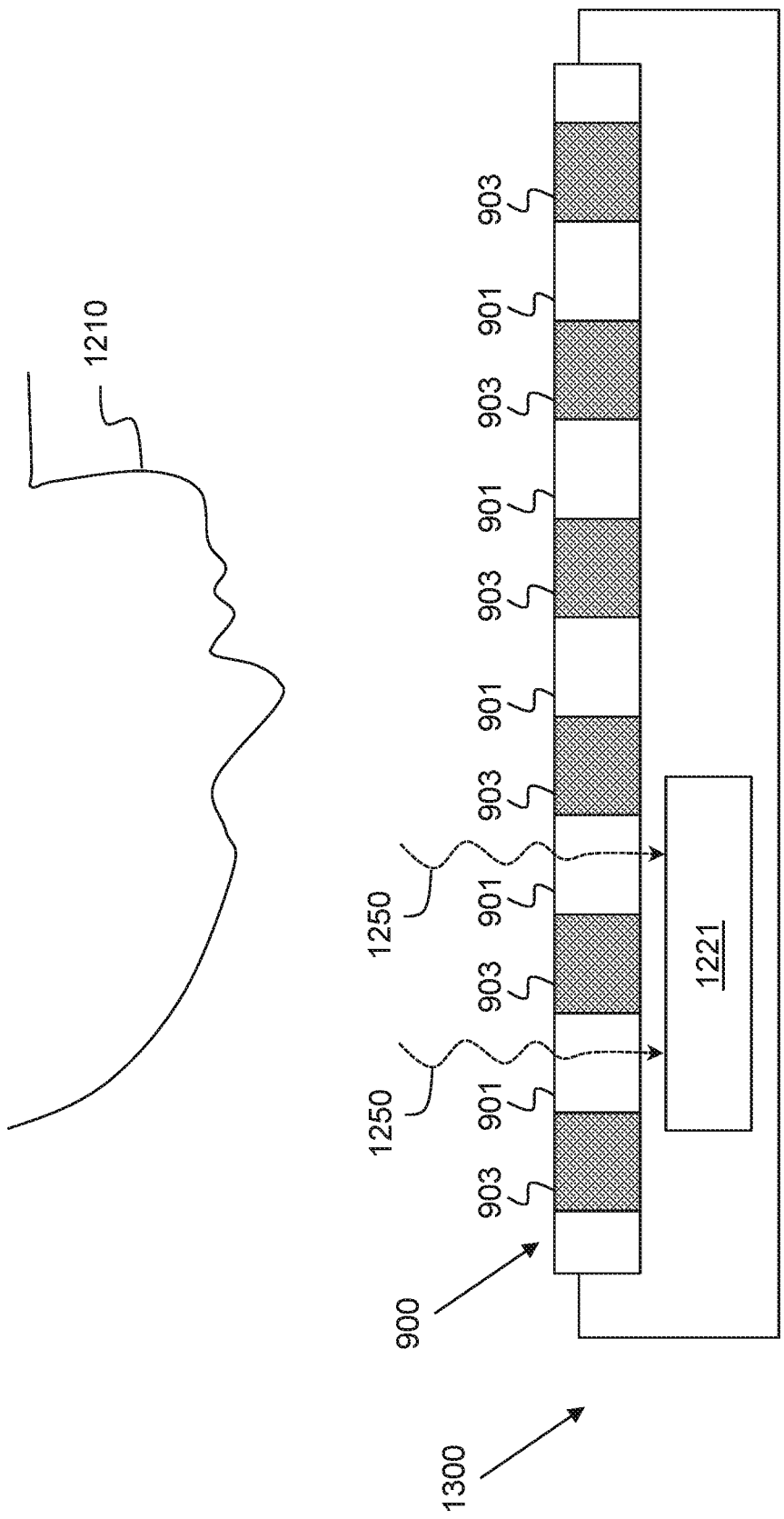
FIGS. 12A to 12C are schematic diagrams of a viewer using an electronic device according to various embodiments.

FIG. 12A illustrates a schematic diagram of the device 1300 according to an embodiment wherein a panel 900 including a plurality of first well regions 901 and a plurality of second well regions 903 are provided. A first sensor 1221 is arranged behind the panel 900 in the device 1300. The first sensor 1221 is arranged such that at least a portion of the first sensor 1221 containing a sensing element is configured to overlap with one or more of the first well regions 901. By configuring the device 1300 in this way, the first sensor 1221 may detect an electromagnetic radiation 1250 incident on the device 1300 upon the electromagnetic radiation 1250 being transmitted through the first well regions 901 of the device. A user 1210 is illustrated in FIG. 12A as a reference.

Figure 12B:
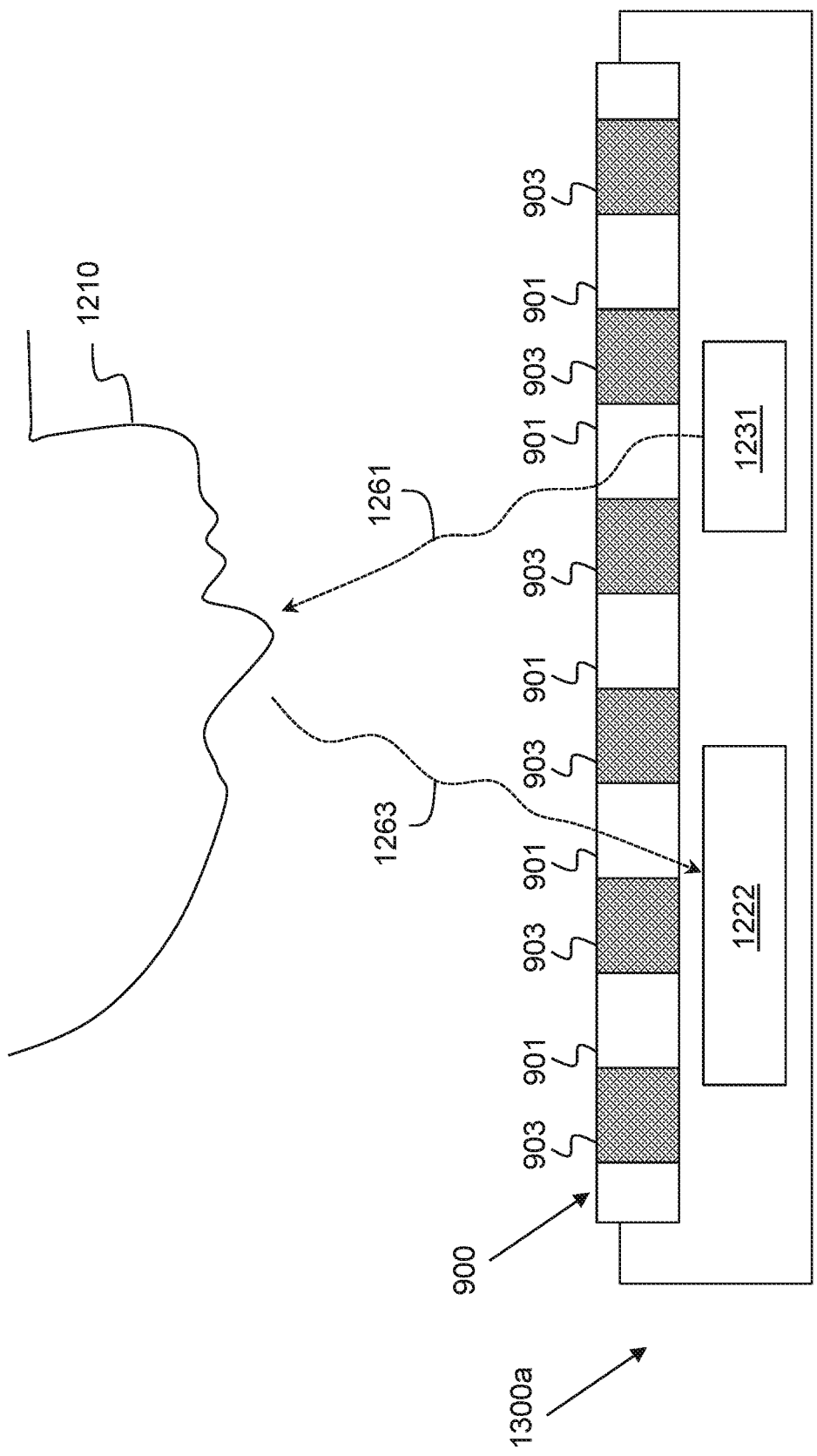

FIG. 12B illustrates a schematic diagram of the device 1300a according to an embodiment wherein the device 1300a includes a first emitter 1231 and a first receiver 1222. Both the first emitter 1231 and the first receiver 1222 are arranged behind the display panel 900 and configured such that at least a portion of the first emitter 1231 overlaps with one or more of the first well regions 901, and at least a portion of the first receiver 1222 overlaps with one or more of the first well regions 901. For example, the first emitter 1231 and the first receiver 1222 may be configured to detect biometric readings of a user 1210. In the illustrated embodiment, for example, the first emitter 1231 is configured to emit an electromagnetic radiation 1261 towards the user 1210. The electromagnetic radiation 1261 may be transmitted through the first well region 901 of the display panel 900. When the electromagnetic radiation 1261 is incident upon the user 1210, a portion of the radiation is reflected back towards the device 1300a as indicated by reference numeral 1263. The reflected electromagnetic radiation 1263 is then transmitted through the first well region 901 of the display panel to be detected by the first receiver 1222.

Figure 12C:
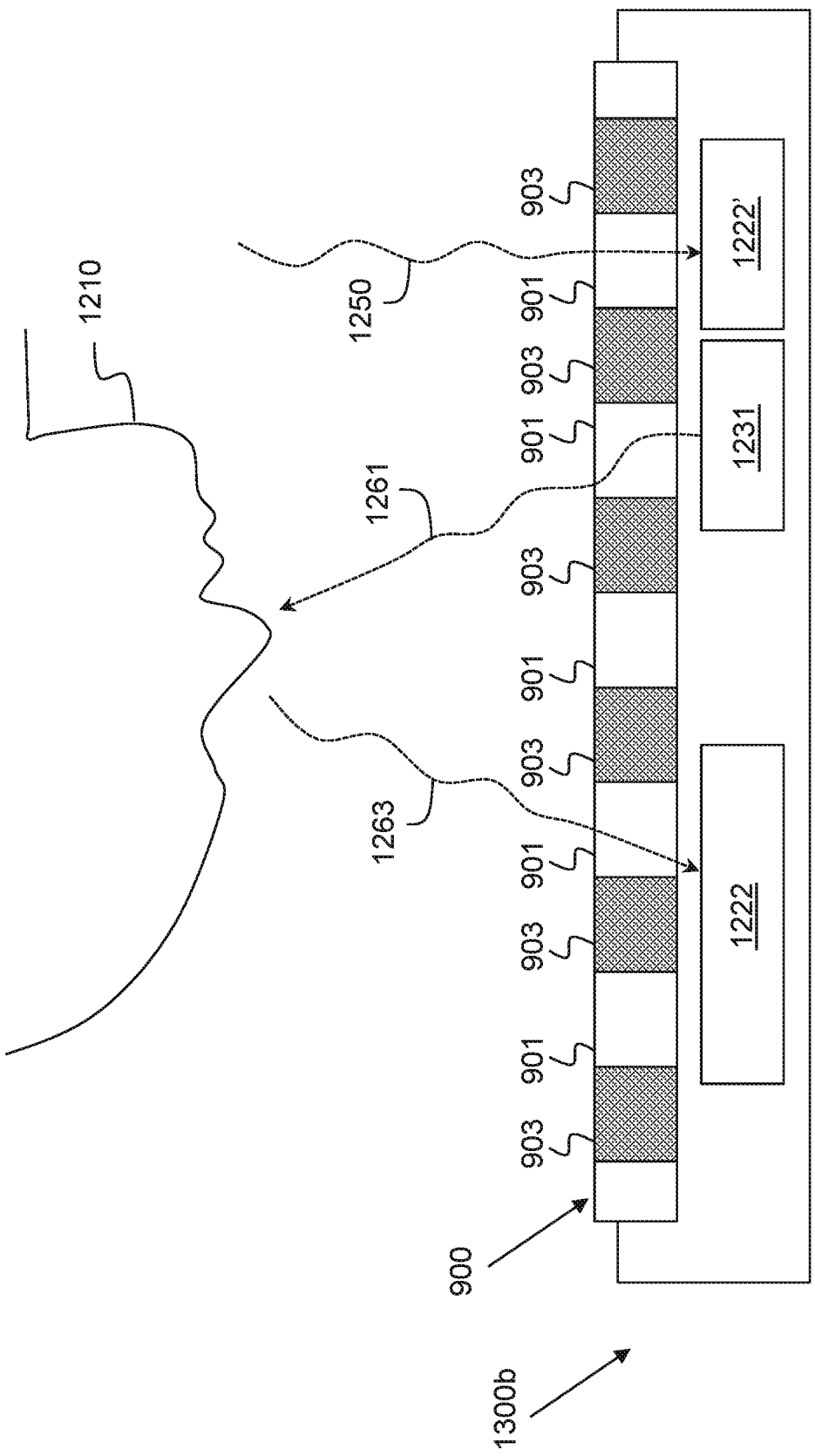

FIG. 12C illustrates yet another embodiment of the device 1300b, wherein the device 1300b includes the first emitter 1231, the first receiver 1222, and a first sensor 1222'. In such embodiment, the first emitter 1231 and the first receiver 1222 are configured to detect biometric readings of the user 1210, and the first sensor 1222' may be configured to detect an electromagnetic radiation 1250 incident on the device 1300b. For example, the first emitter 1231 and the first receiver 1222 may comprise a facial recognition system, and the first sensor 1222' may be a camera.

As would be appreciated, any number of sensors and emitters may be provided in a device in other embodiments. Examples of the types of sensors and emitters include those configured to determine biometric information (e.g., face detection, iris detection, fingerprint sensing, blood glucose sensor, and so forth). Other examples of sensors include those configured to capture an optical image, such as a camera sensor. In some embodiments, one or more sensors are configured to detect electromagnetic radiation in the visible portion of the spectrum. In some embodiments, one or more sensors are configured to detect electromagnetic radiation in the infrared portion of the spectrum. For example, a device may include a first emitter configured to emit an infrared radiation, a first sensor to detect the infrared radiation, and a second sensor to detect electromagnetic radiation in the visible portion of the spectrum.

Figure 16:
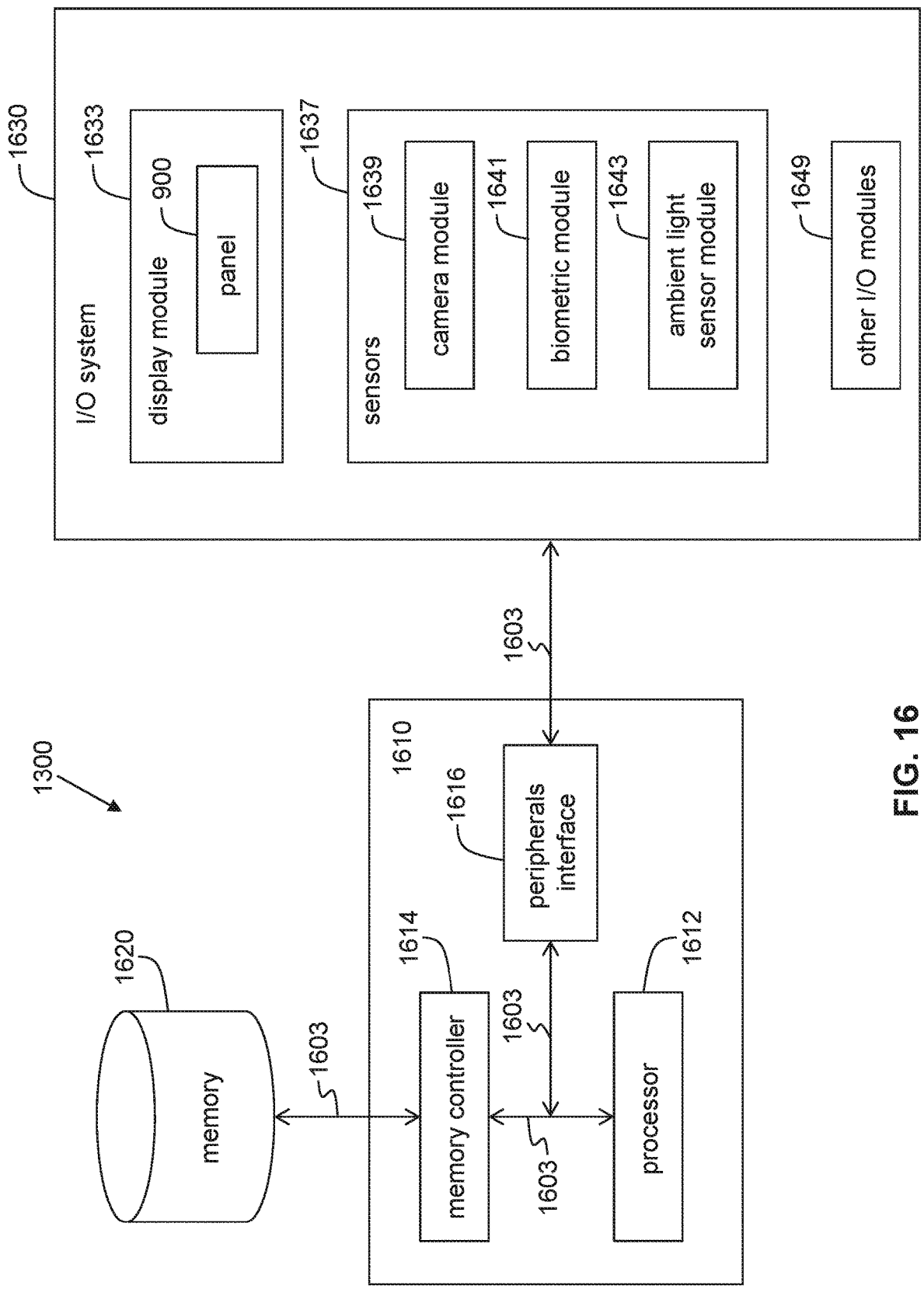
FIG. 16 is a schematic diagram of a device according to one embodiment.

FIG. 16 is a block diagram of an electronic device 1300 in accordance with some embodiments. In some embodiments, the electronic device 1300 is a portable electronic device, such as a smartphone, mobile device, laptop, tablet, or other devices with signal processing capabilities. The electronic device 1300 includes a processor 1612, a memory controller 1614, a peripherals interface 1616, a memory 1620, and an input/output (I/O) system 1630. Various components or subsystems of the electronic device 1300 may be in communication with one another via one or more signal lines 1603.

In some embodiments, the memory 1620 optionally includes a random access memory (RAM) as well as a non-volatile memory, such as one or more solid-state memory devices. Access to the memory 1620 by other components of the electronic device 1300, such as the processor 1612, is optionally controlled by the memory controller 1614. In some embodiments, the software components stored in the memory 1620 include the operating system and sets of instructions for performing various functions of the device 1300. The processor 1612 runs or executes various software programs and/or sets of instructions stored in memory 1620 to perform various functions of the electronic device 1300 and to process data.

In some embodiments, the peripherals interface 1616 is used to access various components of the I/O system 1630. The I/O system 1630 generally includes various modules and associated controllers. In the illustrated embodiment, the I/O system 1630 includes a display module 1633, sensors 1637, and other I/O modules 1649. For example, the sensors 1637 may include one or more optical sensors. In the illustrated embodiment, the sensors 1637 includes a camera module 1639, a biometric module 1641, and an ambient light sensor module 1643. For example, the I/O system 1630 may additionally include audio inputs and outputs, proximity sensors and controllers, and accelerometer(s). In some embodiments, the display module 1633 includes the panel 900. In some embodiments, at least one of the modules of the sensors 1637 is arranged behind the panel 900 of the display module 1633. For example, the camera module 1639 and/or the biometric module 1641 may be incorporated into the device 1300 behind the panel 900 with respect to the viewer 1210 such that the viewer 1210 may not be able to readily discern the location of such sensors. For example, in reference to the embodiment of FIG. 12C, the first sensor 1222' may comprise the camera module 1639, and the first emitter 1222 and the first receiver 1231 together may comprise the biometric module 1641.

In some embodiments, the peripherals interface 1616, the processor 1612, and the memory controller 1614 are, optionally, implemented on a single chip 1610. In some other embodiments, they are, optionally, implemented on separate chips.

It will be appreciated that electronic device 1300 is by way of an example and that the electronic device 1300 may optionally contain more or fewer components than shown, optionally combines two or more components, or optionally has a different configuration or arrangement of the components. The various components shown in FIG. 16 are implemented in hardware, software, firmware, or a combination thereof, including one or more signal processing and/or application specific integrated circuits. In some embodiments, the electronic device 1300 includes an RF (radio frequency) module which transmits and receives RF signals. For example, such RF module may include a transceiver, one or more amplifiers, a tuner, oscillator, digital signal processor, CODEC chipset, subscriber identity module (SIM) card, memory and so forth. The RF module may be configured to communicate using any number of communication standards including but not limited to Global System for Mobile Communications (GSM), Enhanced Data GSM Environment (EDGE), high-speed downlink packet access (HSDPA), high-speed uplink packet access (HSUPA), Evolution, Data-Only (EV-DO), HSPA, HSPA+, Dual-Cell HSPA (DC-HSPDA), long term evolution (LTE), near field communication (NFC), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g, and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol.

In some embodiments, the device 1300 may further include or be connected to other input or control devices. For example, such input or control devices include physical buttons, dials, slider switches, and so forth.

In some embodiments, the electronic device 1300 includes a power system for powering its various components. For example, the power system optionally includes a power management system, one or more power sources (e.g., battery), a recharging system, a power failure detection circuit, a power converter or inverter, a power status indicator (e.g., a light-emitting diode (LED)) and any other components associated with the generation, management and distribution of power in portable devices.

FIGS. 13A-13D illustrate the electronic device according to various embodiments, wherein the device includes a panel having a first portion comprising a plurality of first pixels, and a second portion comprising a plurality of second pixels. The plurality of first pixels are arranged in a first pixel density. The plurality of second pixels are arranged in a second pixel density. In some embodiments, the first pixel density is less than the second pixel density. In some embodiments, the first pixel density is about half of the second pixel density. In some embodiments, the light transmittance of the device in the first portion is greater than in the second portion. In some embodiments, the aperture ratio of the device in the first portion is less than in the second portion. In some embodiments, each first pixel further includes a plurality of first subpixels, and each second pixel further including a plurality of second subpixels, and the plurality of first subpixels are arranged substantially identically to the plurality of second subpixels. In some embodiments, the first portion is arranged adjacent to the second portion in the electronic device. In some embodiments, the first portion is arranged proximal to an edge of the electronic device.

In some embodiments, the aperture ratio of the device in the first portion is substantially the same as in the second portion. For example, while the first pixel density is less than the second pixel density in at least some embodiments, the fraction of the device area corresponding to light-emissive regions may be substantially the same in the first portion and the second portion. In some embodiments, the size of the first pixel is greater than the size of the second pixel. For example, it may be particularly advantageous to provide pixels having different sizes in different portions of the device to reduce any discrepancies in the viewers' experience of using the device, such as, for example, any differences in perceived brightness between the first portion and the second portion of the device. In some embodiments wherein the first pixel density is about half of the second pixel density, the average size of the first pixel is about twice the average size of the second pixel. For example, a size of a pixel may correspond to the area of the device occupied by such pixel. For example, the area of a pixel may be indicated using units such as $m^2$.

In some embodiments, the device may be configured to apply a greater current density to the first pixels in the first portion than to the second pixels in the second portion. In this way, for example, any potential discrepancies in device performance such as perceived difference in brightness between the first portion and the second portion of the device may be reduced.

Figure 13B:
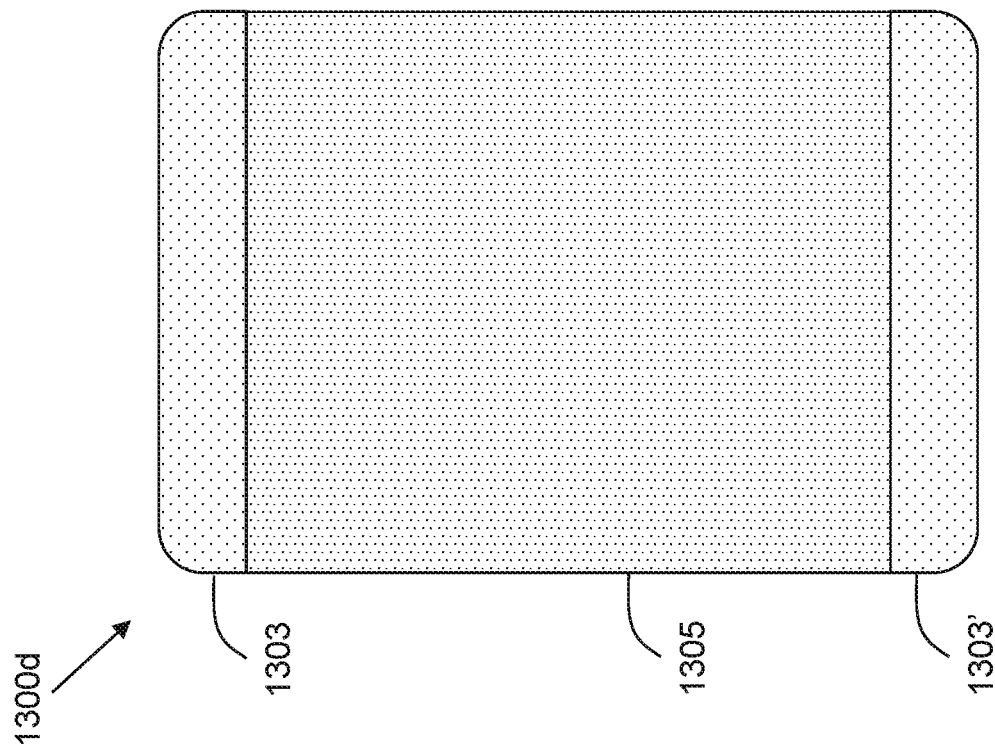
FIGS. 13A to 13D are schematic diagrams of an electronic device according to various embodiments.
Figure 13A:
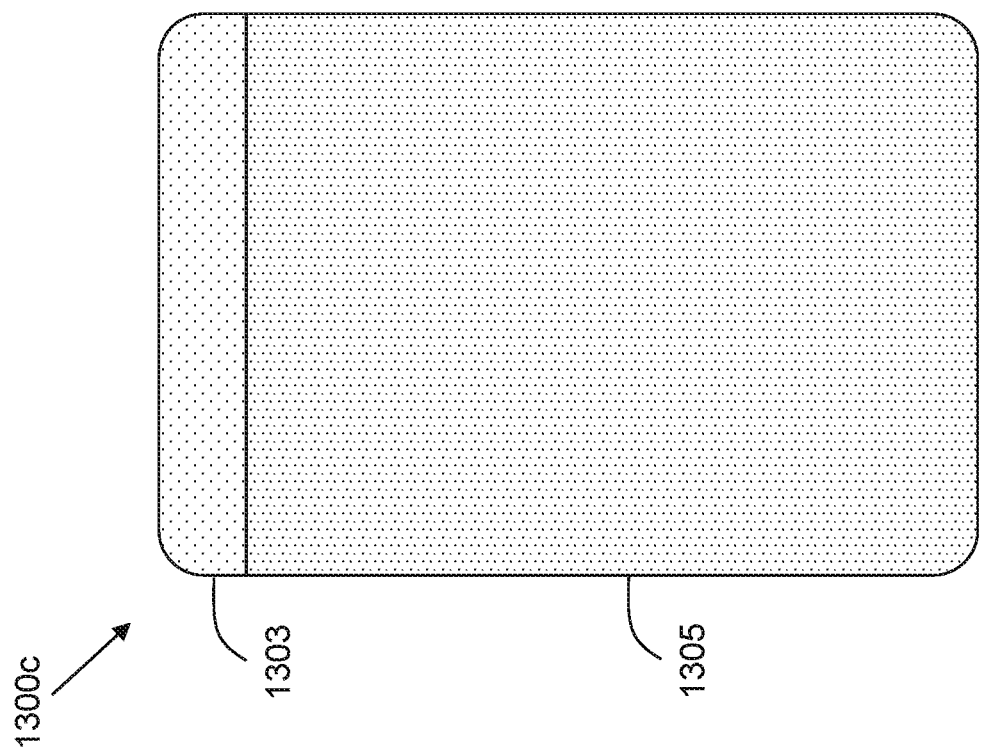

Referring now to FIG. 13A, the device 1300c having a first portion 1303 and a second portion 1305 is illustrated. The first portion 1303 is arranged at or near an edge of the device 1300c. For example, the first portion 1303 may be arranged along a top edge of the device 1300c.

In FIG. 13B, the device 1300d includes a first portion 1303 arranged along one edge of the device 1300d and an another first portion 1303' arranged along another edge. In this way, the second portion is arranged between the first portion 1303 and the another first portion 1303'.

Figure 13D:
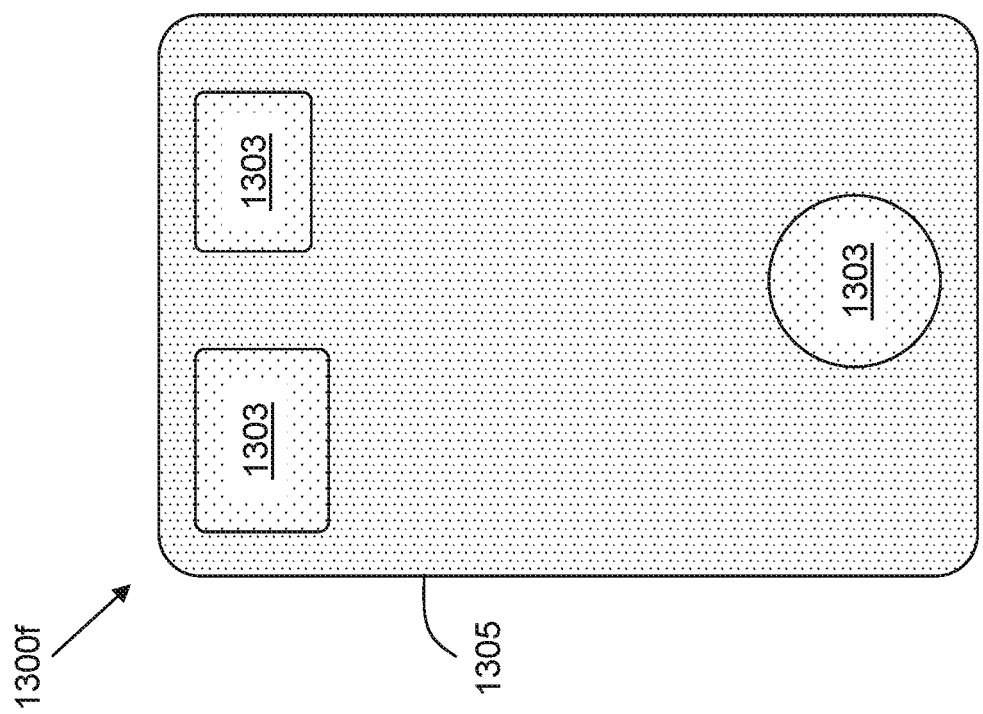
Figure 13C:
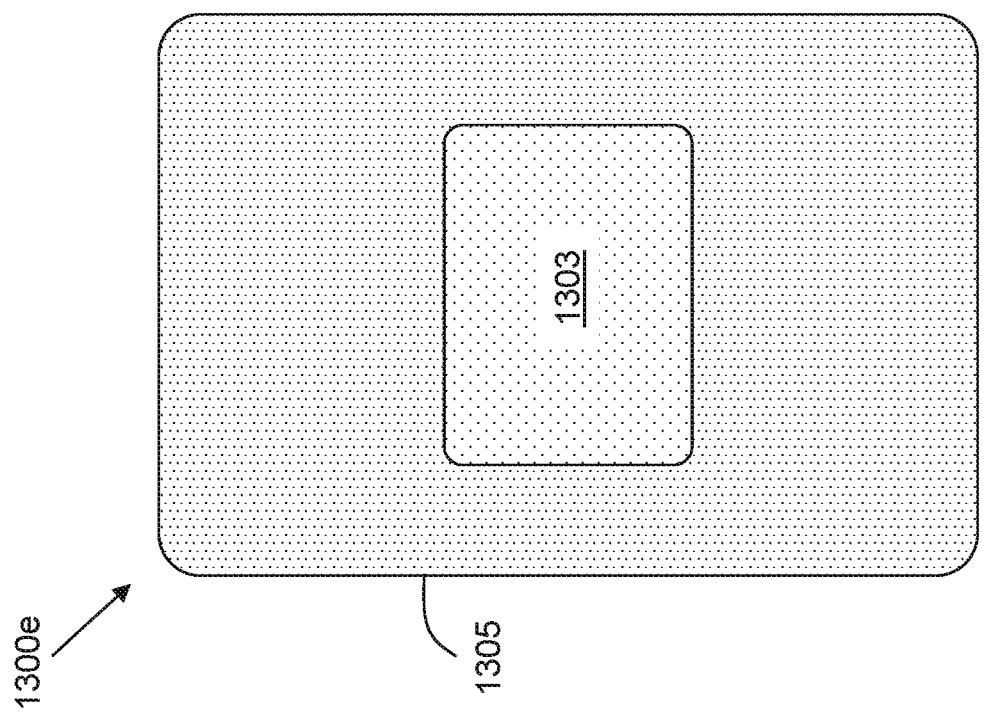

In FIG. 13C, the device 1300e includes a first portion 1303 arranged away from the edges of the device 1300e. For example, the first portion 1303 may be arranged such that the perimeter of the first portion 1303 is enclosed by the second portion 1305.

In FIG. 13D, the device 1300f includes a plurality of first portions 1303. For example, each first portion may be arranged such that the perimeter of each first portion is enclosed by the second portion 1305.

In some embodiments, the first portion 1303 includes a light transmissive portion and a light emissive portion. For example, the first portion 1303 may include the panel structures described in various embodiments above wherein the first well region and second well region are provided. For example, the first well region may correspond to the light transmissive portion and the second well region may correspond to the light emissive portion. In some embodiments, the second portion 1305 includes a light emissive portion and omits a light transmissive portion (or includes a lesser density of the light transmissive portion). For example, the second portion 1305 may include the panel structures described in various embodiments above wherein the first well regions are omitted and additional second well regions are provided in place of the omitted first well regions.

In one aspect, a display device is provided, wherein the display device comprises a first portion having a first pixel density, and a second portion having a second pixel density. In some embodiments, the first pixel density is less than the second pixel density. In some embodiments, the first portion exhibits a greater light transmissivity than the second portion.

A barrier coating (not shown) may be provided to encapsulate the devices illustrated in the foregoing embodiments depicting active-matrix OLED (AMOLED) display devices. As will be appreciated, such a barrier coating may inhibit various device layers, including organic layers and a cathode which may be prone to oxidation, from being exposed to moisture and ambient air. For example, the barrier coating may be a thin film encapsulation formed by printing, chemical vapor deposition (CVD), sputtering, atomic layer deposition (ALD), any combinations of the foregoing, or by any other suitable methods. The barrier coating may also be provided by laminating a pre-formed barrier film onto the devices using an adhesive. For example, the barrier coating may be a multi-layer coating comprising organic materials, inorganic materials, or combination of both. The barrier coating may further comprise a getter material and/or a desiccant in some embodiments.

In some embodiments, the device is an OLED display device. For example, such device may be an AMOLED display device. The semiconducting layer generally includes an emitter layer. The emitter layer may be formed, for example, by doping a host material with an emitter material. The emitter material may be a fluorescent emitter, a phosphorescent emitter, or a TADF emitter, for example. A plurality of emitter materials may also be doped into the host material to form the emitter layer. The semiconducting layer may further include a hole injection layer, a hole transport layer, an electron blocking layer, a hole blocking layer, an electron transport layer, an electron injection layer, and/or any additional layers.

It will be appreciated that an amount of material deposited on a surface to form the interfacial coating may be more, or less, than one monolayer. For example, the surface may be treated by depositing 0.1 monolayer, 1 monolayer, 10 monolayers, or more of an interfacial coating material. The amount of nucleation inhibiting material deposited on a surface to form a nucleation inhibiting coating will generally be about 1 monolayer or greater. As used herein, depositing 1 monolayer of a material refers to an amount of the material to cover a desired area of a surface with a single layer of constituent molecules or atoms of the material. Similarly, as used herein, depositing 0.1 monolayer of a material refers to an amount of the material to cover 10% of a desired area of a surface with a single layer of constituent molecules or atoms of the material. Due to, for example, possible stacking or clustering of molecules or atoms, an actual thickness of a deposited material may be non-uniform. For example, depositing 1 monolayer of a material may result in some regions of a surface being uncovered by the material, while other regions of the surface may have multiple atomic or molecular layers deposited thereon.

It will be appreciated that a thickness of a coating described in various embodiments herein, such as for example a thickness of a nucleation inhibiting coating or a thickness of a conductive coating, may refer to a thickness at a portion of such coating or an average thickness in a relevant portion or region of the coating. For example, a coating having a non-uniform thickness profile over a portion or region may have an average thickness, which is determined by measuring the coating thickness over the entire portion or region and calculating the mean value. For example, thickness may generally be measured by various instruments and/or imaging tools including but not limited to, scanning electron microscopy (SEM), tunneling electron microscopy (TEM), profilometer, atomic force microscopy (AFM), and scanning tunneling microscopy (STM).

As used herein, the term "fullerene" refers to a material including carbon molecules. Examples of fullerene molecules include carbon cage molecules including a three-dimensional skeleton that includes multiple carbon atoms, which form a closed shell, and which can be spherical or semi-spherical in shape. A fullerene molecule can be designated as $C_n$, where n is an integer corresponding to a number of carbon atoms included in a carbon skeleton of the fullerene molecule. Examples of fullerene molecules include $C_n$, where n is in the range of 50 to 250, such as $C_{60}$, $C_{70}$, $C_{72}$, $C_{74}$, $C_{76}$, $C_{78}$, $C_{80}$, $C_{82}$, and $C_{84}$. Additional examples of fullerene molecules include carbon molecules in a tube or cylindrical shape, such as single-walled carbon nanotubes and multi-walled carbon nanotubes.

Various processes for selectively depositing a material on a surface may be used to deposit the interfacial coating, nucleation inhibiting coating, and/or the conductive coating, including, but not limited to, evaporation (including thermal evaporation and electron beam evaporation), photolithography, printing (including ink or vapor jet printing, reel-to-reel printing, and micro-contact transfer printing), organic vapor phase deposition (OVPD), laser induced thermal imaging (LITI) patterning, spin coating, dip coating, spray coating, physical vapor deposition (PVD) (including sputtering), chemical vapor deposition (CVD), and combinations thereof.

While some of the foregoing embodiments have been described in relation to an OLED, it will be understood that such processes and conductive coatings formed as a result of the processes may be used for forming optoelectronic devices including quantum dots as an active layer material. For example, such a device may include an active layer disposed between a pair of electrodes with the active layer including quantum dots. The device may be, for example, an electroluminescent quantum dot display device in which light is emitted from the quantum dot active layer as a result of current provided by the electrodes. The conductive coatings may form the electrode for such devices.

Suitable materials for use to form a nucleation inhibiting coating include those exhibiting or characterized as having an initial sticking probability for a material of a conductive coating of no greater than or less than about 0.3 (or 30%), or no greater than or less than about 0.2, or no greater than or less than about 0.1, or no greater than or less than about 0.05, and, more particularly, no greater than or less than about 0.03, no greater than or less than about 0.02, no greater than or less than about 0.01, no greater than or less than about 0.08, no greater than or less than about 0.005, no greater than or less than about 0.003, no greater than or less than about 0.001, no greater than or less than about 0.0008, no greater than or less than about 0.0005, or no greater than or less than about 0.0001.

In some embodiments, suitable materials for use to form a nucleation inhibiting coating include aromatic compounds. Examples of suitable aromatic compounds include polycyclic aromatic compounds including organic molecules which may optionally include one or more heteroatoms, such as nitrogen (N), sulfur (S), oxygen (O), phosphorus (P), fluorine (F), and aluminum (Al). In some embodiments, a polycyclic aromatic compound includes organic molecules each including a core moiety and at least one terminal moiety bonded to the core moiety. A number of terminal moieties may be 1 or more, 2 or more, 3 or more, or 4 or more. In the case of 2 or more terminal moieties, the terminal moieties may be the same or different, or a subset of the terminal moieties may be the same but different from at least one remaining terminal moiety. In some embodiments, at least one terminal moiety is, or includes, a phenyl moiety. In some embodiments, at least one terminal moiety is, or includes, a tert-butylphenyl moiety. In some embodiments, at least one terminal moiety is, or includes, a cyclic or polycyclic aromatic moiety. Examples of a polycyclic aromatic compound include TAZ, which refers to 3-(4-biphenyl)-4-phenyl-5-tert-butylphenyl-1,2,4-triazole, Liq, which refers to 8-hydroxy-quinolinato lithium, BAlq, which refers to Bis(2-methyl-8-quinolinolate)-4-(phenylphenolato) aluminum, HT211, which refers to N-[1,1'-Biphenyl]-4-yl-9,9-dimethyl-N-[4-(9-phenyl-9H-carbazol-3-yl)phenyl]-9H-fluoren-2-amine, LG201, which refers to 2-(4-(9,10-Di (naphthalen-2-yl)anthracene-2-yl)phenyl)-1-phenyl-1H-benzo[d]imidazole, PBD, which refers to 2-(4-tert-Butylphenyl)-5-(4-biphenylyl)-1,3,4-oxadiazole, PBD2, which refers to 2-(4-Biphenylyl)-5-phenyl-1,3,4-oxadiazole, mCP, which refers to 1,3-Bis(N-carbazolyl)benzene, NPB, which refers to N,N'-Di(1-naphthyl)-N,N'-diphenyl-(1,1'-biphenyl)-4,4'-diamine, NTAZ, which refers to 4-(1-Naphthalenyl)-3,5-diphenyl-4H-1,2,4-triazole, tBuP-TAZ, which refers to 3,5-Bis[4-(1,1-dimethylethyl)phenyl]-4-phenyl-4H-1,2,4-triazole, BND, which refers to 2,5-Bis(1-naphthyl)-1,3,4-oxadiazole, TBADN, which refers to 2-tert-Butyl-9,10-di(naphth-2-yl)anthracene, CBP, which refers to 4,4'-Bis(N-carbazolyl)-1,1'-biphenyl, β-NPB, which refers to N,N'-Diphenyl-N,N'-di(2-naphthyl)-(1,1'-biphenyl)-4,4'-diamine, m-BPC, which refers to 9-[1,1'-Biphenyl]-3-yl-9H-carbazole, and Ir(ppy)$_3$, which refers to Tris[2-phenylpyridinato-C2,N]iridium(III) (or Tris[2-phenylpyridine]iridium (III)). Additional examples of a polycyclic aromatic compound include those set forth in International Publication No. WO 2019/150327, published Aug. 8, 2019.

Suitable materials for use to form a nucleation promoting coating include those exhibiting or characterized as having an initial sticking probability for a material of a conductive coating of at least about 0.6 (or 60%), at least about 0.7, at least about 0.75, at least about 0.8, at least about 0.9, at least about 0.93, at least about 0.95, at least about 0.98, or at least about 0.99.

Examples

Aspects of some embodiments will now be illustrated and described with reference to the following examples, which are not intended to limit the scope of the present disclosure in any way.

As used in the examples herein, a reference to a layer thickness of a material refers to an amount of the material deposited on a target surface (or target region(s) of the surface in the case of selective deposition), which corresponds to an amount of the material to cover the target surface with an uniformly thick layer of the material having the referenced layer thickness. By way of example, depositing a layer thickness of 10 nm indicates that an amount of the material deposited on the surface corresponds to an amount of the material to form a uniformly thick layer of the material that is 10 nm thick. It will be appreciated that, for example, due to possible stacking or clustering of molecules or atoms, an actual thickness of the deposited material may be non-uniform. For example, depositing a layer thickness of 10 nm may yield some portions of the deposited material having an actual thickness greater than 10 nm, or other portions of the deposited material having an actual thickness less than 10 nm. A certain layer thickness of a material deposited on a surface can correspond to an average thickness of the deposited material across the surface.

Figure 7A:
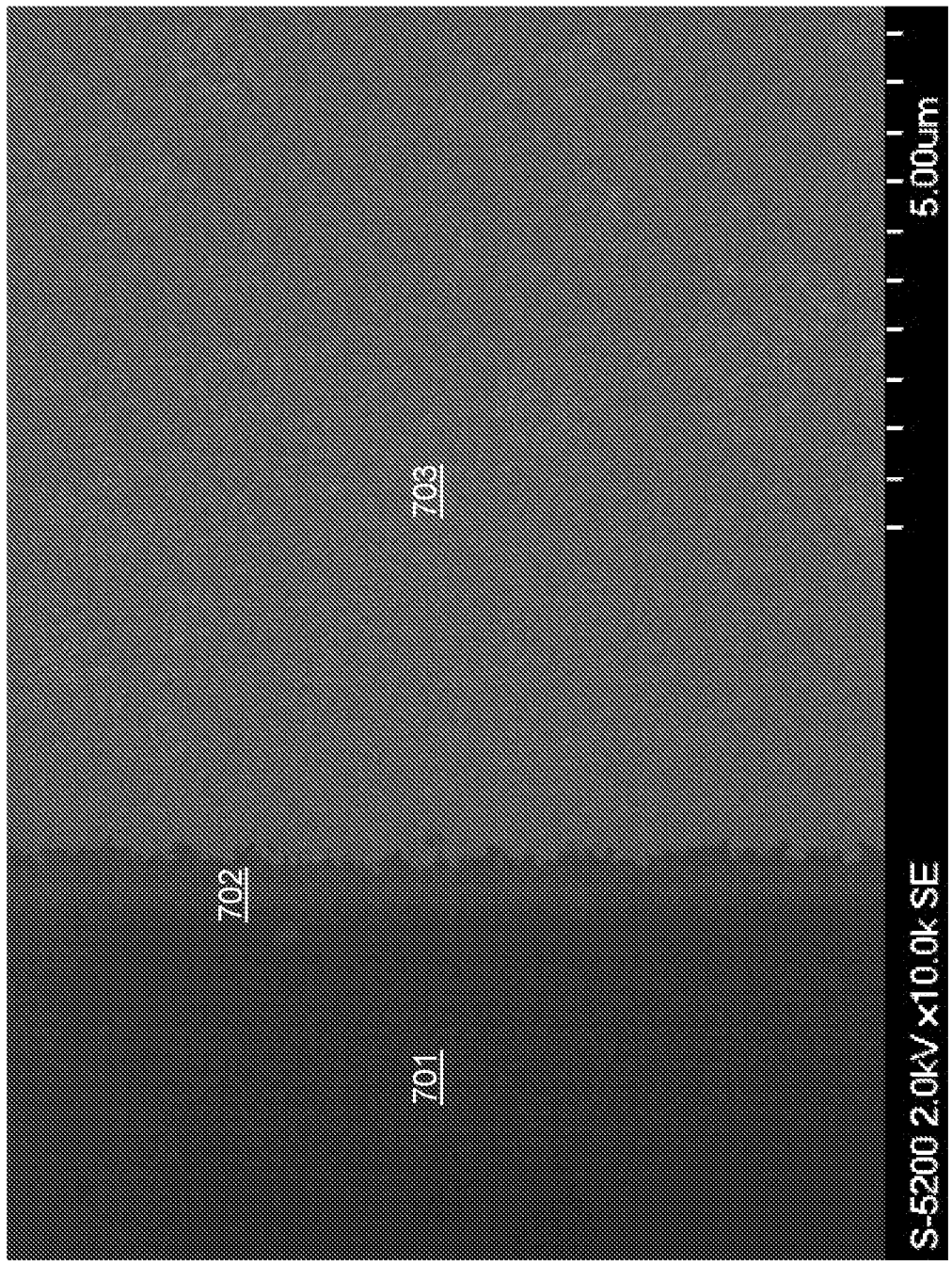
FIGS. 7A to 7C are micrographs taken using scanning electron microscopy of a sample according to one example.
Figure 7B:
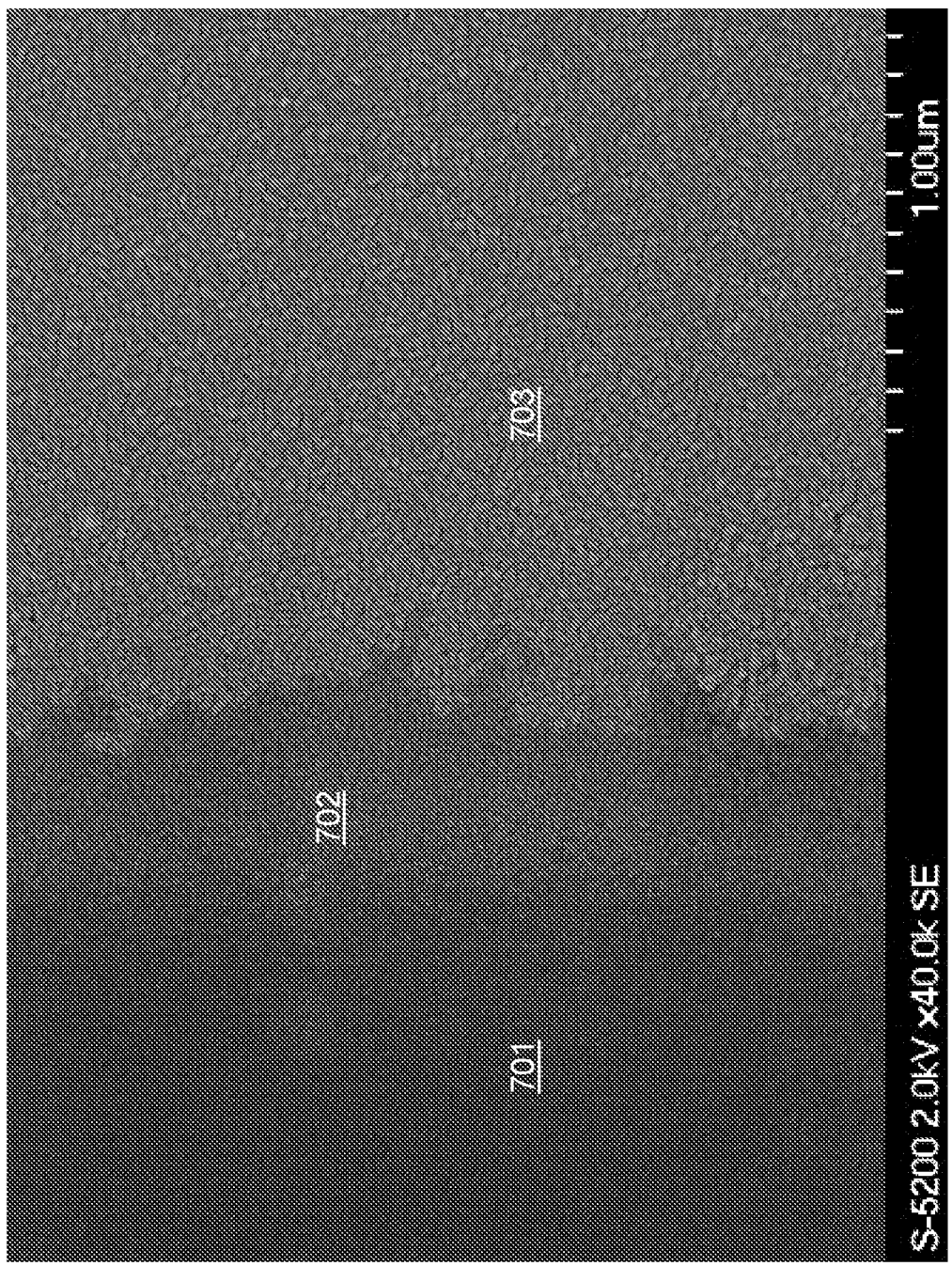
Figure 7C:
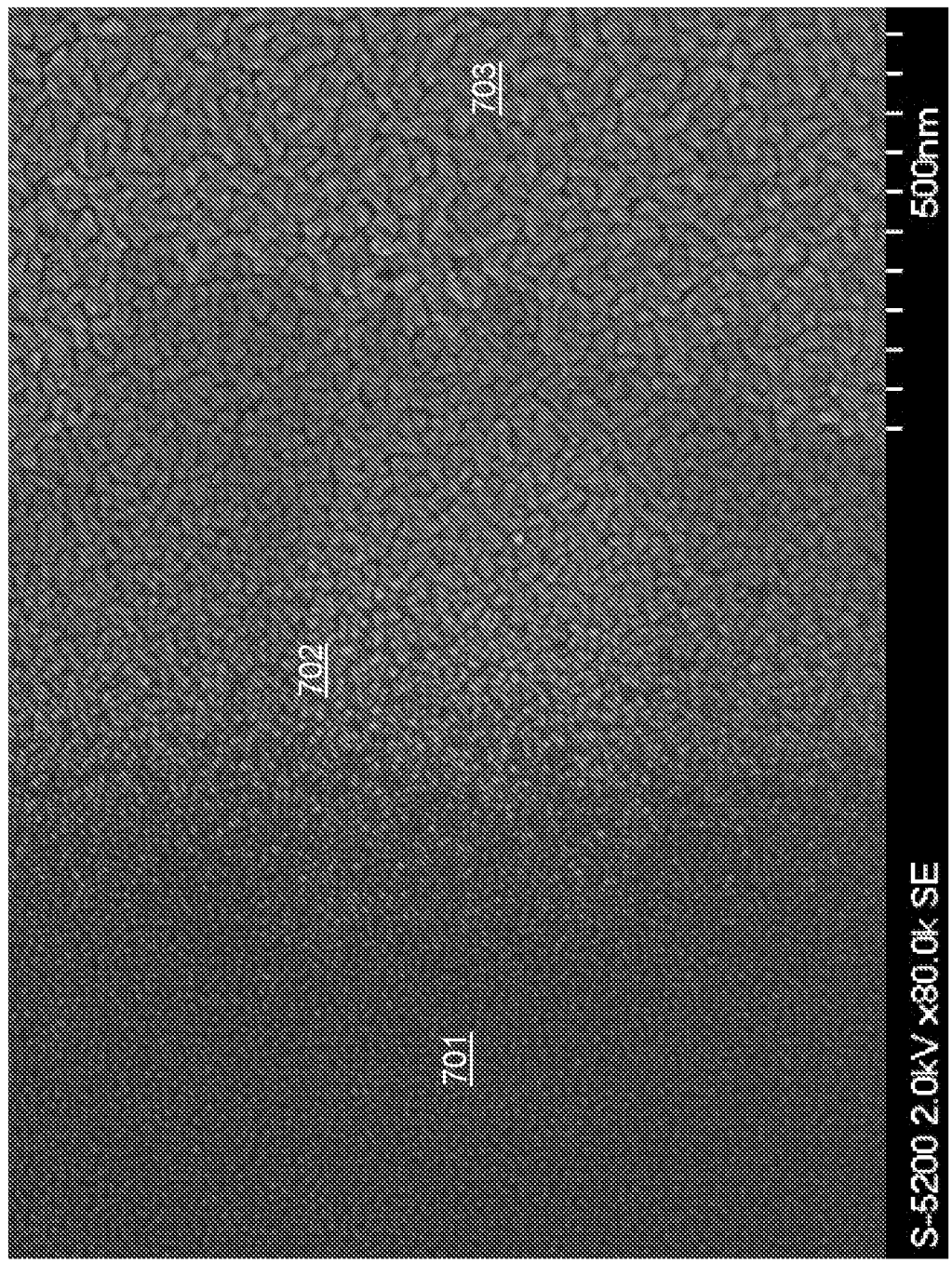

Sample 1 was prepared by depositing approximately 20 nm thick layer of organic material over a glass substrate. Approximately 1 nm thick layer of silver (Ag) was then deposited over the organic layer surface. Approximately 5 nm thick layer of a nucleation inhibiting coating was then deposited over the Ag layer, while leaving another portion of the Ag surface substantially free from, or uncovered by, the nucleation inhibiting coating. Both the nucleation inhibiting coating surface and the exposed Ag surface were then subjected to an evaporated flux of the conductive coating to cause selective deposition of the conductive coating over the exposed Ag surface to form an approximately 15 nm thick conductive coating. The conductive coating included magnesium. SEM images of Sample 1 are provided in FIGS. 7A, 7B, and 7C. The portion of the sample where the nucleation inhibiting coating is present is indicated by reference numeral 701, the portion of the sample corresponding to the intermediate region is indicated by reference numeral 702, and the portion of the sample covered by the conductive coating is indicated by reference numeral 703.

Figure 8A:
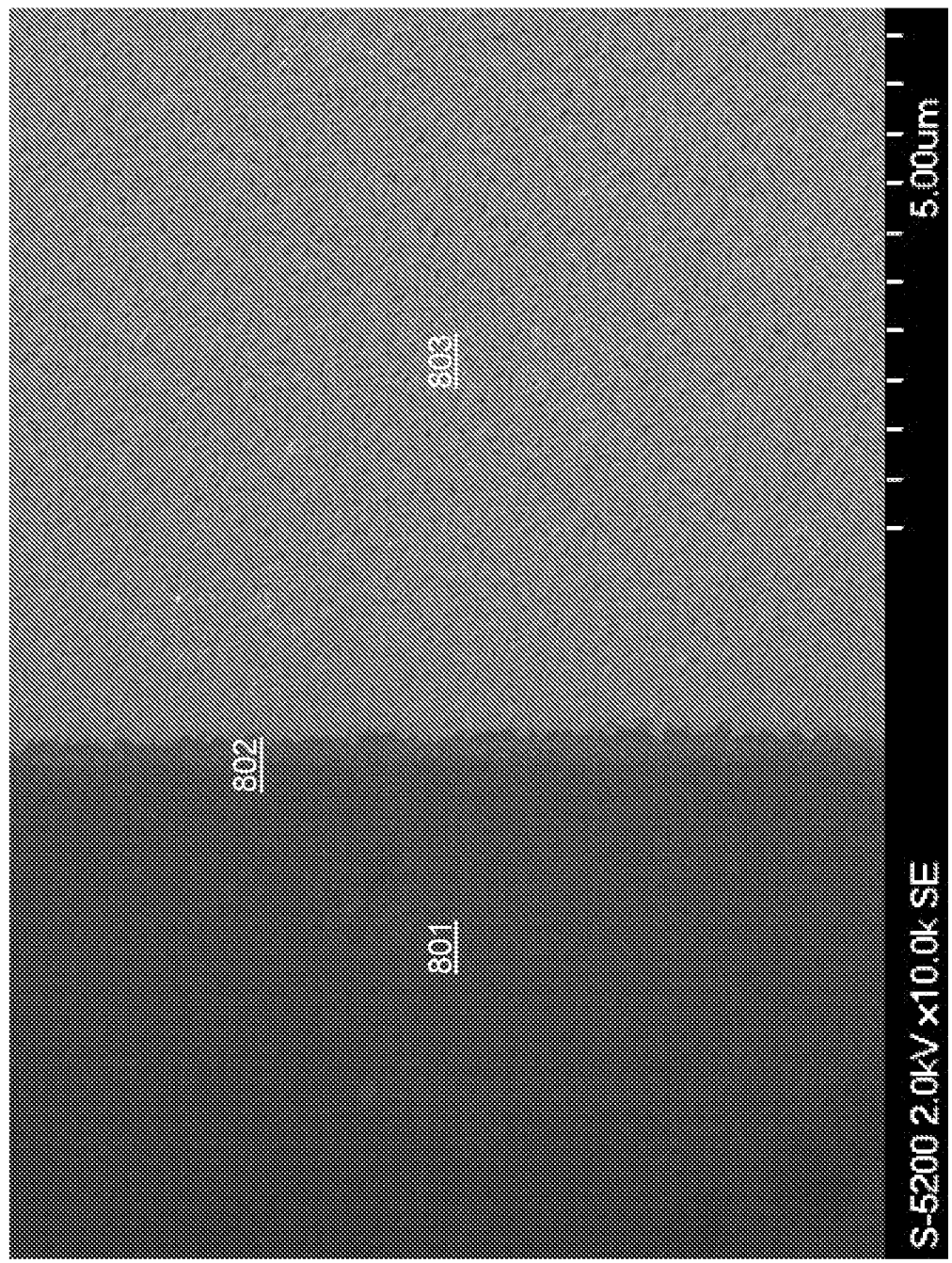
FIGS. 8A to 8C are micrographs taken using scanning electron microscopy of a sample according to another example.
Figure 8B:
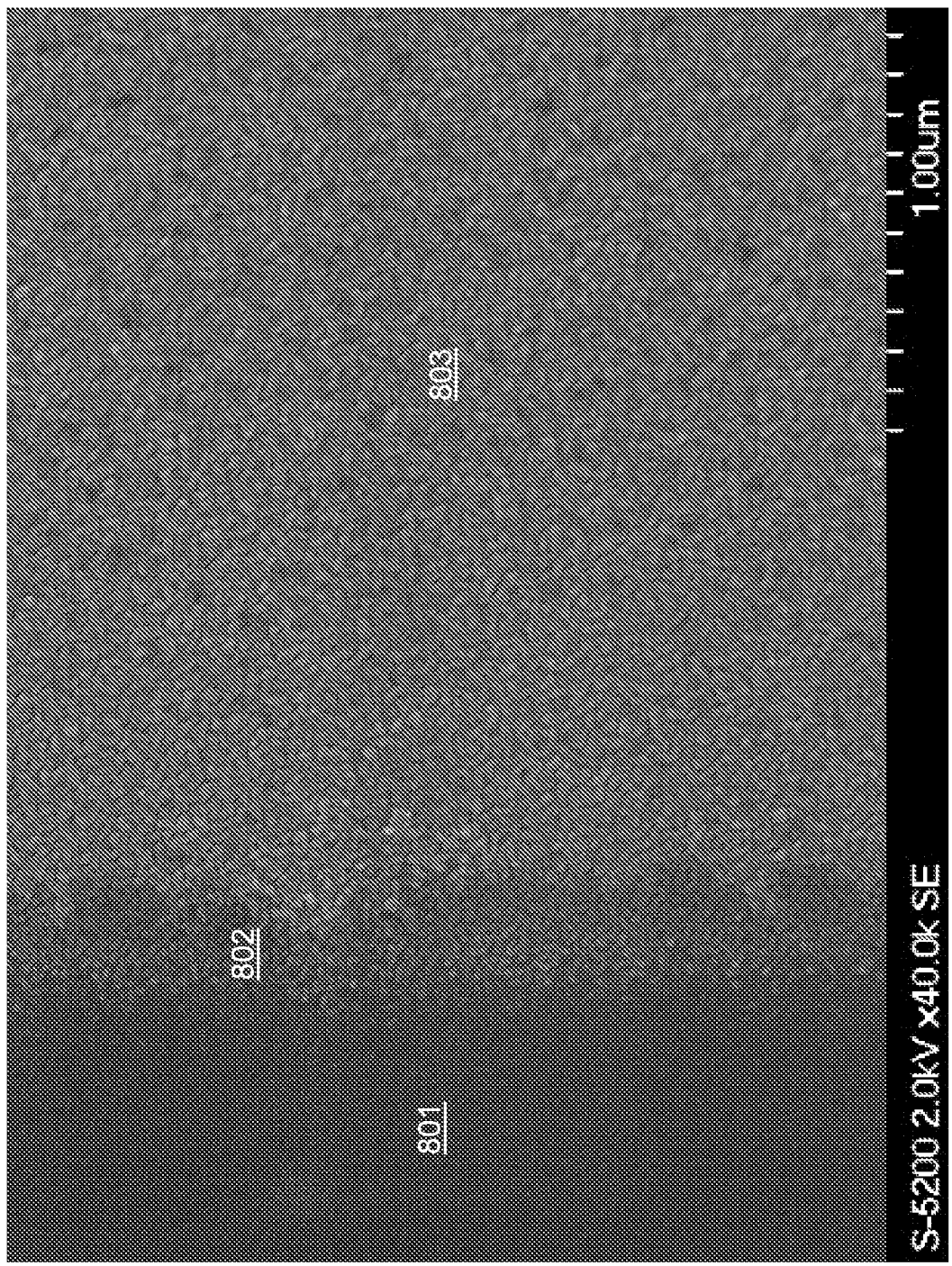
Figure 8C:
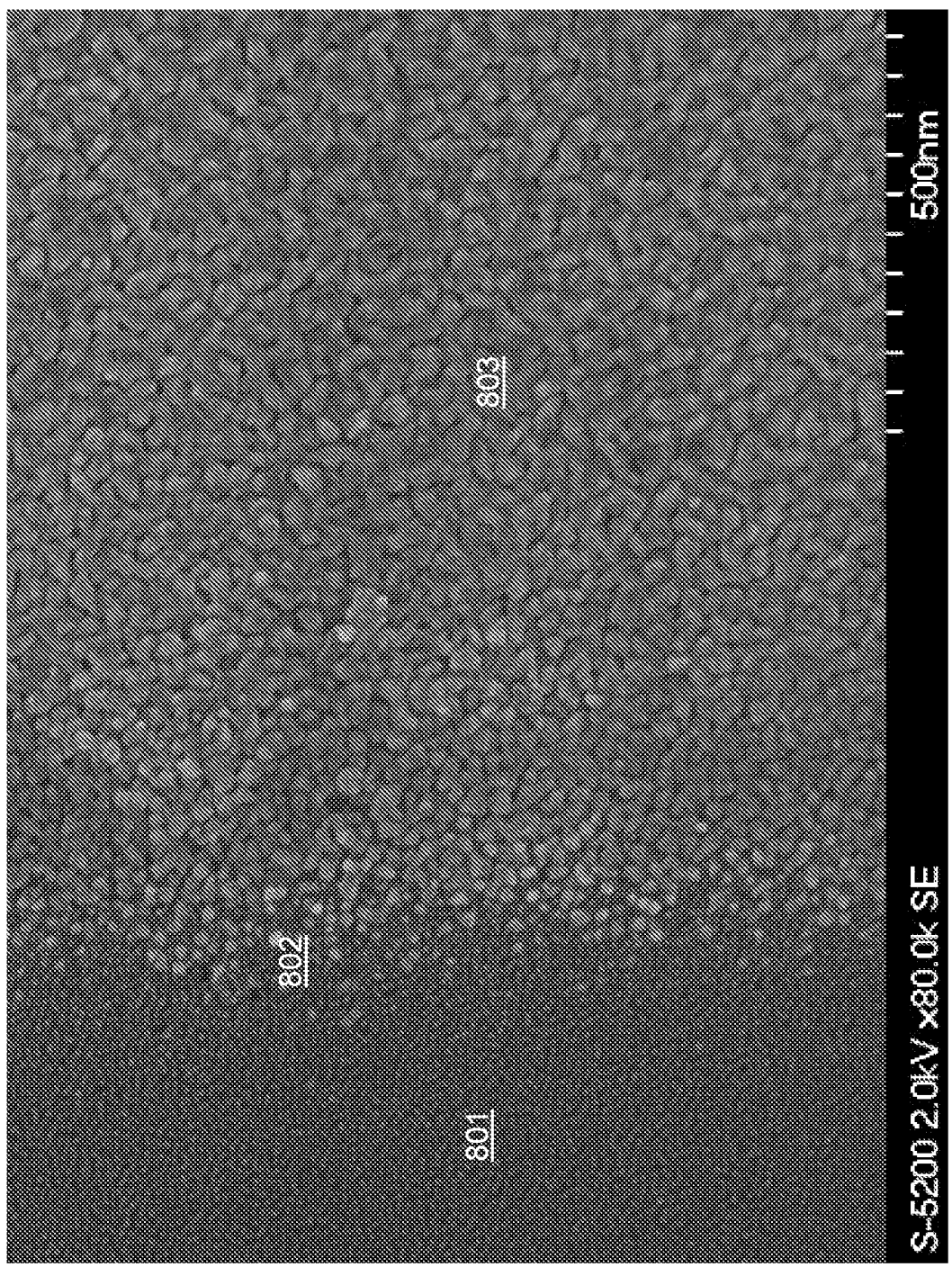

Sample 2 was prepared following an identical procedure to Sample 1, except the conductive coating thickness was approximately 20 nm. SEM images of Sample 2 are provided in FIGS. 8A, 8B, and 8C. The portion of the sample where the nucleation inhibiting coating is present is indicated by reference numeral 801, the portion of the sample corresponding to the intermediate region is indicated by reference numeral 802, and the portion of the sample covered by the conductive coating is indicated by reference numeral 803.

As used herein, the terms "substantially," "substantial," "approximately," and "about" are used to denote and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component, or "covering" or which "covers" another component, can encompass cases where the former component is directly on (e.g., in physical contact with) the latter component, as well as cases where one or more intervening components are located between the former component and the latter component, unless expressly indicated otherwise.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

Although the present disclosure has been described with reference to certain specific embodiments, various modifications thereof will be apparent to those skilled in the art. Any examples provided herein are included solely for the purpose of illustrating certain aspects of the disclosure and are not intended to limit the disclosure in any way. Any drawings provided herein are solely for the purpose of illustrating certain aspects of the disclosure and may not be drawn to scale and do not limit the disclosure in any way. The scope of the claims appended hereto should not be limited by the specific embodiments set forth in the above description, but should be given their full scope consistent with the present disclosure as a whole. The disclosures of all documents recited herein are incorporated herein by reference in their entirety.

The invention claimed is:

1. An electroluminescent device comprising:
a first region, a second region, and an intermediate region arranged between the first region and the second region;
a conductive coating disposed in the second region;
and a nucleation inhibiting coating disposed in the first region, the nucleation inhibiting coating extending to cover at least a portion of the intermediate region, wherein:
the intermediate coating comprises a conductive coating having a thickness that is substantially smaller than a thickness of the conductive coating disposed in the second region;
a thickness of the nucleation inhibiting coating in the intermediate region is less than a thickness of the nucleation inhibiting coating in the first region;
a surface of the nucleation inhibiting coating in the first region is substantially free of the conductive coating; and
the nucleation inhibiting coating is provided as a discontinuous coating in the intermediate region.

2. The electroluminescent device of claim 1, wherein the conductive coating extends to cover at least a portion of the intermediate region.

3. The electroluminescent device of claim 2, wherein the conductive coating has a first thickness in the intermediate region, and a second thickness in the second region, the second thickness being greater than the first thickness.

4. The electroluminescent device of claim 3, wherein the first thickness is less than or equal to about 10% of the second thickness.

5. The electroluminescent device of claim 3, wherein the second thickness is from about 5 nm to about 40 nm.

6. The electroluminescent device of claim 1, wherein the thickness of the nucleation inhibiting coating in the intermediate region is less than about 20% of the thickness of the nucleation inhibiting coating in the first region.

7. The electroluminescent device of claim 1, wherein the second region is substantially free of the nucleation inhibiting coating.

8. The electroluminescent device of claim 1, wherein the first region includes a light transmissive region.

9. The electroluminescent device of claim 8, wherein the light transmittance in the light transmissive region is greater than about 50%.

10. The electroluminescent device of claim 1, wherein the second region includes an emissive region.

11. The electroluminescent device of claim 1, wherein the intermediate region is arranged to extend laterally from a perimeter of the second region towards the first region.

12. The electroluminescent device of claim 11, wherein the intermediate region extends laterally from about 100 nm to about 4 µm from the perimeter.

13. The electroluminescent device of claim 11, wherein the intermediate region extends laterally from about 300 nm and about 3 µm from the perimeter.

14. The electroluminescent device of claim 11, wherein the intermediate region extends laterally from the perimeter a distance of from about 10 times to about 250 times the thickness of the conductive coating in the second region.

15. The electroluminescent device of claim 1, wherein a surface coverage of the conductive coating in the intermediate region is less than a surface coverage of the conductive coating in the second region.

16. The electroluminescent device of claim 15, wherein the surface coverage of the conductive coating in the intermediate region is from about 5% to about 95%.

17. The electroluminescent device of claim 1, wherein the conductive coating in the intermediate region includes disconnected clusters.

18. The electroluminescent device of claim 1, wherein an average grain size of the conductive coating in the intermediate region is less than an average grain size of the conductive coating in the second region.

19. The electroluminescent device of claim 18, wherein the average grain size of the conductive coating in the intermediate region is from about 10 nm to about 50 nm.

20. The electroluminescent device of claim 18, wherein the average grain size of the conductive coating in the second region is greater than about 30 nm.

21. The electroluminescent device of claim 1, further comprising an interfacial coating disposed beneath and in direct contact with the conductive coating in the second region.

22. The electroluminescent device of claim 21, wherein the interfacial coating extends laterally to be disposed beneath the conductive coating in the intermediate region.

23. The electroluminescent device of claim 22, wherein the interfacial coating is in direct contact with the conductive coating in the intermediate region.

24. The electroluminescent device of claim 21, wherein the interfacial coating includes a nucleation promoting material.

25. The electroluminescent device of claim 21, wherein the interfacial coating is arranged under the nucleation inhibiting coating in the intermediate region.

26. The electroluminescent device of claim 1, wherein the conductive coating has a first light transmittance in the intermediate region, and a second light transmittance in the second region, the first light transmittance being greater than the second light transmittance.

27. The electroluminescent device of claim 1, wherein the conductive coating has a first light reflectance in the intermediate region, and a second light reflectance in the second region, the second light reflectance being greater than the first light reflectance.

28. The electroluminescent device of claim 1, wherein the conductive coating forms at least a portion of an electrode of the electroluminescent device.

29. The electroluminescent device of claim 28, wherein the electrode is a cathode.

30. The electroluminescent device of claim 1, wherein the conductive coating includes magnesium.

31. The electroluminescent device of claim 1, wherein the nucleation inhibiting coating extends laterally to be disposed beneath the conductive coating in the intermediate region.

32. The electroluminescent device of claim 1, wherein the nucleation inhibiting coating is characterized as having an initial sticking probability for a material of the conductive coating of no greater than about 0.3.

33. The electroluminescent device of claim 1, further comprising an auxiliary electrode, the auxiliary electrode being electrically connected to the conductive coating.

* * * * *